(12) United States Patent
Hirai

(10) Patent No.: US 12,268,047 B2
(45) Date of Patent: Apr. 1, 2025

(54) DISPLAY DEVICE

(71) Applicant: Japan Display Inc., Tokyo (JP)

(72) Inventor: Sadafumi Hirai, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/514,068

(22) Filed: Nov. 20, 2023

(65) Prior Publication Data

US 2024/0090256 A1    Mar. 14, 2024

Related U.S. Application Data

(63) Continuation of application No. 17/304,489, filed on Jun. 22, 2021, now Pat. No. 11,864,414, which is a continuation of application No. PCT/JP2019/048727, filed on Dec. 12, 2019.

(30) Foreign Application Priority Data

Jan. 10, 2019   (JP) ................................ 2010-002536

(51) Int. Cl.
*H10K 50/844* (2023.01)
*H10K 50/842* (2023.01)
*H10K 59/40* (2023.01)

(52) U.S. Cl.
CPC ..... *H10K 50/8445* (2023.02); *H10K 50/8428* (2023.02); *H10K 59/40* (2023.02)

(58) Field of Classification Search
None
See application file for complete search history.

(56) References Cited

U.S. PATENT DOCUMENTS

| 2016/0204373 | A1 | 7/2016 | Park |
| 2018/0090722 | A1* | 3/2018 | Kim ...................... H10K 71/00 |
| 2018/0226454 | A1 | 8/2018 | Liu et al. |

OTHER PUBLICATIONS

Office Action issued on Dec. 29, 2023, in corresponding Chinese Application No. 201980087438.9, 17 pages.

* cited by examiner

*Primary Examiner* — Kyoung Lee
(74) *Attorney, Agent, or Firm* — Maier & Maier, PLLC

(57) ABSTRACT

The display device includes a substrate, a transistor, a leveling film, a display element, a partition wall, and at least one dam. The substrate has a display region and a peripheral region surrounding the display region. The transistor is located over the display region. The leveling film is located over the display region and covers the transistor. The display element is located over the leveling film and includes a pixel electrode electrically connected to the transistor. The partition wall covers an edge portion of the pixel electrode. The at least one dam is located over the peripheral region, is spaced away from the leveling film, and surrounds the display region. The at least one dam has a base and stopper. The base includes a material included in at least one of the leveling film and the partition wall.

5 Claims, 38 Drawing Sheets

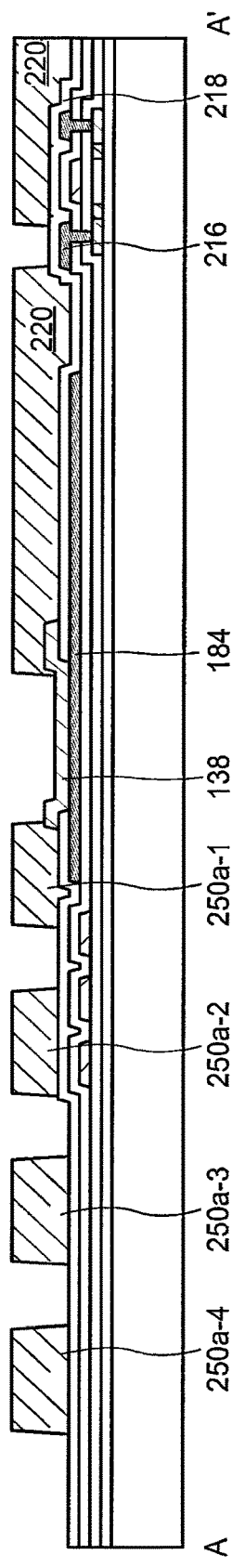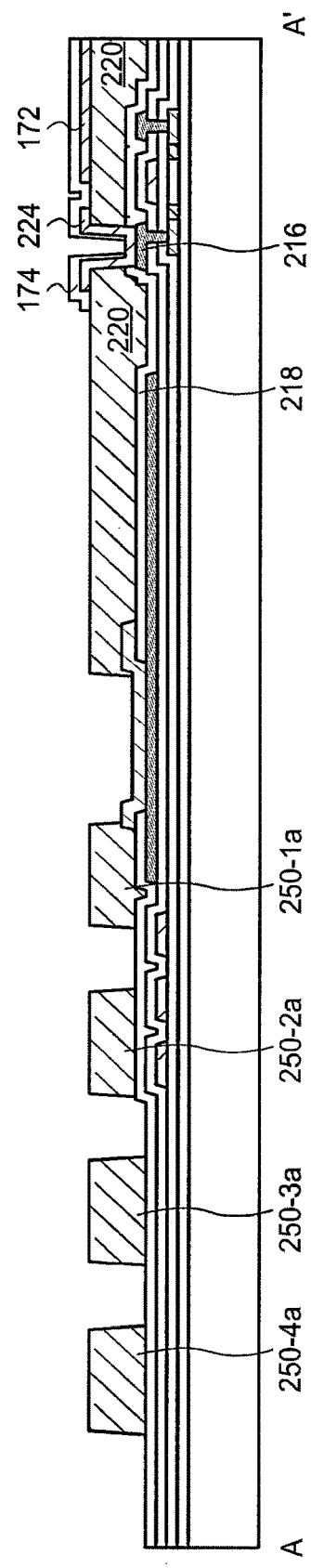
FIG. 15A
FIG. 15B

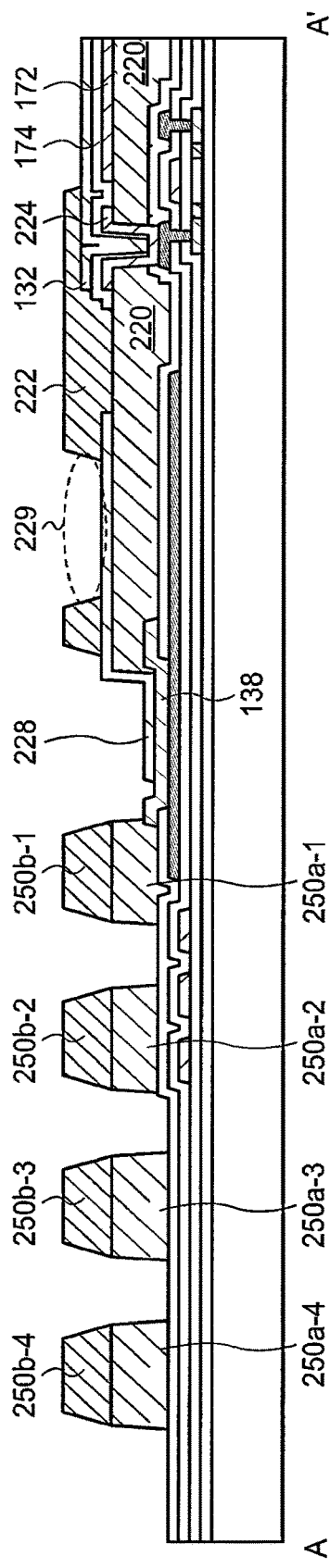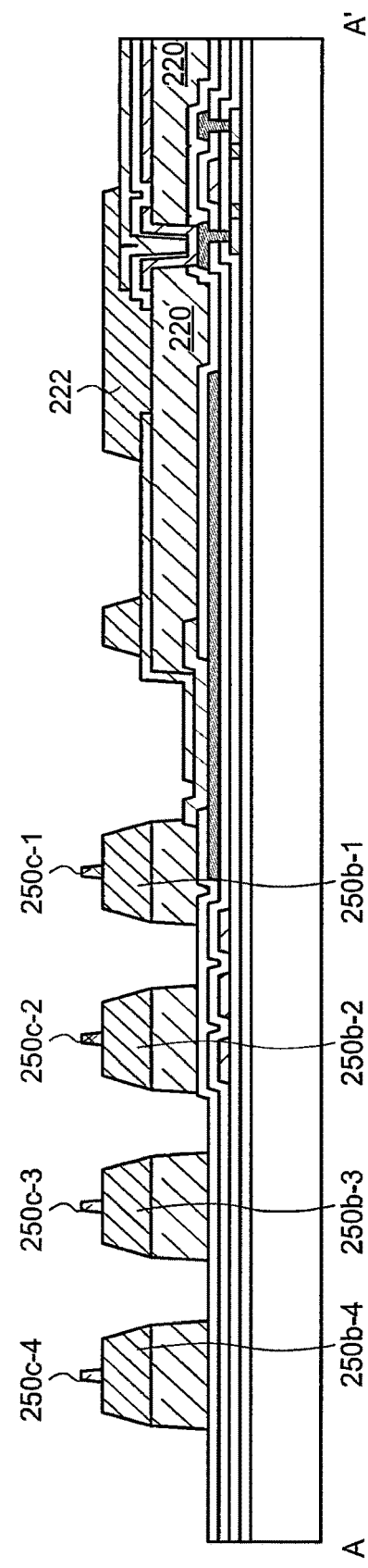

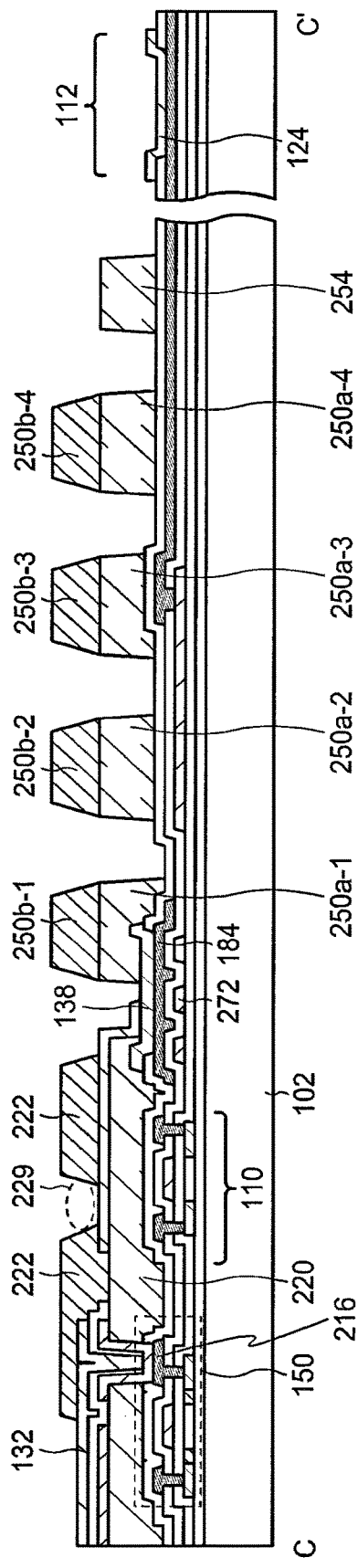

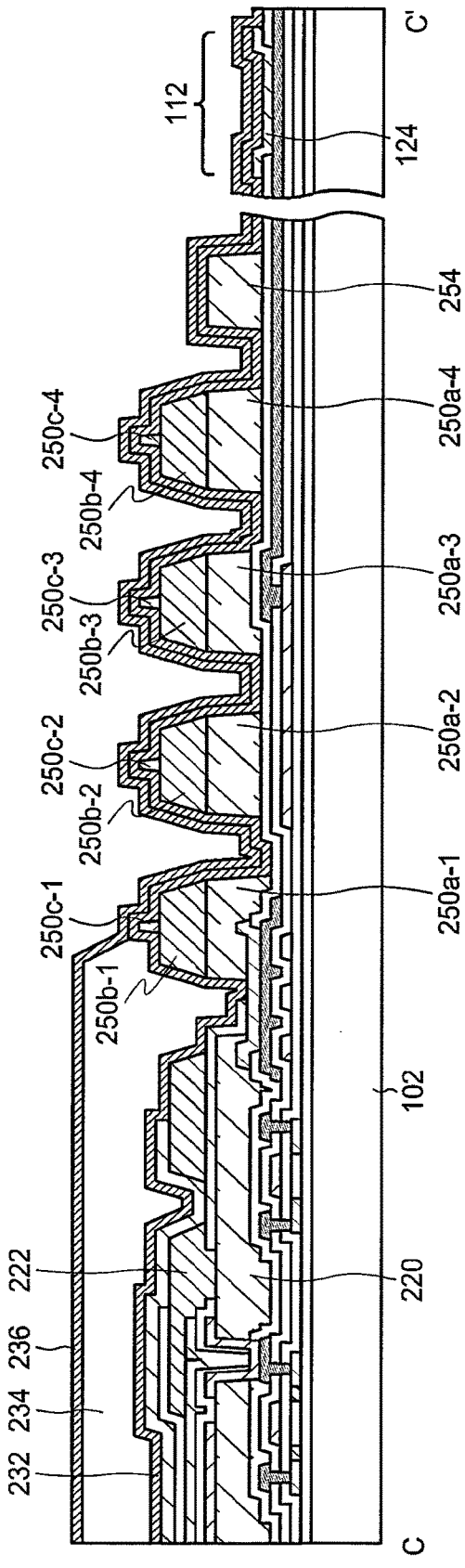
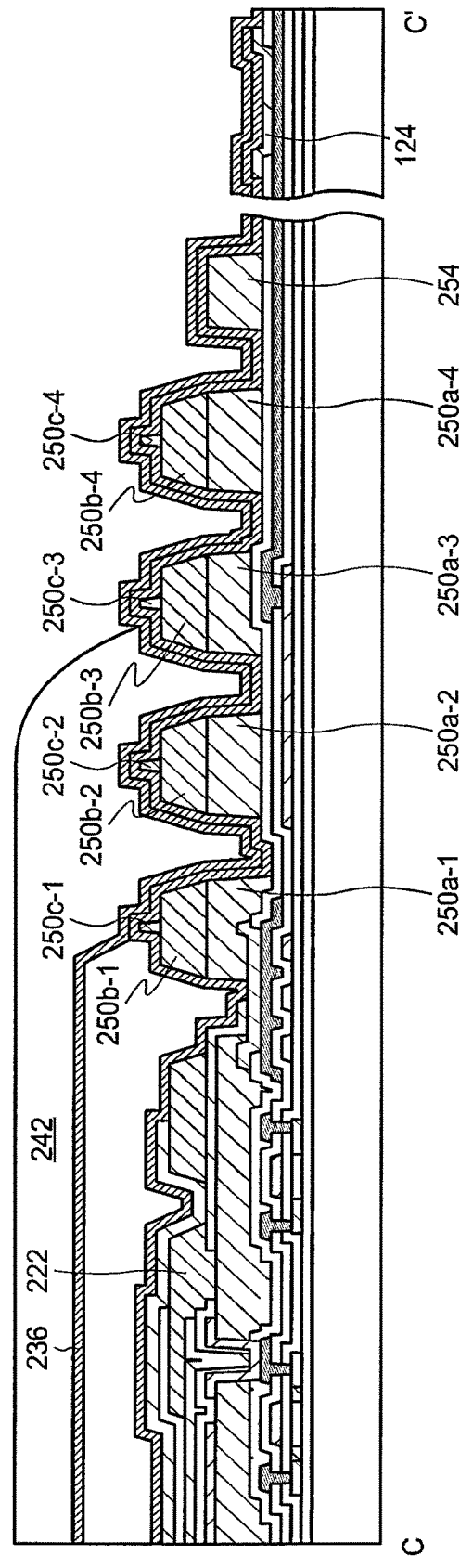

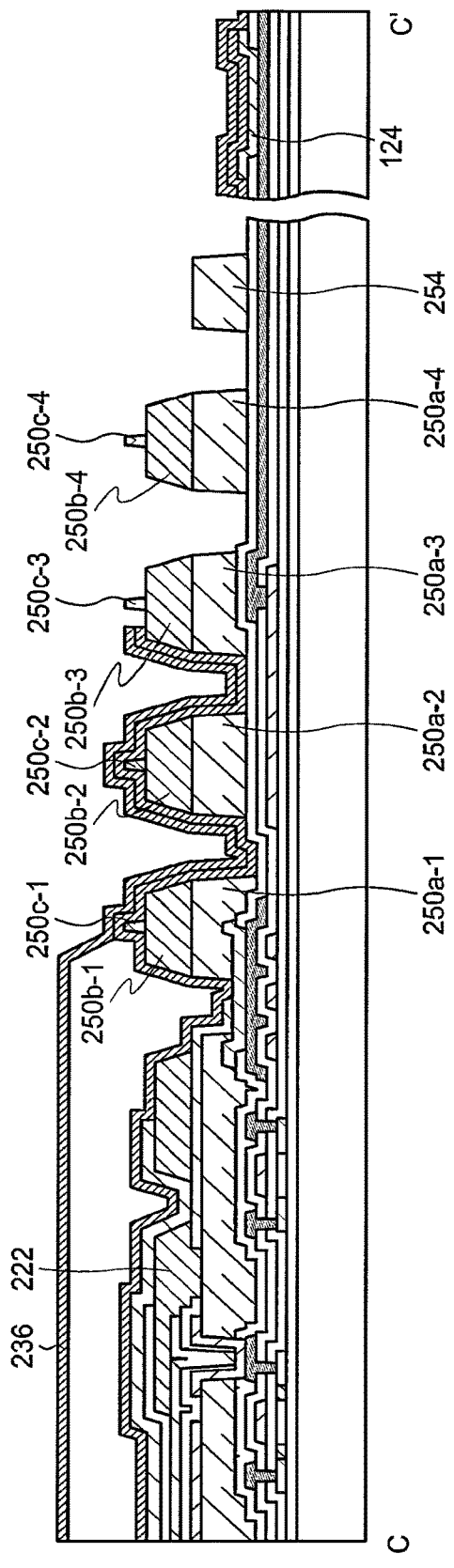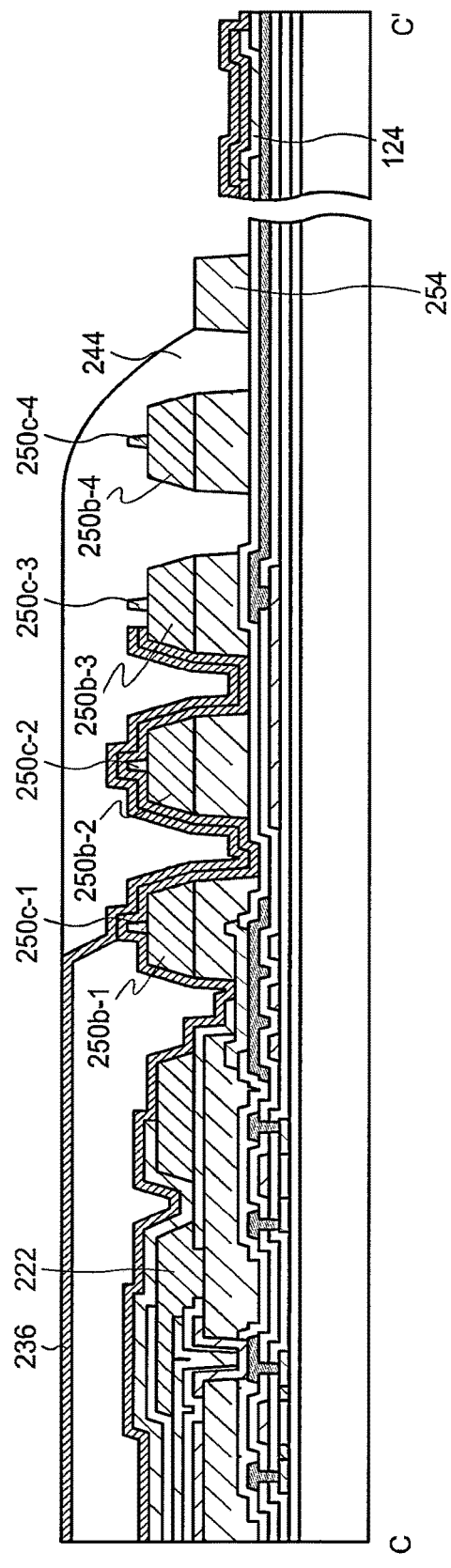

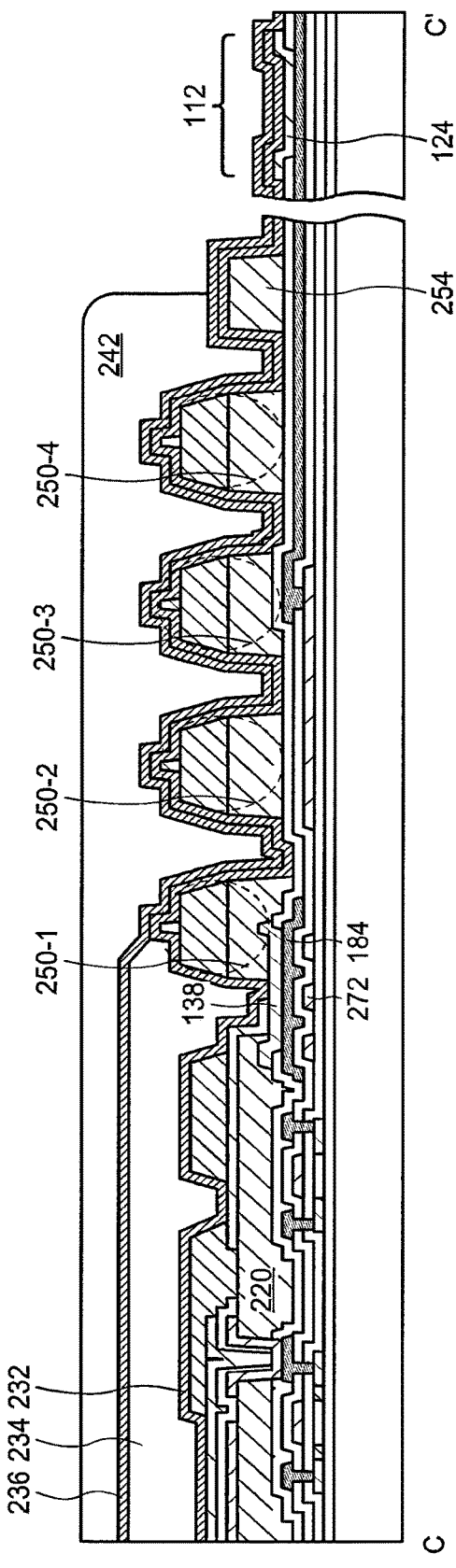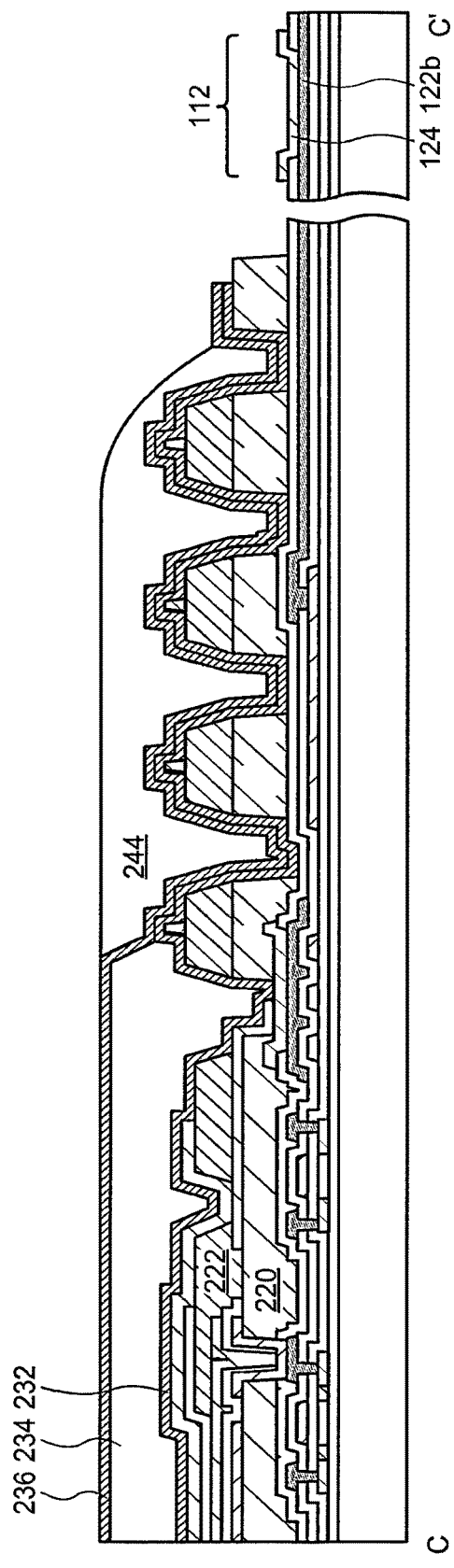

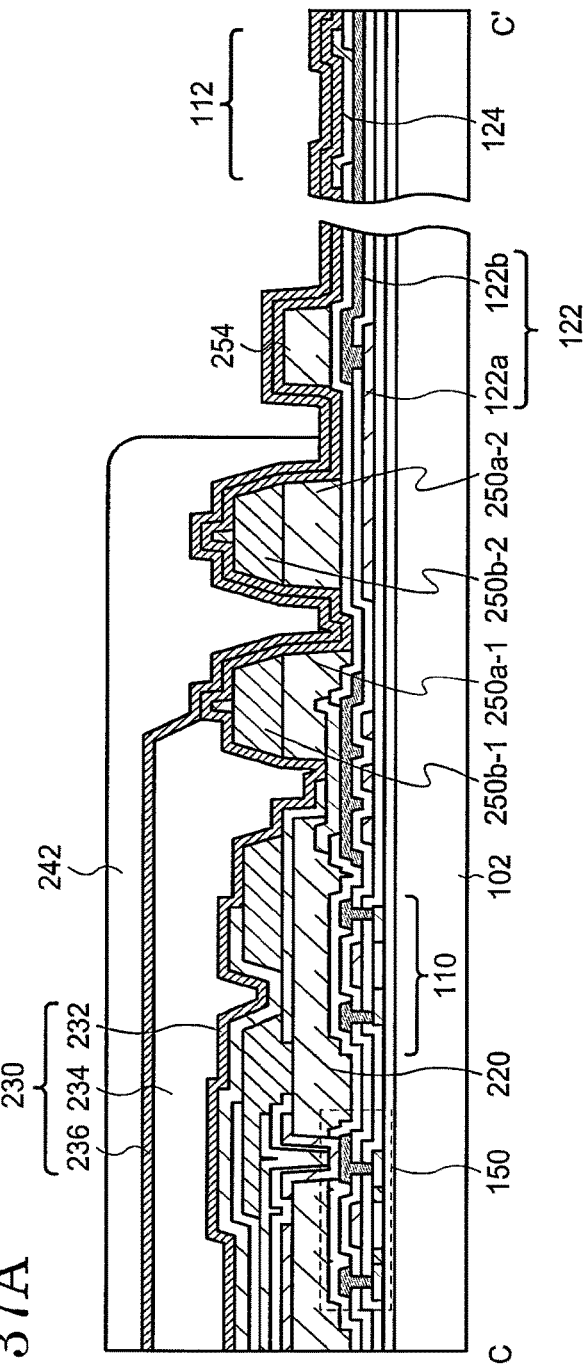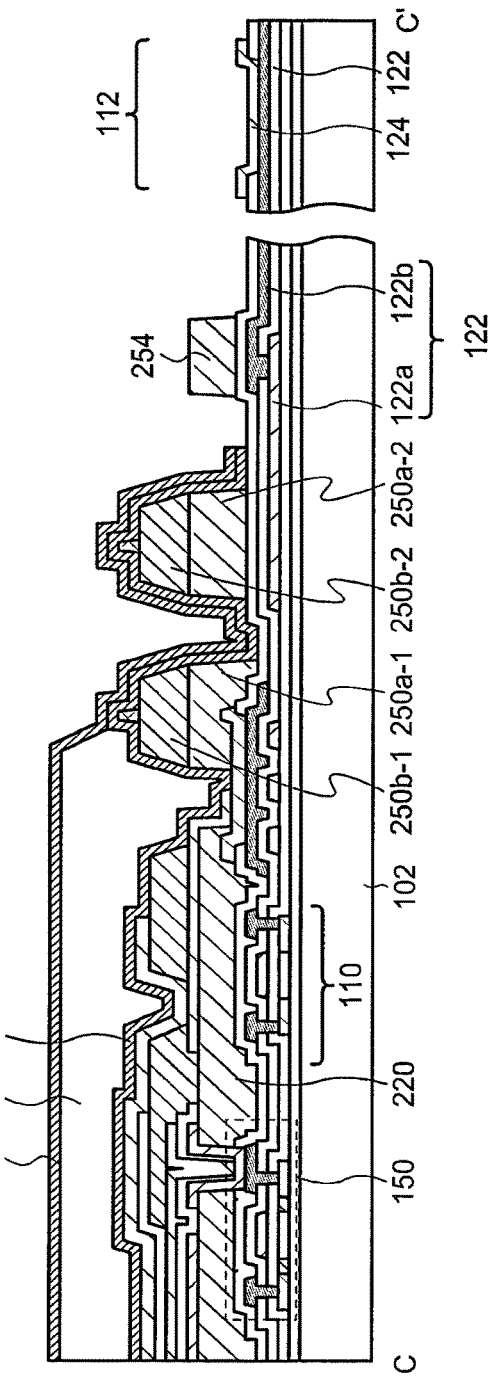

DISPLAY DEVICE

CROSS REFERENCE TO RELATED APPLICATIONS

This application is a continuation of U.S. application Ser. No. 17/304,489 filed Jun. 22, 2021, which is based on and claims the benefit of priority from the prior Japanese Patent Application No. 2019-002536, filed on Jan. 10, 2019, and the PCT Application No. PCT/JP2019/048727, filed on Dec. 12, 2019, the entire contents of each of which are incorporated herein by reference.

BACKGROUND OF THE INVENTION

An embodiment of the present invention relates to a display device and a manufacturing method of the display device. For example, an embodiment of the present invention relates to a display device having a light-emitting element exemplified by an organic light-emitting element in each pixel and a manufacturing method thereof.

DESCRIPTION OF THE RELATED ART

The organic EL (Electroluminescence) display device has been known as an example of display devices. The organic EL display device has an organic light-emitting element (hereinafter, referred to as a light-emitting element) as a display element in each of a plurality of pixels formed over a substrate. The light-emitting element has a layer including organic compounds (hereinafter, referred to as an EL layer) between a pair of electrodes, and is operated by supplying current between the pair of electrodes. The organic compounds are oxidized or reduced to exist in a charged state during operation of the light-emitting element, and recombination thereof results in an excited state. Active species existing in the charged state or the excited state readily react with other organic compounds or impurities such as water and oxygen which have entered the light-emitting element because of their higher reactivity compared with that of an electrically neutral state or a ground state. Such reactions influence the performance of the light-emitting element, causing a decrease in efficiency and lifetime of the light-emitting element.

The use of a sealing film in which a film including an inorganic compound and a film including an organic compound are stacked has been proposed as a method for suppressing the decrease in performance. It is possible to efficiently suppress entrance of impurities and provide a highly reliable display device by forming a sealing film having such a structure over the light-emitting element (see US Patent Application Publication No. 2018/0226454).

BRIEF SUMMARY OF THE INVENTION

An embodiment of the present invention is a display device. The display device includes a substrate, a transistor, a leveling film, a display element, a partition wall, and at least one dam. The substrate has a display region and a peripheral region surrounding the display region. The transistor is located over the display region. The leveling film is located over the display region and covers the transistor. The display element is located over the leveling film and includes a pixel electrode electrically connected to the transistor. The partition wall covers an edge portion of the pixel electrode. The at least one dam is located over the peripheral region, is spaced away from the leveling film, and surrounds the display region. The at least one dam includes a base and a stopper. The base includes a material included in at least one of the leveling film and the partition wall. The stopper is located over and in contact with the base and includes an inorganic material. A part of an upper surface of the base of the at least one dam is exposed from the stopper.

An embodiment of the present invention is a display device. The display device includes a substrate, a transistor, a leveling film, a display element, a partition wall, at least one dam, and a supplemental dam. The substrate has a display region and a peripheral region surrounding the display region. The transistor is located over the display region. The leveling film is located over the display region and covers the transistor. The display element is located over the leveling film and includes a pixel electrode electrically connected to the transistor. The partition wall covers an edge portion of the pixel electrode. The at least one dam is located over the peripheral region, is spaced away from the leveling film, and surrounds the display region. The supplemental dam is located over the peripheral region. The at least one dam has a base and a stopper and is sandwiched by the leveling film and the supplemental dam. The base includes a material included in at least one of the leveling film and the partition wall. The stopper is located over and in contact with the base and includes an inorganic compound. A part of the upper surface of the at least one dam is exposed from the stopper.

An embodiment of the present invention is a method for manufacturing a display device. The method includes forming a transistor over a substrate, forming a leveling film overlapping the transistor, forming, over the leveling film, a pixel electrode electrically connected to the transistor, forming a partition wall covering an edge portion of the pixel electrode, and forming at least one dam surrounding the leveling film. The at least one dam includes a base and a stopper, and the base includes a material included in at least one of the leveling film and the partition wall. The stopper is located over and in contact with the base and includes an inorganic compound. The stopper is formed so as to expose a part of an upper surface of the base of the at least one dam.

An embodiment of the present invention is a method for manufacturing a display device. The method includes forming a transistor over a substrate, simultaneously forming a leveling film covering the transistor and a first layer of a base surrounding the leveling film, forming, over the leveling film, a pixel electrode electrically connected to the transistor, simultaneously forming a partition wall covering an edge portion of the pixel electrode and a second layer over the first layer, and forming, over the second layer, a stopper in contact with the second layer to form a dam including the base having the first layer and the second layer and the stopper. The stopper is formed so as to expose a top surface of the second layer.

An embodiment of the present invention is a method for manufacturing a display device. The method includes forming a transistor over a substrate, forming a leveling film overlapping the transistor, forming, over the leveling film, a pixel electrode electrically connected to the transistor, forming a partition wall covering an edge portion of the pixel electrode, forming at least one dam surrounding the leveling film, and forming a supplemental dam. The at least one dam is sandwiched by the leveling film and the supplemental dam. The at least one dam includes a base and a stopper. The base includes a material included in at least one of the leveling film and the partition wall. The stopper is located over and in contact with the base and includes an inorganic material. The stopper is formed so as to expose a part of an upper surface of the base of the at least one dam.

An embodiment of the present invention is a method for manufacturing a display device. The method includes forming a transistor over a substrate, simultaneously forming a leveling film covering the transistor, a first layer of a base surrounding the leveling film, and a supplemental dam, simultaneously forming a partition wall covering an edge portion of the pixel electrode and a second layer over the first layer, and forming, over the second layer, a stopper in contact with the second layer to form a base including the first layer and the second layer and a dam including the stopper. The supplemental dam is formed so that the dam is sandwiched by the leveling film and the supplemental dam. The stopper is formed so that a part of an upper surface of the second layer is exposed from the stopper.

BRIEF DESCRIPTION OF THE DRAWINGS

FIG. 15A and FIG. 15B are each a schematic cross-sectional view for explaining a manufacturing method of a display device according to an embodiment of the present invention;

FIG. 16A and FIG. 16B are each a schematic cross-sectional view for explaining a manufacturing method of a display device according to an embodiment of the present invention;

FIG. 25A and FIG. 25B are each a schematic cross-sectional view for explaining a manufacturing method of a display device according to an embodiment of the present invention;

FIG. 26A and FIG. 26B are each a schematic cross-sectional view for explaining a manufacturing method of a display device according to an embodiment of the present invention;

FIG. 27A and FIG. 27B are each a schematic cross-sectional view for explaining a manufacturing method of a display device according to an embodiment of the present invention;

FIG. 31A and FIG. 31B are each a schematic cross-sectional view for explaining a manufacturing method of a display device according to an embodiment of the present invention;

FIG. 37A and FIG. 37B are each a schematic cross-sectional view for explaining a manufacturing method of a display device according to an embodiment of the present invention.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or roles different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, the expression "a structure is exposed from another structure" means a mode in which a part of the structure is not covered by the other structure and includes a mode where the part uncovered by the other structure is further covered by another structure.

First Embodiment

In the present embodiment, a structure of a display device 100 according to an embodiment and a manufacturing method thereof are described.

1. Outline Structure

Figure 1:
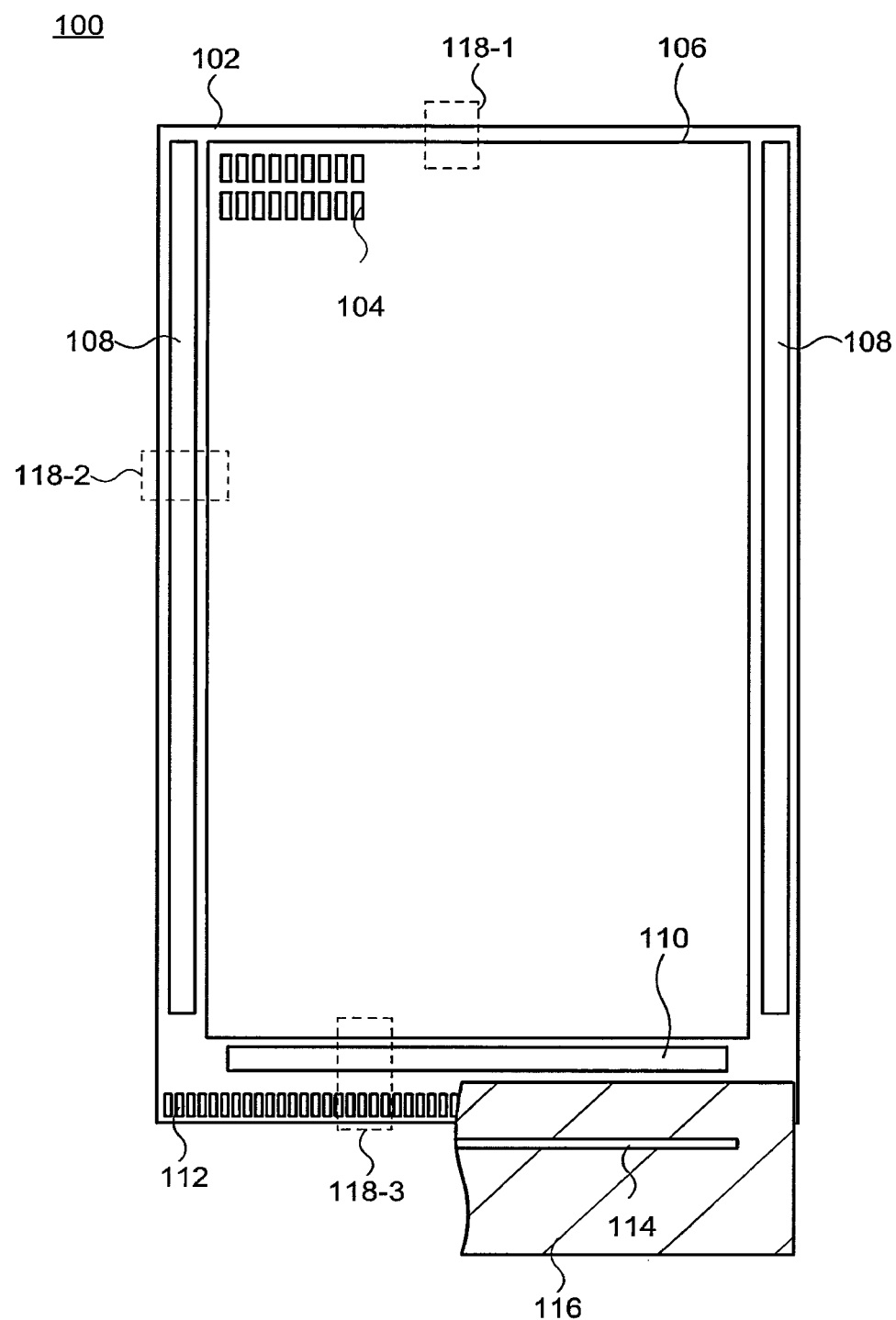
FIG. 1 is a schematic top view of a display device according to an embodiment of the present invention.

A schematic top view of the display device 100 is shown in FIG. 1. As shown in FIG. 1, the display device 100 has a substrate 102 over which a plurality of pixels 104 is disposed. The pixels 104 are arranged in a matrix form having a plurality of lines and columns. The region including the pixels 104 and a region surrounding this region are respectively defined as a display region 106 and a peripheral region of the substrate 102.

Driver circuits for driving the pixels 104 are formed in the peripheral region. In the example shown in FIG. 1, two scanning-line driver circuits 108 sandwiching the display region 106 and a signal-line driver circuit 110 including an analogue switch and the like are provided. Wirings which are not illustrated extend to a side of the substrate 102 from the display region 106, the scanning-line driver circuits 108, and the signal-line driver circuit 110 and are exposed at an edge portion of the substrate 102 to form terminals 112. The terminals 112 are electrically connected to a connector 116 such as a flexible printed circuit (FPC) board. A driver IC 114 for controlling the pixels 104 may be mounted over the connector 116 or the substrate 102. Note that the signal-line driver circuit 110 may not be formed in the peripheral region and the function thereof may be realized by the driver IC 114.

In the following explanation, a terminal 112 side of the display device 100 is defined as a lower portion, while an opposing side to the terminals 112 is defined as an upper portion for convenience. When the substrate 102 and the display region 106 can be regarded as a rectangle mainly formed with four sides, a side of the terminals 112 is referred to as a lower side, a side opposite to the terminals 112 is referred to as an upper side, and a side between the upper side and the lower side is referred to as a lateral side.

2. Pixel
2-1. Pixel Circuit

A pixel circuit including a display element 130 is disposed in each pixel 104. The pixel circuit is operated by the scanning-line driver circuits 108, the signal-line driver circuit 110 and the like. With this structure, operation of the display elements 130 is controlled, and, as a result, an image can be displayed on the display region 106. Hereinafter, the pixel circuit is explained using an example where a light-emitting element is used as the display element 130.

Figure 2:
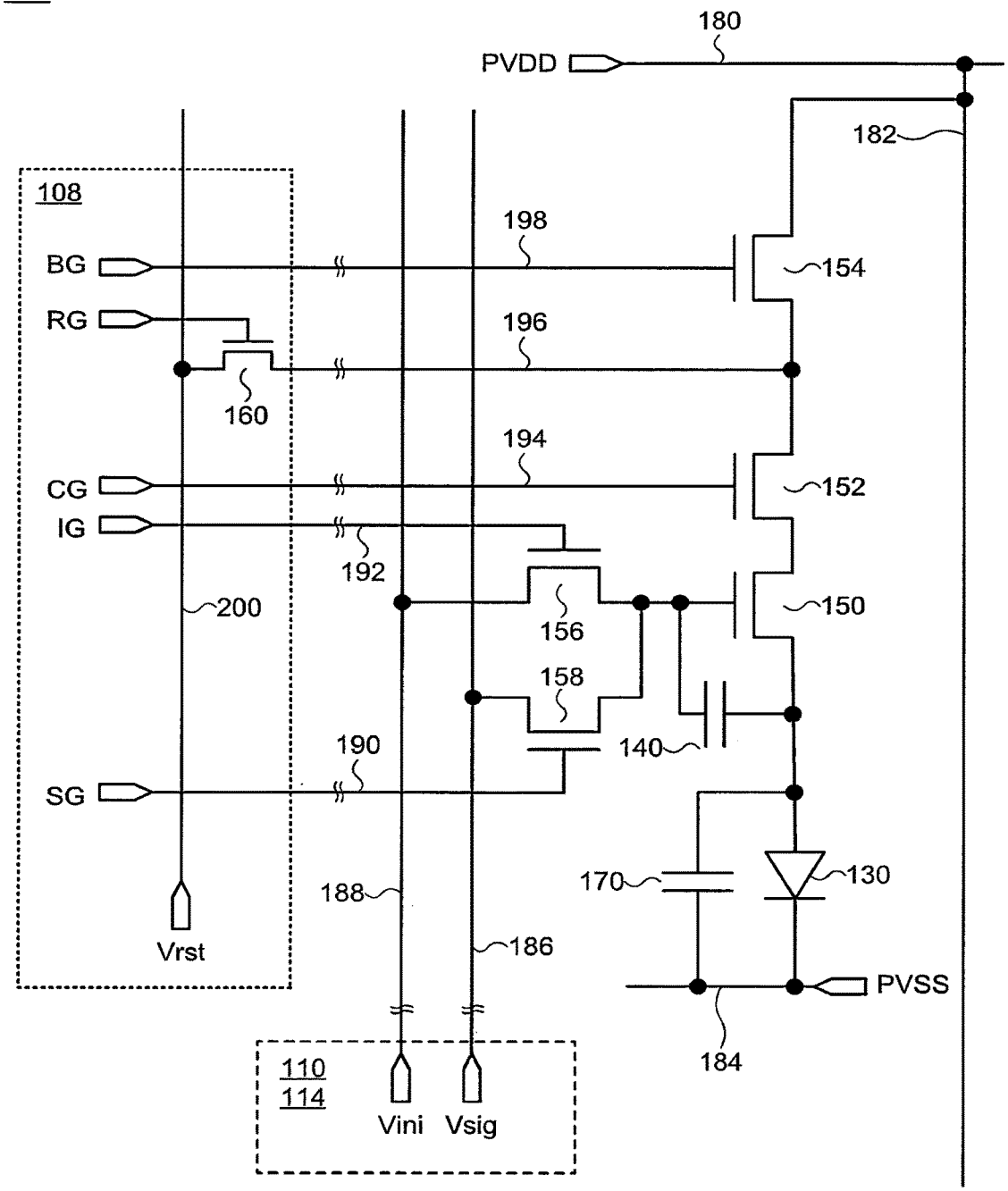
FIG. 2 is an equivalent circuit of a pixel circuit in a display device according to an embodiment of the present invention.

The structure of the pixel circuit may be arbitrarily selected, and an example is shown in FIG. 2 as an equivalent circuit. The pixel circuit illustrated in FIG. 2 includes a driving transistor 150, an emission-controlling transistor 154, a compensating transistor 152, an initializing transistor 156, a writing transistor 158, a storage capacitor 140, and a supplemental capacitor 170 in addition to the display element 130. A high potential PVDD is provided to a high-potential power-source line 180, and its potential is supplied to the pixels 104 connected to each column through a current-supplying line 182. The display element 130, the driving transistor 150, the emission-controlling transistor 154, and the compensating transistor 152 are connected in series between the high-potential power-source line 180 and a low-potential power-source line 184. The low-potential power-source line 184 is provided with a low potential PVSS.

A gate of the driving transistor 150 is electrically connected to a first signal line 188 through the initializing transistor 156 and is also electrically connected to a second signal line 186 through the writing transistor 158. The first signal line 188 is provided with an initializing signal Vini, while the second signal line 186 is provided with an image signal Vsig. Operation of the writing transistor 158 is controlled with a scanning signal SG provided to the write-controlling scanning line 190 connected to a gate thereof. A gate of the initializing transistor 156 is connected to the initialization-controlling scanning line 192 provided with an initialization-controlling signal IG, and operation thereof is controlled by the initialization-controlling signal IG.

A compensation-controlling scanning line 194 applied with a compensation-controlling signal CG and an emission-controlling scanning line 198 applied with an emission-controlling signal BG are respectively connected to gates of the compensating transistor 152 and the emission-controlling transistor 154. A reset-controlling line 196 is connected to a drain of the driving transistor 150 via the compensating transistor 152. The reset-controlling line 196 is connected to a reset transistor 160 disposed in the scanning-line driver circuit 108. The reset transistor 160 is controlled with a reset-controlling signal RG, by which a reset potential Vrst provided to a reset signal line 200 can be applied to the drain of the driving transistor 150 through the compensation-controlling transistor 152.

The storage capacitor 140 is disposed between a source and the gate of the driving transistor 150, and the supplemental capacitor 170 is formed between the source of the driving transistor 150 and the low-potential power-source line 184. Although not illustrated, the supplemental capacitor 170 may be disposed so that both terminals thereof are respectively connected to the source of the driving transistor 150 and the high-potential power-source line 180.

The signal-line driver circuit 110 and/or the driver IC 114 respectively outputs the initializing signal Vini and the image signal Vsig to the first signal line 188 and the second signal line 186. On the other hand, the scanning-line driver circuits 108 respectively output the scanning signal SG, the initialization-controlling signal IG, the compensation-controlling signal CG, the emission-controlling signal BG, and the reset-controlling signal RG to the write-controlling scanning line 190, the initialization-controlling scanning line 192, the compensation-controlling scanning line 194, the emission-controlling scanning line 198, and a gate of the reset transistor 160.

The pixel circuit shown in FIG. 2 is merely an example, and there is no limitation to the number of transistors and capacitors and their connection relationship.

2-2. Cross-Sectional Structure

Figure 3:
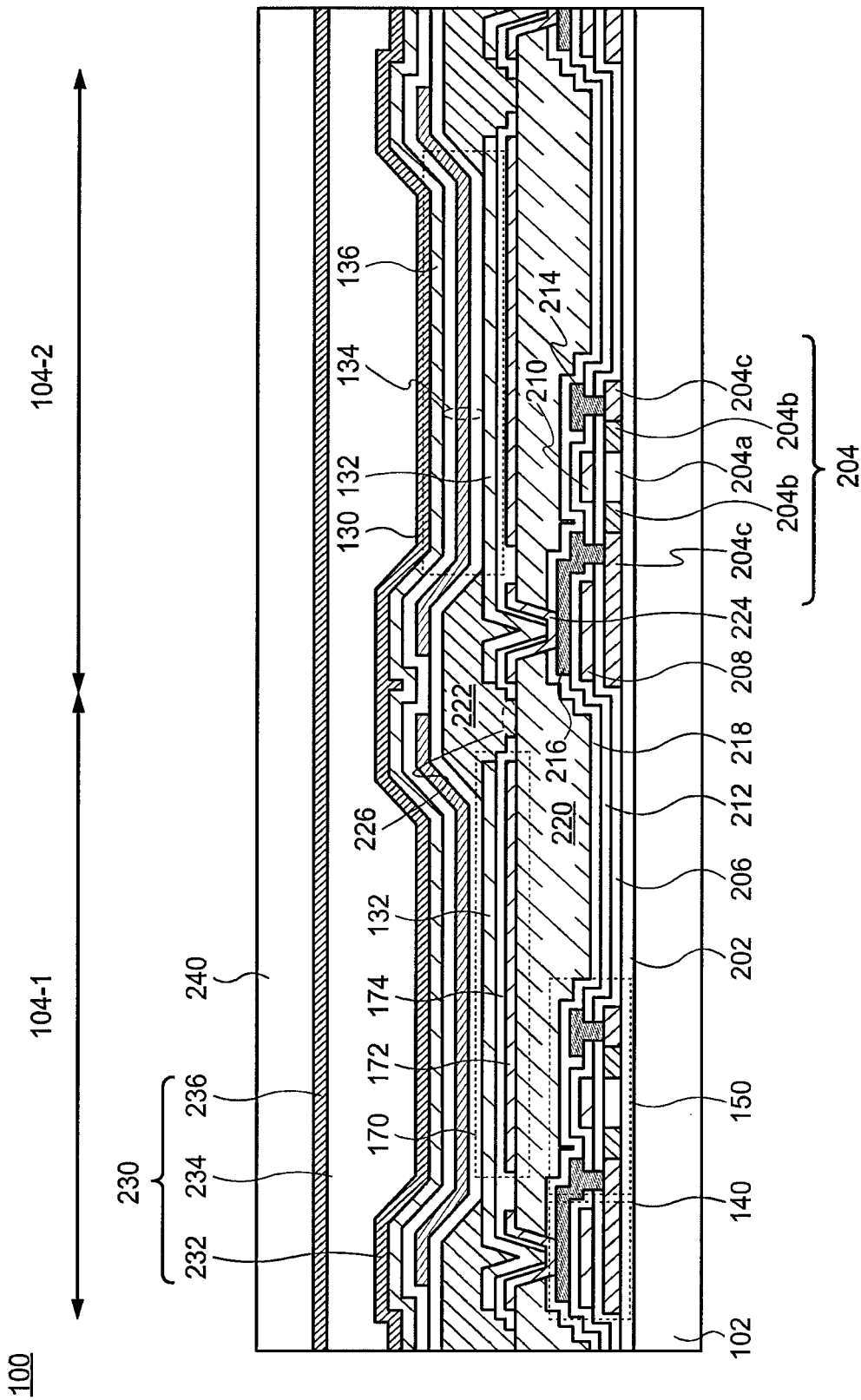
FIG. 3 is a schematic cross-sectional view of a display device according to an embodiment of the present invention.

A schematic cross-sectional view of two adjacent pixels 104 is shown in FIG. 3. The display element 130, the pixel circuit connected thereto and including the storage capacitor 140, the driving transistor 150, the supplemental capacitor 170 and the like, a passivation film 230 formed over the pixel circuit and the like are illustrated in FIG. 3.

(1) Pixel Circuit

Each element such as the driving transistor 150 and the storage capacitor 140 is disposed over the substrate 102 via an undercoat 202. The substrate 102 has a function to support the circuit formed thereover and may include glass, quartz, or a polymer. When a polymer such as a polyimide, a polyamide, a polycarbonate is used for the substrate 102, flexibility can be added to the display device 100, thereby supplying a so-called flexible display.

The driving transistor 150 has a semiconductor film 204, a gate insulating film 206 over the semiconductor film 204, a gate electrode 210 over the gate insulating film 206, a first interlayer insulating film 212 over the gate electrode 210, a drain electrode 214 and a source electrode 216 over the first interlayer insulating film 212 and the like. The semiconductor film 204 may have an active region 204a, low-concentration impurity regions 204b sandwiching the active region 204a, and high-concentration impurity regions 204c sandwiching these regions. Although the driving transistor 150 is illustrated as a transistor with a top-gate structure in FIG. 3, the structure of the transistors constructing the pixel circuit is not limited, and transistors with a variety of structures may be employed.

The storage capacitor 140 is configured by a part of the semiconductor film 204 (high-concentration impurity region 204c), the gate insulating film 206 thereover, a capacitor electrode 208 existing in the same layer as the gate electrode 210, the first interlayer insulating film 212 over the capacitor electrode 208, and a part of the source electrode 216. Here, the gate insulating film 206 and the first interlayer insulating film 212 function as a dielectric of the storage capacitor 140.

A second interlayer film 218 and a leveling film 220 thereover are arranged over the driving transistor 150 and the storage capacitor 140. The second interlayer insulating film 218 is formed in order to prevent the entrance of impurities to the elements such as the transistors and the capacitors in the pixel circuits. Depressions and projections caused by the driving transistor 150, the storage capacitor 140 and the like are absorbed by the leveling film 220, giving a flat surface.

An opening reaching the source electrode 216 is formed in the leveling film 220 and the second interlayer insulating film 218. A connection pad 224 covering this opening and a part of the leveling film 220 is disposed so as to be in contact with the source electrode 216, and a supplemental capacitor electrode 172 is formed over the leveling film 220. A third interlayer insulating film 174 is further formed to cover the connection pad 224 and the supplemental capacitor electrode 172. The third interlayer film 174 does not cover a part of the connection pad 224 in the opening formed in the leveling film 220 and exposes an upper surface of the connection pad 224. This structure enables electrical connection between the connection pad 224 and a pixel electrode 132 of the display element 130 formed thereover. An opening 226 may be formed in the third interlayer film 174 to allow a partition wall (also called a rib or a bank) 222 formed thereover to be in contact with the leveling film 220. Note that the formation of the connection pad 224 and the opening 226 is optional. Formation of the connection pad 224 prevents oxidation of a surface of the source electrode 216 in the following processes, by which an increase in contact resistance can be suppressed. The opening 226 functions as an opening for releasing impurities such as water and oxygen from the leveling film 220, by which reliability of the semiconductor elements and the display element 130 in the pixel circuit can be increased.

The pixel electrode 132 is provided over the third interlayer insulating film 174 so as to overlap the connection pad 224 and the supplemental capacitor electrode 172. The pixel electrode 132 is electrically connected to the source electrode 216 via the connection pad 224 in the opening formed in the third interlayer insulating film 174 and the leveling film 220. The supplemental capacitor 170 is configured by the supplemental capacitor electrode 172, the third interlayer insulating film 174, and the pixel electrode 132. Hence, the pixel electrode 132 is shared by the supplemental capacitor 170 and the display element 130.

A silicon-containing inorganic compound may be used for the undercoat 202, the gate insulating film 206, the first interlayer film 212, the second interlayer film 218, and the third interlayer film 174, for example. As a silicon-containing inorganic compound, silicon oxide containing oxygen and silicon, silicon oxynitride or silicon nitride oxide containing oxygen, silicon, and nitrogen, silicon nitride containing silicon and nitrogen and the like are represented. These films may each have a single-layer structure or a stacked layer structure. The leveling film 220 and the partition wall 222 contain an organic compound. As a typical organic compound, an acrylic resin, an epoxy resin, a polysiloxane resin, a polyimide resin, a polyamide resin and the like are exemplified.

The gate electrode 210, the capacitor electrode 208, the drain electrode 214, and the source electrode 216 are configured to include titanium, molybdenum, tungsten, tantalum, aluminum, copper, or an alloy thereof. These electrodes may be configured to have a structure in which a metal with a high conductivity, such as aluminum and copper, is sandwiched by a metal with a high melting point, such as titanium, molybdenum, tungsten, and tantalum.

The display element 130 is structured by the pixel electrode 132, a counter electrode 136 over the pixel electrode 132, and an EL layer 134 sandwiched by the pixel electrode 132 and the counter electrode 136. The pixel electrode 132 includes a conductive oxide exhibiting a transmitting property with respect to visible light, such as a mixed oxide of indium and tin (ITO) and a mixed oxide of indium and zinc (IZO), a metal such as silver and aluminum, or an alloy thereof. The pixel electrode 132 may have a single-layer structure or a stacked-layer structure. When the pixel electrode 132 has a stacked-layer structure, a structure may be employed in which a film including a metal is sandwiched by films including a conductive oxide such as ITO and IZO, for example.

The EL layer 134 is formed to cover the pixel electrode 132 and the partition wall 222. Here, the EL layer 134 means all of the layers disposed between the pixel electrode 132 and the counter electrode 136. The EL layer may be structured by a plurality of layers and may be formed by combining a variety of functional layers such as a carrier-injection layer, a carrier-transporting layer, an emission layer, a charge-blocking layer, and an exciton-blocking layer. The display element 130 may be configured so that the structure of the EL layer 134 is the same in all of the pixels 104 or different between adjacent pixels 104. For example, the EL layer 134 is configured so that the structure or material in the emission layer is different between adjacent pixels 104, by which light emissions with colors different from each other can be obtained from adjacent pixels 104. When the same EL layer 134 is utilized in all of the pixels 104, a plurality of emission colors can be obtained by arranging a color filter. In FIG. 3, a structure is illustrated for visibility in which a hole-injection/transporting layer, an emission layer, and an electron-injection/transporting layer are stacked as typical functional layers from the pixel electrode 132.

The counter electrode 136 is formed across the plurality of pixels 104. That is, the counter electrode 136 is shared by the plurality of pixels 104. The counter electrode 136 includes a conductive oxide having a light-transmitting property, such as ITO and IZO, a metal such as aluminum, magnesium, and silver, or an alloy thereof, for example. When the light emission obtained in the EL layer 134 is extracted through the pixel electrode 132, the pixel electrode 132 is formed so as to include a conductive oxide and the counter electrode 136 is formed using a metal having a high reflectance with respect to visible light, such as aluminum and silver. On the other hand, when the light emission obtained in the EL layer 134 is extracted through the counter electrode 136, the pixel electrode 132 is formed so as to include a metal with a high reflectance with respect to visible light, such as aluminum and silver, and the counter electrode 136 is formed so as to have a light-transmitting property with respect to visible light. Specifically, the counter electrode 136 may be structured by a film including a conductive oxide such as ITO and IZO or a metal thin film including a metal such as silver, magnesium, or aluminum and having a thickness which allows visible light to pass therethrough.

(2) Passivation Film

The passivation film 230 for protecting the display elements 130 is disposed over the display region 106 so as to overlap the display elements 130. The structure of the passivation film 230 may be arbitrarily selected. For example, it is possible to apply a stacked structure having a first inorganic film 232 containing an inorganic compound, an organic film 234 containing an organic compound, and a second inorganic film 236 containing an inorganic compound to the passivation film 230 as shown in FIG. 3. In this case, the aforementioned inorganic compounds containing silicon may be used as an inorganic compound. As an organic compound, a polymer such as an epoxy resin and acrylic resin may be used.

The first inorganic film 232 and the second inorganic film 236 having a low gas permeability efficiently suppress the entrance of impurities to the organic film 234 and the display elements 130 from outside. The organic film 234 may have a relatively large thickness, by which depressions and projections caused by the partition wall 222 or a foreign object are absorbed to provide a flat upper surface. The flattening ability of the organic film 234 improves evenness of the second inorganic film 236 formed thereover and prevents formation of a crack or a pinhole in the second inorganic film 236, thereby more effectively protecting the display device 100.

(3) Other Structures

A resin film 240 may be disposed over the passivation film 230. The resin film 240 protects the display region 106 and also functions as a mask for removing the first inorganic film 232 and the second inorganic film 236 temporally covering the terminals 112 during manufacture of the display device 100. The resin film 240 also includes a polymer such as an epoxy resin and an acrylic resin. Although not illustrated, a polarizing plate or a counter substrate may be provided over the resin film 240.

3. Peripheral Region 3-1. Structure

Figure 4:
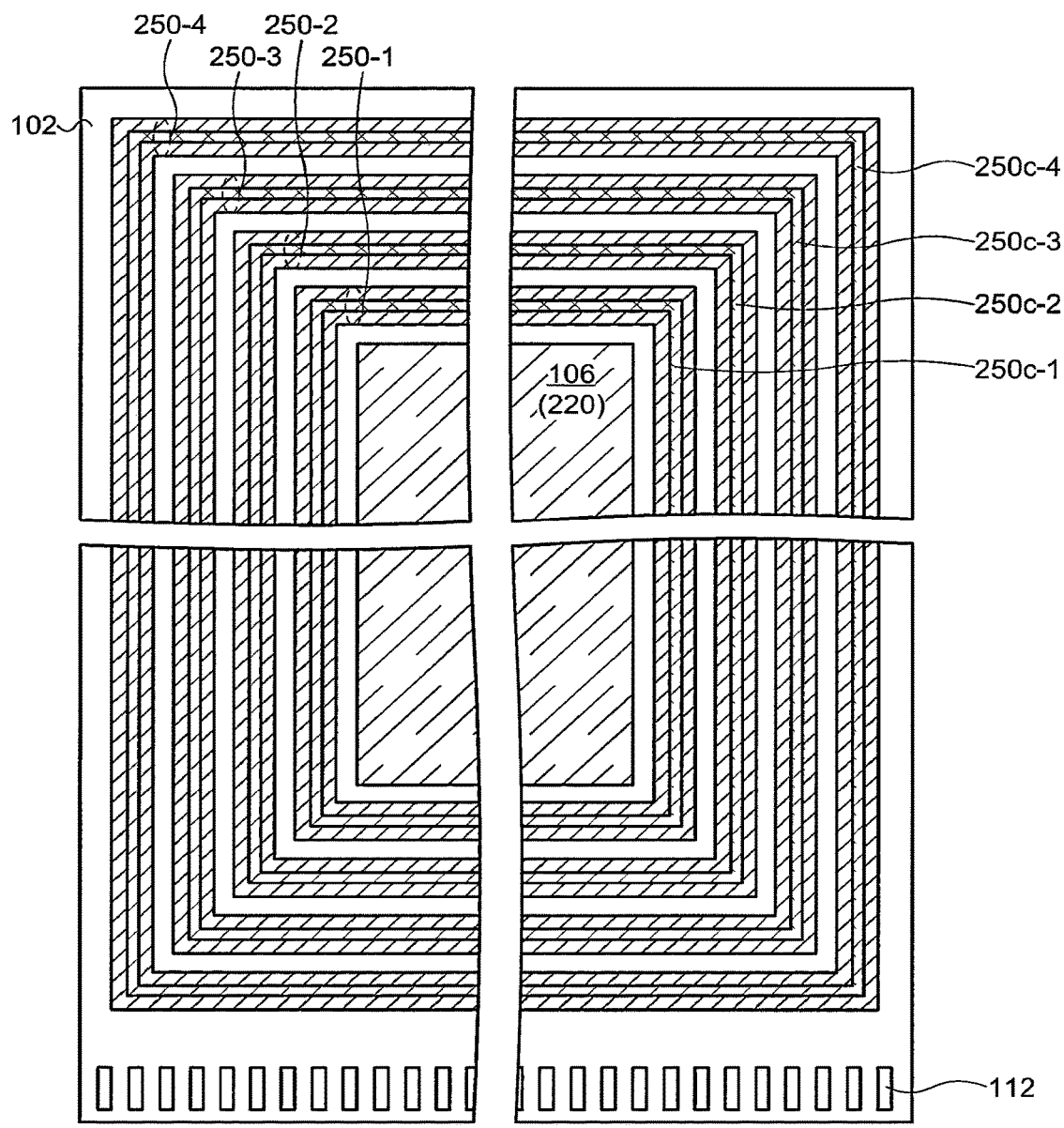
FIG. 4 is a schematic top view of a display device according to an embodiment of the present invention.

A schematic top view of the structures of the four corners of the display device 100 is shown in FIG. 4. In this figure, the components such as the display elements 130, the passivation film 230, and the resin film 240 are omitted. As described below, the display device 100 has at least one dam 250 surrounding the display region 106. The dam 250 may be configured with a plurality of dams 250. In the example shown in FIG. 4, an example having four dams (a first dam 250-1, a second dam 250-2, a third dam 250-3, and a fourth dam 250-4) is demonstrated. Hereinafter, their structures are explained in detail.

3-2. Upper Peripheral Region

Figure 5:
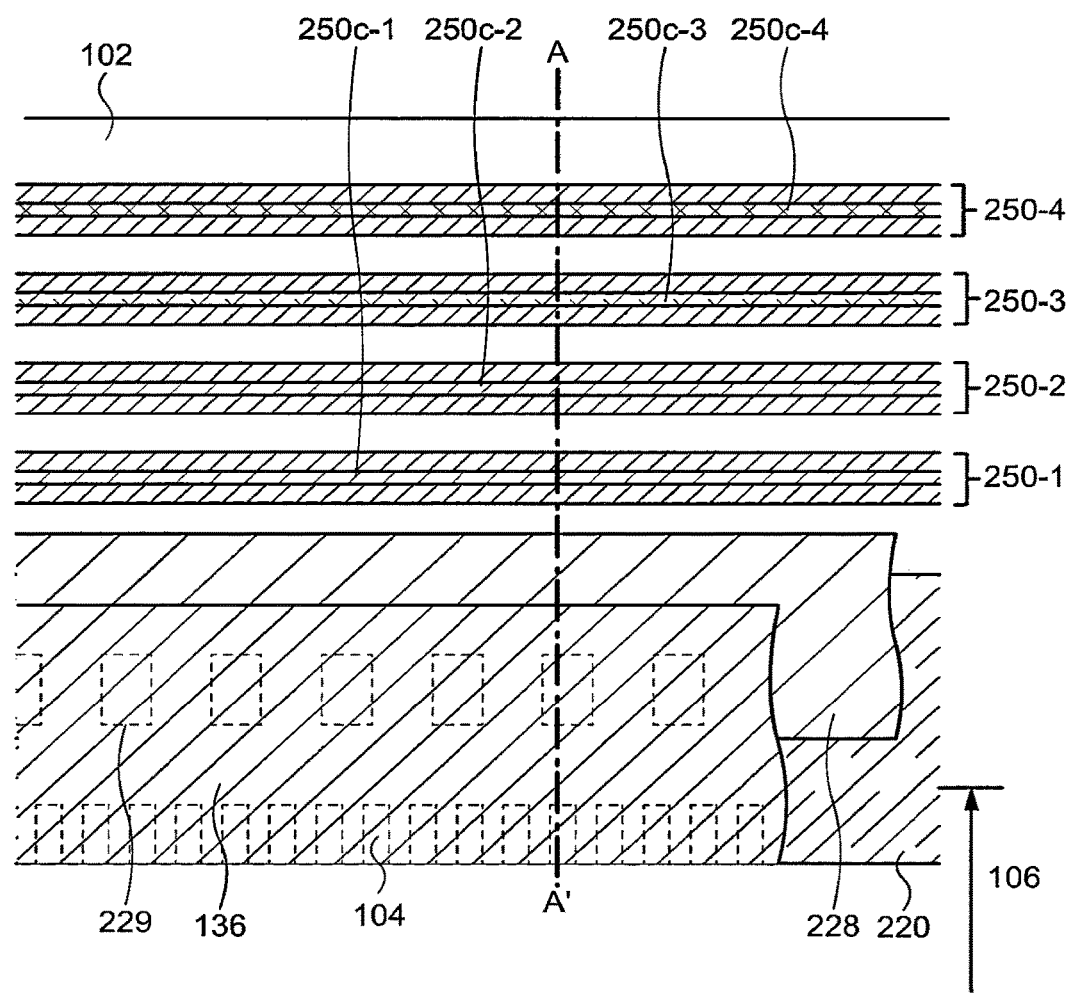
FIG. 5 is a schematic top view of a display device according to an embodiment of the present invention.
Figure 6:
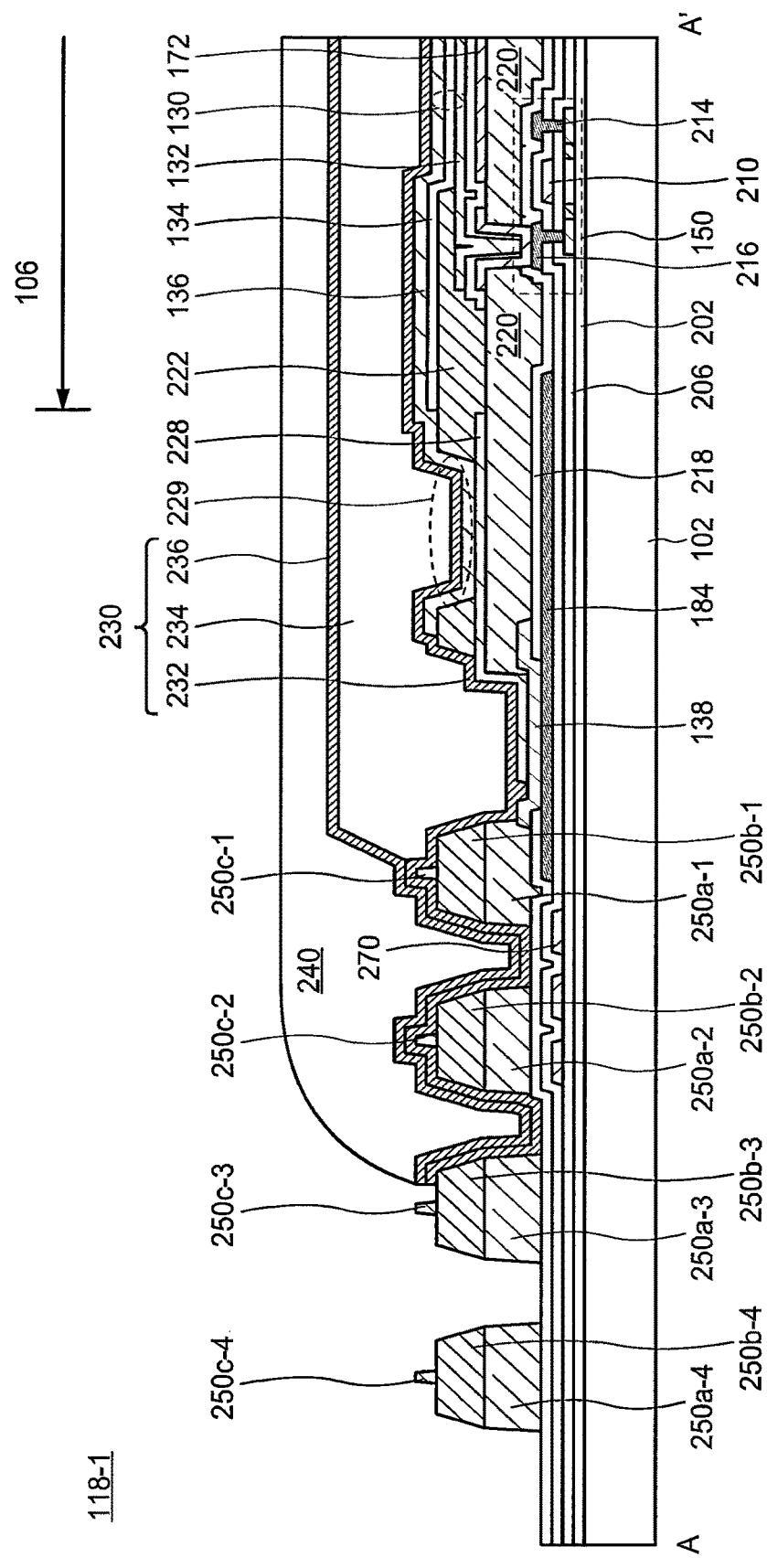
FIG. 6 is a schematic cross-sectional view of a display device according to an embodiment of the present invention.

A schematic top view of a region 118-1 (see FIG. 1) located on a side opposite to the terminals 112 with respect to the display region 106 is shown in FIG. 5, and a schematic view of a cross-section along a chain line A-A' in FIG. 5 is shown in FIG. 6. In these figures, the peripheral region and a part of the pixel 104 adjacent to the peripheral region are illustrated.

(1) Peripheral Circuit

As shown in FIG. 6, one or a plurality of wirings 270, the low-potential power-source line 184, a first connection wiring 138 connected to the low-potential power-source line 184 and the like, which extend substantially parallel to the upper side of the substrate 102, are disposed in the peripheral region of the upper portion of the substrate 102. There is no limitation to the number, usage, and function of the wirings 270, and the wirings 270 may function as the high-potential power-source line 180 for providing PVDD to the pixel electrodes 132, or as the signal lines for transmitting a variety of signals to the driver circuits, for example. In FIG. 6, an example is demonstrated where the wirings 270 and the low-potential power-source line 184 respectively exist in the same layer as the gate electrode 210 and the source electrode 216 (drain electrode 214). However, the wirings 270 may exist in the same layer as the source electrode 216 (drain electrode 214), and the low-potential power-source line 184 may exist in the same layer as the gate electrode 210. Alternatively, one or both of the wirings 270 and the low-potential power-source line 184 may be prepared using a conductive film formed in a different layer from the gate electrode 210 and the source electrode 216 (drain electrode 214). The first connection wiring 138 is configured to include a conductive oxide such as ITO and IZO or a metal such as titanium, tungsten, molybdenum, tantalum, and aluminum.

The counter electrode 136 extends from the display region 106 to the peripheral region and is electrically connected to the low-potential power-source line 184 in the peripheral region. Since the low-potential power-source line 184 is formed along the circumference of the display region 106, this structure allows the counter electrode 136 to be entirely supplied with substantially the same potential (PVSS) in the whole of the display region. The counter electrode 136 may be in direct contact with the low-potential power-source line 184, or this electrical connection may be carried out through the first connection wiring 138 and a second connection wiring 228 as shown in FIG. 6. The second connection wiring 228 is located over the leveling film 220 and is partly exposed from the partition wall 222 in a plurality of openings 229 formed in the partition wall 222 (FIG. 5 and FIG. 6). The counter electrode 136 and the second connection wiring 228 are connected in these openings 229. Since the second connection wiring 228 can be formed in the same process as the pixel electrode 132, these elements have the same structure and can exist in the same layer.

(2) Dam

The leveling film 220 formed in the display region 106 also extends in a direction toward the upper side of the substrate 102 so as to cover a part of the low-potential power-source line 184 (FIG. 5 and FIG. 6). However, a part of the leveling film 220 is removed in the peripheral region, and a first layer 250a, which is a part of the dam 250, is formed with the remaining portion thereof. As described below, the leveling film 220 and the first layer 250a may be formed in the same process using a material including an organic compound (first organic compound). Thus, the leveling film 220 and the first layer 250a may exist in the same layer, have the same composition, and the same organic compound. Note that, although the leveling film 220 under the display element 130 and the leveling film 220 under the second connection wiring 228 appear to be separated in FIG. 6, the opening used for the electrical connection between the source electrode 216 and the display element 130 does not completely separate these components.

The partition wall 222 also extends in the direction toward the upper side of the substrate 102 so as to cover a part of the second connection wiring 228 (FIG. 5 and FIG. 6). However, similar to the leveling film 220, a part of the partition wall 222 is removed in the peripheral region, and a second layer 250b, which is a part of the dam 250, is formed with the remaining portion thereof. As described below, the partition wall 222 and the second layer 250b may be formed in the same process using an organic compound (second organic compound). Thus, the partition wall 222 and the second layer 250b may exist in the same layer, have the same composition, and include the same organic compound. The component structured by the first layer 250a and the second layer 250b is called a base of the dam 250.

Figure 7A:
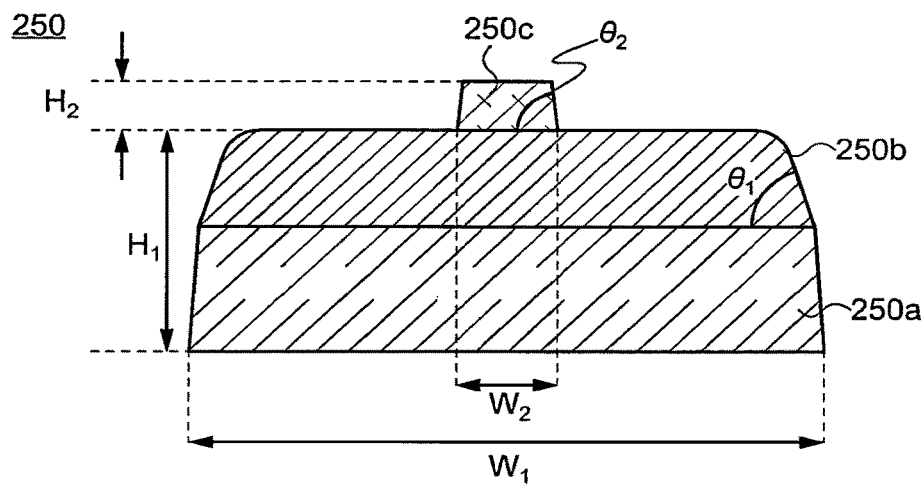
FIG. 7A to FIG. 7C are each a schematic cross-sectional view of a dam of a display device according to an embodiment of the present invention.

A schematic cross-sectional view of the dam 250 is shown in FIG. 7A. Each dam 250 has a stopper 250c in addition to the first layer 250a and the second layer 250b over and in contact with the first layer 250a. In the examples shown in FIG. 5 and FIG. 6, the first dam 250-1 to the fourth dam 250-4 respectively have the first stopper 250c-1 to the fourth stopper 250c-4. Similar to the base, each stopper 250c may also be provided so as to surround the display region 106 (FIG. 4). The stopper 250c includes a metal (0-valent metal) or the aforementioned silicon-containing inorganic compound. As the metal of the stopper 250c, aluminum, titanium, tungsten, molybdenum, tantalum, copper, or an alloy including these metals are represented. The stopper 250c does not cover the whole of the upper surface of the base, namely, the whole of the top surface of the second layer 250b but partly covers the top surface of the second layer 250b. In other words, a bottom surface of the stopper 250c is in contact with a part of the upper surface of the second layer 250b of the base, and a part of the upper surface of the second layer 250b is exposed from the stopper 250c.

A summation H1 of the heights of the first layer 250a and the second layer 250b (i.e., the height of the base) is larger than the height H2 of the stopper 250c and may be equal to or more than twice and equal to or less than 25 times, equal to or more than twice and equal to or less than 6 times, or equal to or more than twice and equal to or less than 5 times the height H2, for example (FIG. 7A). When a width of a bottom surface of the first layer 250a is considered to be a width W1 of the dam 250 and a width of the bottom surface of the stopper 250c is considered to be a width W2 of the stopper 250c, each base and each stopper 250c may be configured so that the width W1 is larger than the width W2 and is equal to or more than twice and equal to or less than 100 times, equal to or more than 5 times and equal to or less than 50 times, or equal to or more than 10 times and equal to or less than 30 times the width W2. A side surface of the base is inclined from a normal line of the substrate 102, and its angle with respect to the bottom surface, that is, an angle from an upper surface of the substrate 102 is smaller than 90°. More specifically, an angle θ1 between a side surface of the second layer 250b and the upper surface of the substrate 102 is smaller than 90°. On the other hand, a side surface of the stopper 250c may be parallel or substantially parallel to the normal line of the substrate 102. When the side surface of the stopper 250c is inclined from the normal line, an angle between the side surface of the stopper 250c and the bottom surface thereof, that is, an angle θ2 between the side surface of the stopper 250c and the upper surface of the substrate 102 is larger than the angle θ1. Therefore, the side surface of the stopper 250c is steeper than the side surface of the base.

Figure 7B:
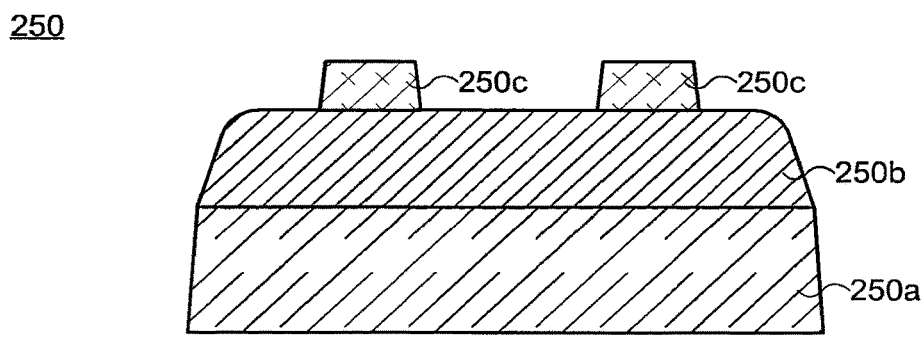
Figure 7C:
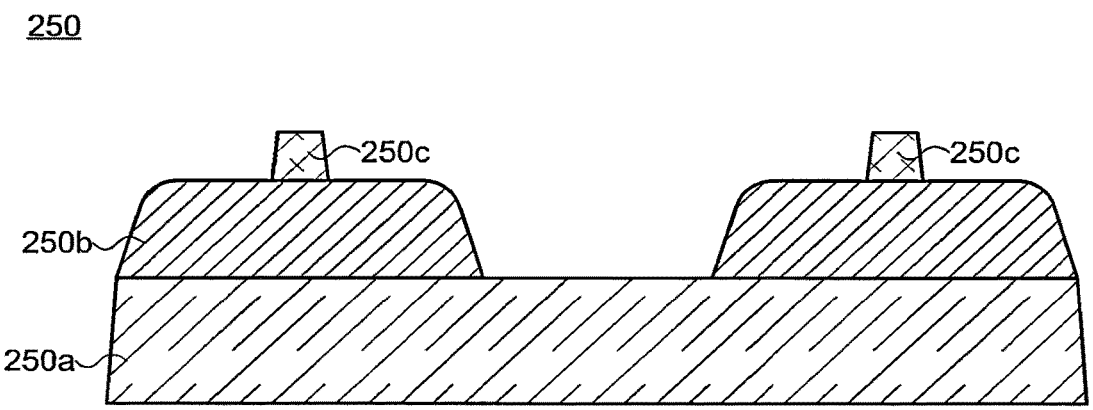

In each dam 250, the number of stoppers 250c is arbitral, and each dam 250 may have a plurality of stoppers 250c as shown in FIG. 7B, for example. In addition, the first layers 250a may be connected so as to be integrated between adjacent dams 250 (FIG. 7C). Since the leveling film 220 is separated from the first layer 250a of at least one of the dams 250, it is possible to prevent impurities entering the first layer 250a from being transported to the display region 106 via the leveling film 220, which contributes to high reliability of the display device 100.

(3) Structures of Passivation Film and Resin Film and Control Thereof

The first inorganic film 232 and the second inorganic film 236 of the passivation film 230 are formed so as to envelop the organic film 234 and are in contact with each other in the peripheral region (FIG. 6). That is, the organic film 234 is sealed by the first inorganic film 232 and the second inorganic film 236, and the entrance of impurities to the organic film 234 is effectively prevented by this structure. The first inorganic film 232 and the second inorganic film 236 overlap at least a part of the dams 250. That is, the first inorganic film 232 and the second inorganic film 236 overlaps a part of the dams 250, and another part of the dams 250 are exposed from the first inorganic film 232 and the second inorganic film 236. The resin film 240 covers the passivation film 230 not only in the display region 106 but also in the peripheral region, and an edge portion thereof may match the edge portions of the first inorganic film 232 and the second inorganic film 236. In other words, the first inorganic film 232 and the second inorganic film 236 are located in a region overlapping the resin film 240 and are formed so as to be confined in this region.

The dams 250 each including the first layer 250a, the second layer 250b, and the stopper 250c efficiently function to control the positions and shapes of the passivation film 230 and the resin film 240. Specifically, the first dam 250-1 and the second dam 250-2 have a function to control the shape and position of the organic film 234, whereas the third dam 250-3 and the fourth dam 250-4 contribute to shape control of the resin film 240 as well as the first inorganic film 232 and the second inorganic film 236. As described below for the manufacturing method of the display device 100, the organic film 234 and the resin film 240 are formed with an ink-jet method, a printing method, or the like. Specifically, a solution or a suspension of a resin or a precursor thereof serving as a raw material of the organic film 234 or the resin film 240 (hereinafter, the solution and the suspension are collectively called a raw-material liquid) is discharged or applied to the first inorganic film 232 or the second inorganic film 236, and then a solvent in the raw-material liquid is removed and/or the precursor is reacted, resulting in the formation of the organic film 234 or the resin film 240. In contrast, the first inorganic film 232 and the second inorganic film 236 are prepared by forming a film containing an inorganic compound over almost the entire surface of the substrate 102, and then performing dry etching using, as a mask, the resin film 240 formed thereover. In view of these processes, the positions and the shapes of the passivation film 230 and the resin film 240 depend on the spread of the raw-material liquid providing the organic film 234 over the first inorganic film 232 and the spread of the raw-material liquid providing the resin film 240 over the second inorganic film 236.

The raw-material liquid giving the organic film 234 is discharged or applied so as to adequately cover the display region 106 in order to avoid formation of a pinhole over the display region 106. Hence, a part of the raw-material liquid overflows from the display region 106. The overflowing raw-material liquid can be dammed by the first dam 250-1. Accordingly, the organic film 234 can be selectively formed within the dam 250-1. Even if the raw-material liquid overflows outside from the first dam 250-1, it is possible to prevent the organic film 234 from being formed on the side toward the edge portion of the substrate 102 from the second dam 250-2 because the second dam 250-2 also has a function to dam the raw-material liquid.

Similarly, since the raw-material liquid giving the resin film 240 is discharged or applied so as to adequately cover the display region 106 and the organic film 234, the raw-material liquid partly overflows from the display region 106 and the organic film 234. The overflowing raw-material liquid is dammed by the third dam 250-3. As a result, the resin film 240 overlapping the first dam 250-1 and the second dam 250-2 can be selectively formed within the third dam 250-3. When the raw-material liquid overflows outside from the third dam 250-3, the raw-material liquid is dammed by the fourth dam 250-4, which prevents the resin film 240 from being formed on the side toward the edge portion of the substrate 102 from the fourth dam 250-4.

In particular, the use of the dams 250 according to the present embodiment allows the spread of the raw-material liquid to be more adequately controlled, which is explained using FIG. 8A to FIG. 9C.

Figure 8A:
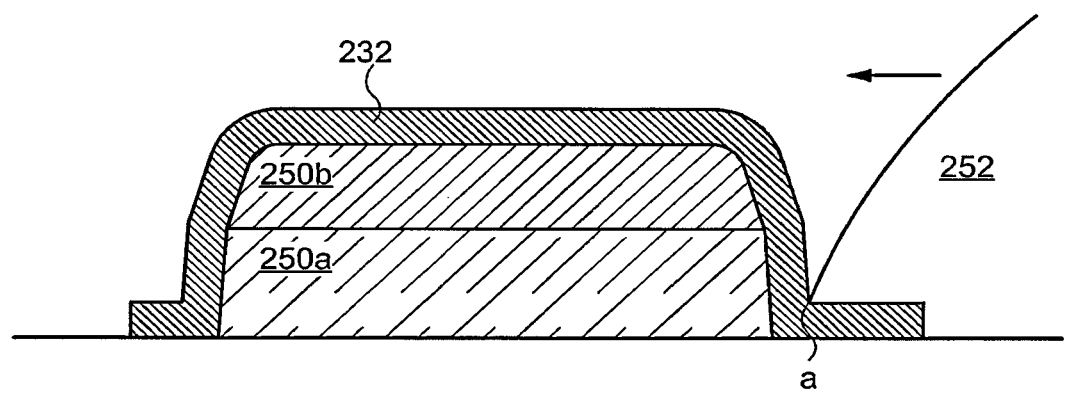
FIG. 8A and FIG. 8B are each a schematic cross-sectional view showing a manufacturing process of a display device.

FIG. 8A is a schematic cross-sectional view of a state where the raw-material liquid 252 approaches the dam 250 without the stopper 250c and the first inorganic film 232 formed thereover from the side of the display region 106. Since the first inorganic film 232 and the second inorganic film 236 are formed over the dam 250, a projected portion caused by the dam 250 is formed therein. A part of the raw-material liquid discharged or applied to cover the display region 106 overflows from the display region 106 to the peripheral region and reaches the dam 250 as shown in FIG. 8A. When a tip of the raw-material liquid comes into contact with a lower edge of the projected portion of the first inorganic film 232 (a in the figure), the tip of the raw-material liquid 252 remains at this lower edge a or on the side surface thereover because the angle of the surface of the first inorganic film 232 (i.e., the direction of the normal line of the surface) drastically changes at the lower edge a. This is because surface tension acts on the raw-material liquid 252. Even if the raw-material liquid 252 is further added after arriving at the state of FIG. 8A, the raw-material liquid does not spread over the dam 250 unless gravity acting on the raw-material liquid exceeds the surface tension.

Figure 8B:
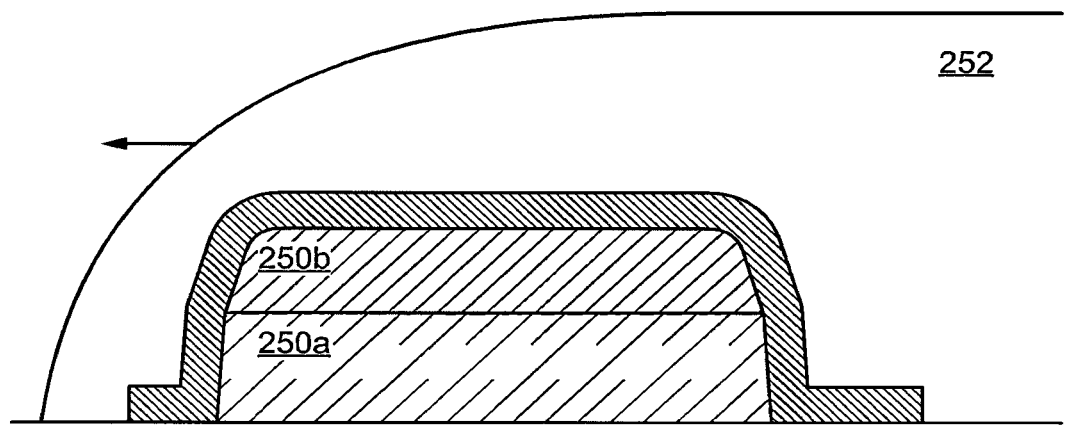
Figure 9A:
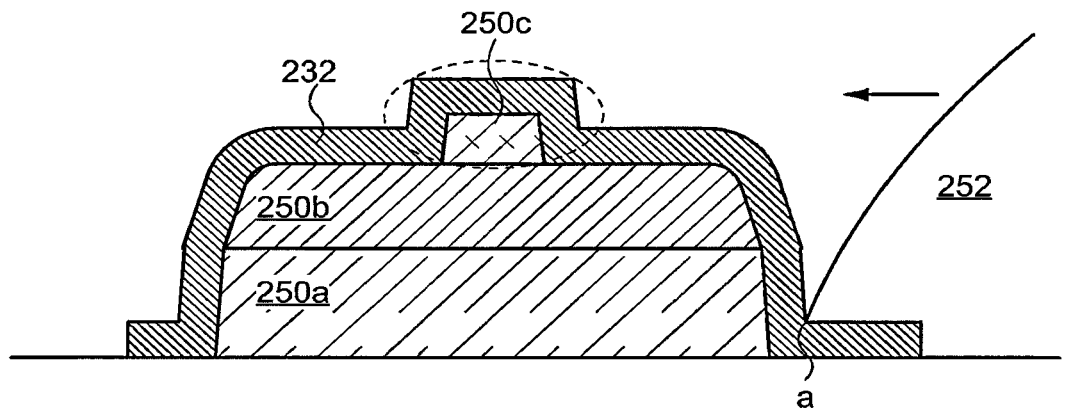
FIG. 9A to FIG. 9C are each a schematic cross-sectional view showing a manufacturing process of a display device according to an embodiment of the present invention.
Figure 9B:
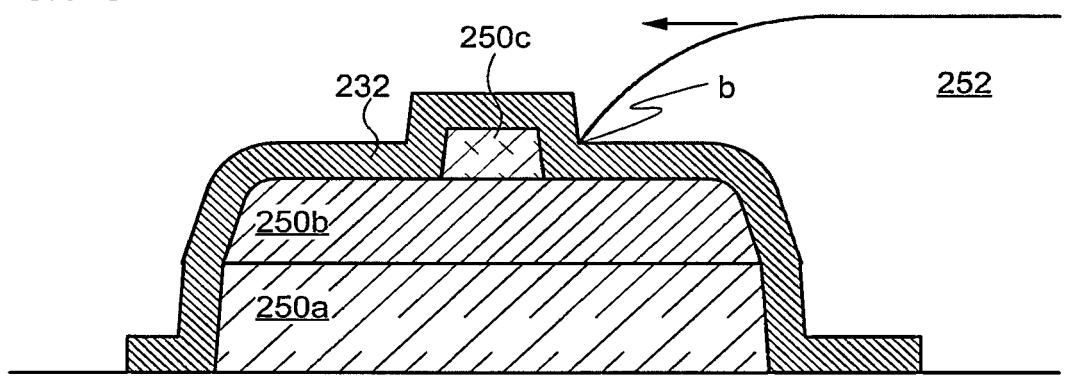
Figure 9C:
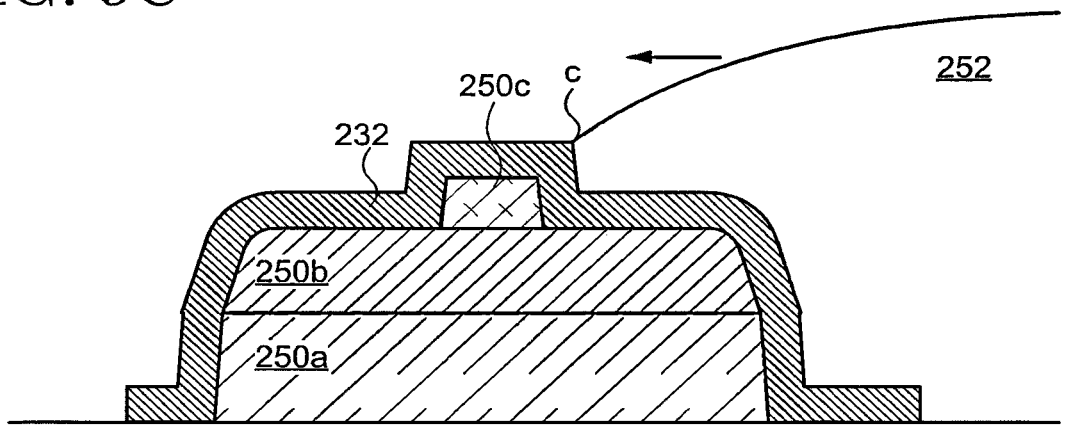

However, an excess amount of raw-material liquid is further supplied, the gravity acting on the raw-material liquid 252 overcomes the surface tension, which allows the tip of the raw-material liquid 252 to cross over the lower edge a and the side surface thereover. As described below, since the first layer 250a and the second layer 250b are prepared by exposing and developing (wet etching) a photosensitive resin including an organic compound, the corner between the side surface and the upper surface thereof is roundly shaped. This round shape of the corner is also reflected on the first inorganic film 232. Hence, if the raw-material liquid 252 once crosses over the side surface, the raw-material liquid 252 cannot remain at the corner between the side surface and the upper surface and immediately crosses over the dam 250, which inhibits the spread of the raw-material liquid 252 from being controlled (FIG. 8B).

In contrast, the dam 250 has the stopper 250c in the present embodiment. Thus, the first inorganic film 232 and the second inorganic film 236 formed over the dam 250 further have a projected portion (the structure in a dotted ellipse in FIG. 9A) over the projected portion caused by the base. The stopper 250c is formed by dry-etching the film including an inorganic compound. Hence, the angle θ2 between the side surface thereof and the upper surface of the substrate 102 is larger than the angle θ1, and the corner between the side surface and the upper surface is not roundly shaped but angularly shaped compared with that of the second layer 250b, giving a relatively clear ridge. Hence, even if the raw-material liquid 252 is further discharged or applied in the state where the tip of the raw-material liquid 252 reaches the lower edge a (FIG. 9A) and crosses over the side surface of the projected portion caused by the base, the raw-material liquid 252 can remain at a lower edge (b in FIG. 9B) of the projected portion of the first inorganic film 232 caused by the stopper 250c, on the side surface thereof, or on a ridge (c in FIG. 9C) of the projected portion. The application of the dam 250 of the present embodiment allows the positions and shapes of the organic film 234 and the resin film 240 to be more precisely controlled due to this mechanism in addition to the effect that the dam 250 is heightened by the stopper 250c.

3-3. Peripheral Region of Lateral Side

Figure 10:
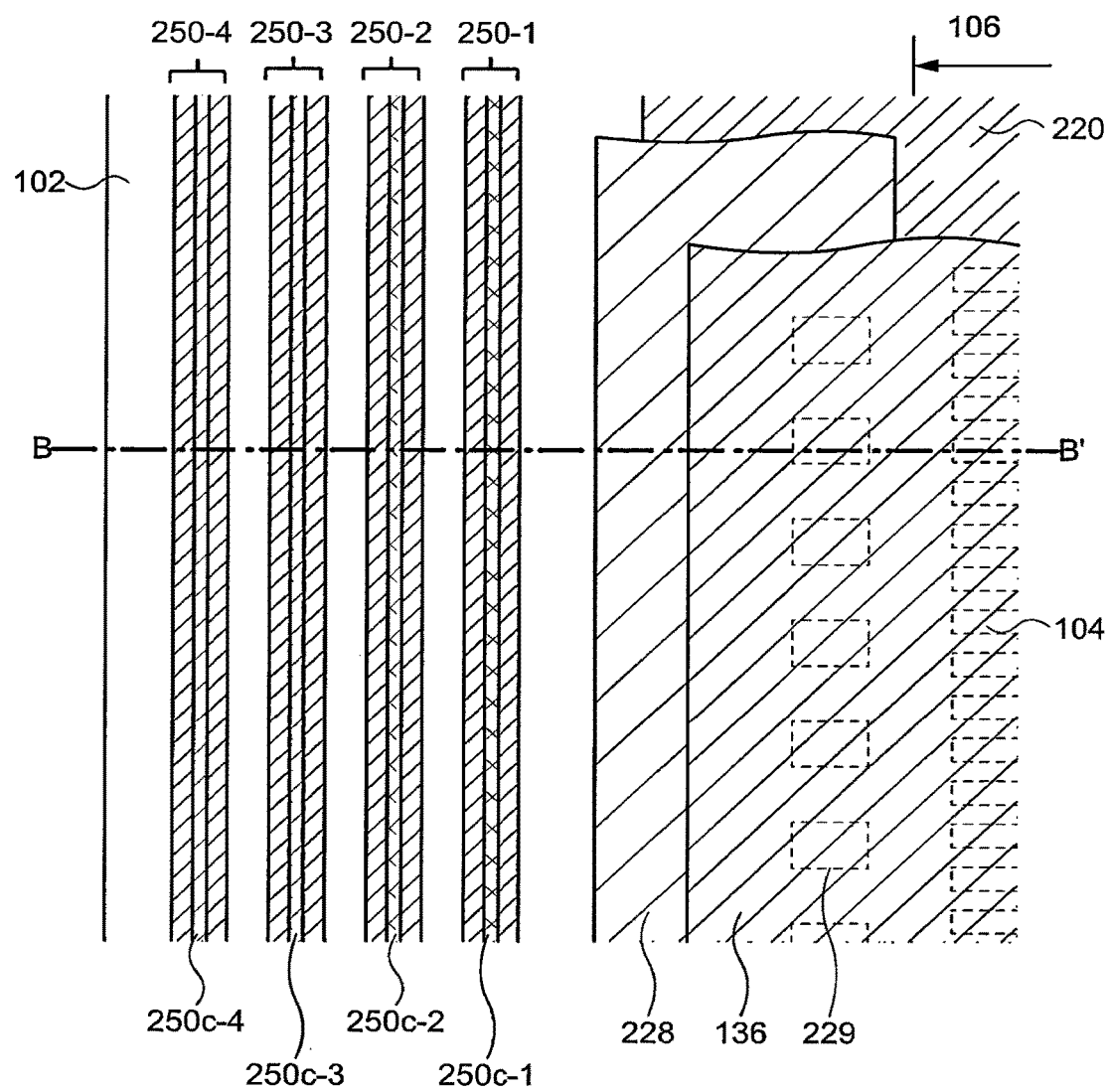
FIG. 10 is a schematic top view of a display device according to an embodiment of the present invention.
Figure 11:
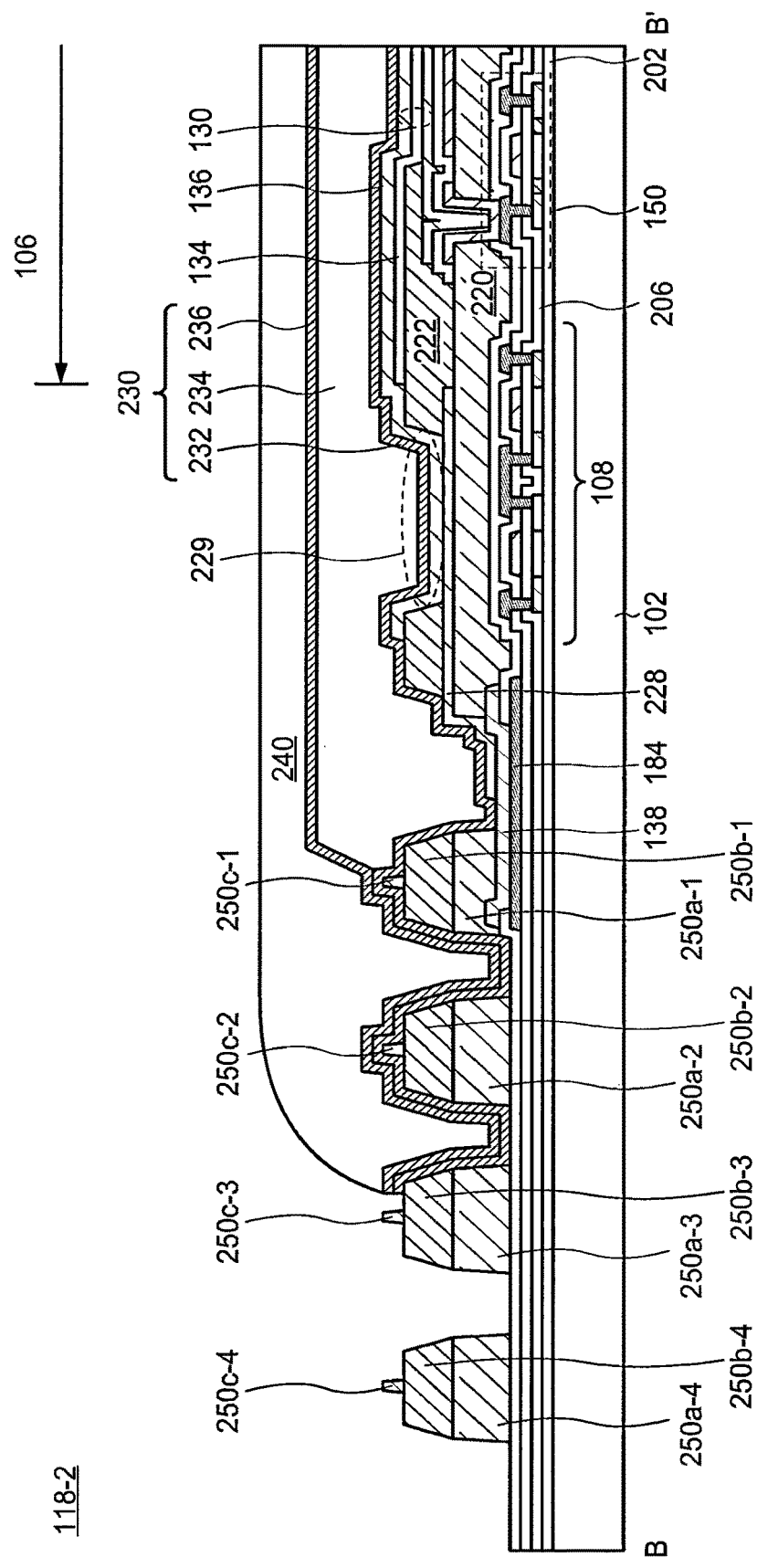
FIG. 11 is a schematic cross-sectional view of a display device according to an embodiment of the present invention.

A schematic top view of the region 118-2 (see FIG. 1) including a part of the lateral side of the display device 100 is shown in FIG. 10, and a schematic view of the cross-section along the chain line B-B' in FIG. 10 is shown in FIG. 11. Hereinafter, an explanation of the structures similar to or the same as those in the region 118-1 may be omitted.

As shown in FIG. 11, the transistors and the like included in the scanning-line driver circuits 108 are disposed in the peripheral region. Similar to the region 118-1 (FIG. 6), the counter electrode 136 extends from the display region 106 to the peripheral region and is electrically connected to the low-potential power-source line 184 in the peripheral region. As shown in FIG. 10 and FIG. 11, at least one dam 250 is provided in the peripheral region, and each dam 250 has the stopper 250c. With this structure, the positions and shapes of the organic film 234 and the resin film 240 can be precisely controlled even on the lateral side of the display device 100.

3-4. Lower Peripheral Region

Figure 12:
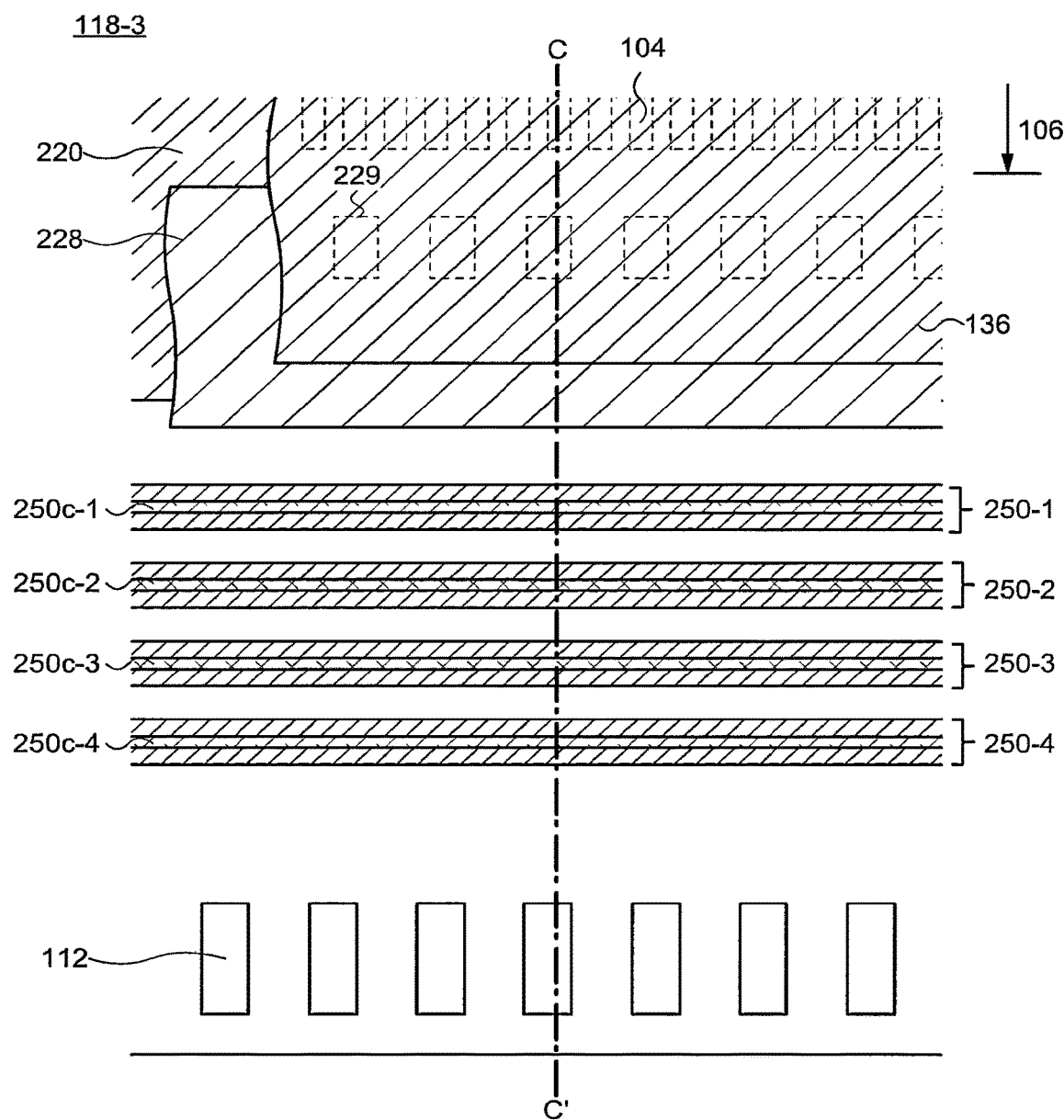
FIG. 12 is a schematic top view of a display device according to an embodiment of the present invention.
Figure 13:
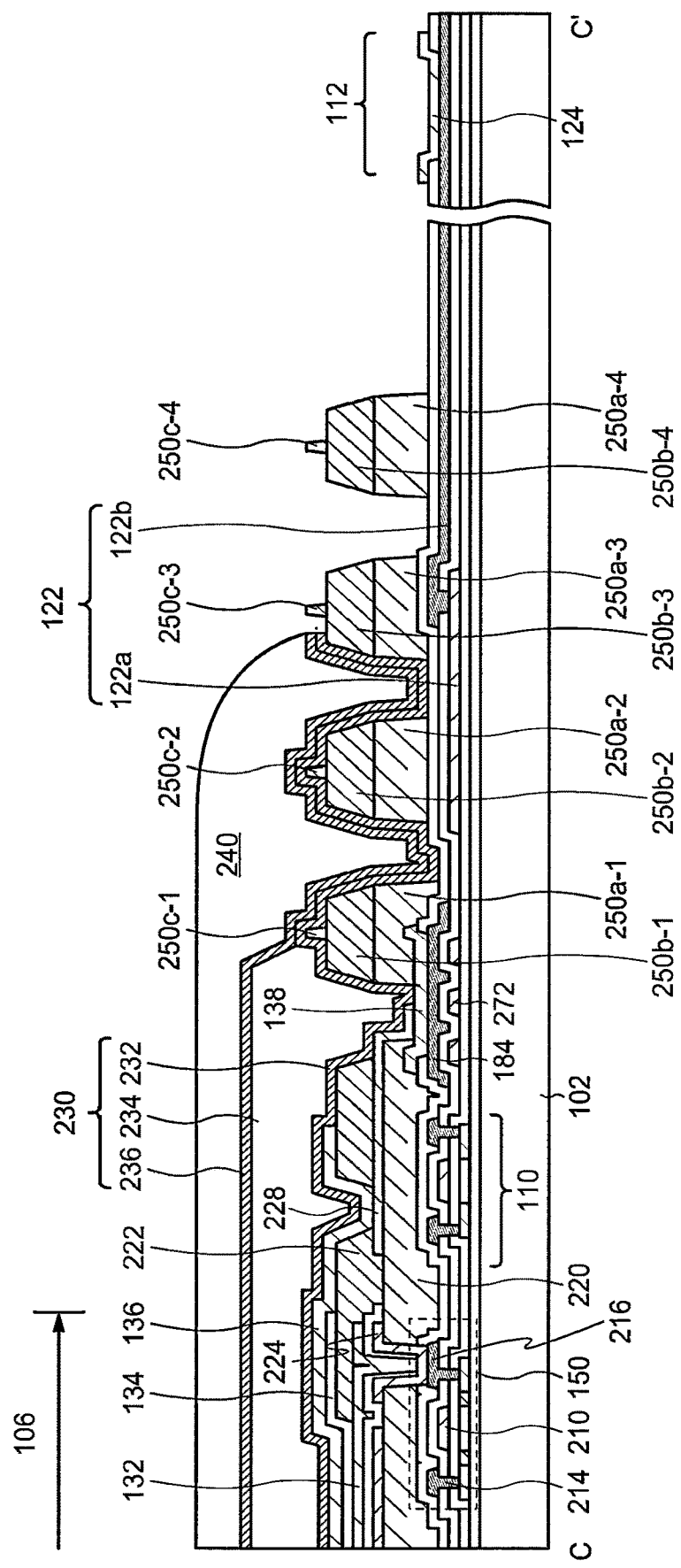
FIG. 13 is a schematic cross-sectional view of a display device according to an embodiment of the present invention.

A schematic top view of the region 118-3 (see FIG. 1) positioned on the terminal 112 side of the display region 106 is shown in FIG. 12, and a schematic view of the cross-section along the chain line C-C' in FIG. 12 is shown in FIG. 13. An explanation of the structures the same as or similar to those in the regions 118-1 and 118-2 may also be omitted in the following explanation.

As shown in FIG. 13, the signal-line driver circuit 110 including an analogue switch and the like is formed in the peripheral region, and one or a plurality of wirings 272 extending substantially parallel to the lower side of the substrate 102 and the low-potential power-source line 184 as well as the first connection wiring 138 and the second connection wiring 228 connected to the low-potential power-source line 184 or the like are arranged. A wiring 122 for supplying a variety of signals and a power source to the pixels 104 and the driver circuits is formed between the display region 106 and the edge portion of the substrate 102. The wiring 122 may be prepared with a plurality of conductive films formed in different layers and may be prepared by connecting a wiring 122a existing in the same layer as the gate electrode 210 of the driving transistor 150 and a wiring 122b existing in the same layer as the source electrode 216 (drain electrode 214). The wiring 122 is exposed at the edge portion of the substrate 102 to form the terminal 112. At the terminal 112, a top surface of the wiring 122 may be covered with a protecting conductive film 124. The protecting conductive film 124 may be simultaneously formed with the pixel electrode 132 or the connection pad 224, for example, and may exist in the same layer as one of these items. The counter electrode 136 extends from the display region 106 to the peripheral region and is electrically connected to the low-potential power-source line 184 via the first connection wiring 138 and the second connection wiring 228 in the peripheral region. At least one dam 250 is provided in the peripheral region, and each dam 250 has the stopper 250c. With this structure, the positions and shapes of the organic film 234 and the resin film 240 can also be precisely controlled even on the lower side of the display device 100.

Since the pixel circuit including the display element 130 is protected with the passivation film 230 and the resin film 240 in the display device 100, precise control of the positions and shapes thereof improves reliability of the display device 100. As described above, at least one dam 250 having the stopper 250c is formed in the display device 100, thereby the positions and shapes of the organic film 234 and the resin film 240 are precisely controlled. Hence, implementation of the present embodiment effectively suppresses the entrance of impurities to the display device 100, allowing the display device 100 to exhibit high reliability.

4. Manufacturing Method

A manufacturing method of the display device 100 is explained using FIG. 14A to FIG. 17B. These figures are cross-sectional views corresponding to FIG. 6.

Figure 14A:
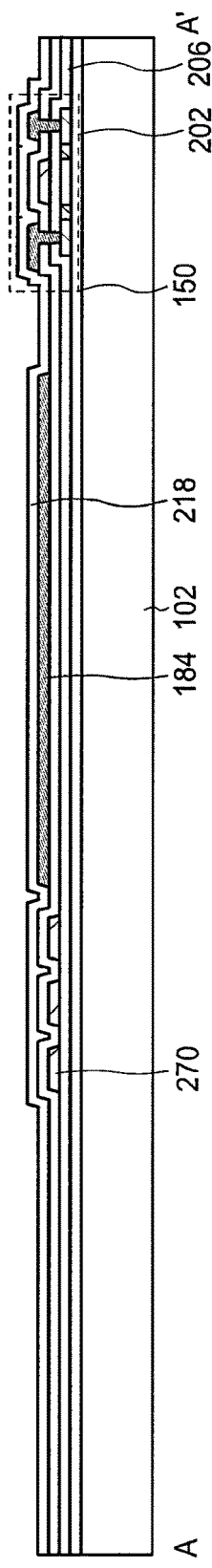
FIG. 14A to FIG. 14C are each a schematic cross-sectional view for explaining a manufacturing method of a display device according to an embodiment of the present invention.

FIG. 14A shows a structure in which the driving transistor 150, the wirings 270, the low-potential power-source line 184, and the second interlayer film 218 covering these items are formed over the substrate 102. Since this structure can be prepared by applying the known methods, an explanation of its preparation method is omitted.

4-1. Leveling Film and First Layer

Figure 14B:
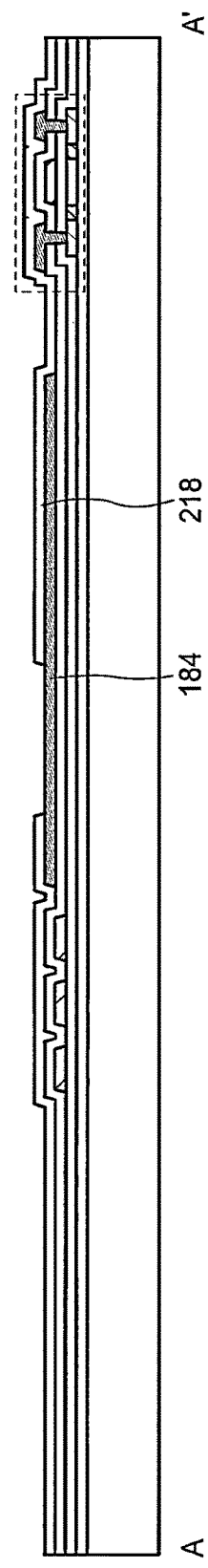
Figure 14C:
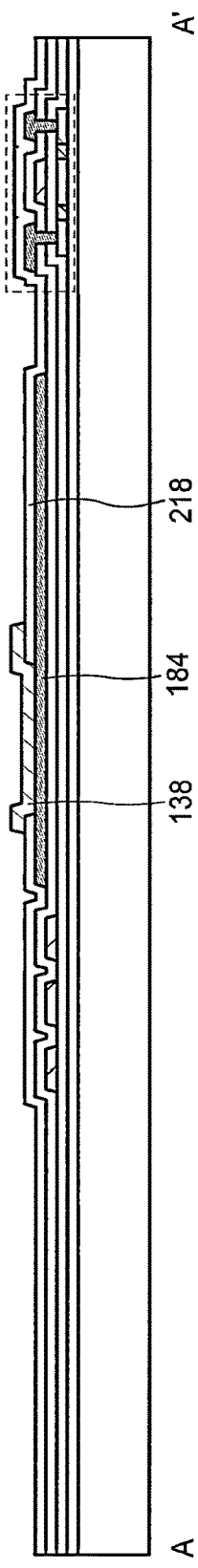

As shown in FIG. 14B, the second interlayer film 218 is processed with etching to form an opening in the second interlayer film 218 for electrical connection of the first connection wiring 138 to the low-potential power-source line 184. After that, the first connection wiring 138 is formed over the second interlayer film 218 so as to cover this opening (FIG. 14C). The first connection wiring 138 may be formed by applying a sputtering method, a CVD method or the like.

After that, the leveling film 220 and the first layers 250a of the dams 250 are formed (FIG. 15A). Specifically, a photosensitive resin is formed over almost the entire surface of the substrate 102 to cover the display region 106 and the peripheral region. The photosensitive resin is selected from an acrylic resin, an epoxy resin, a polysiloxane resin, a polyimide resin, a polyamide resin and the like having photosensitivity. Formation of the photosensitive resin may be carried out by applying a spin-coating method, a dip-coating method, an ink-jet method, a printing method or the like or may be performed by pasting a sheet-shaped resin. Next, the photosensitive resin is exposed through a photomask and then developed using an etchant, thereby forming the leveling film 220 and the first layers 250a.

Note that a part of the opening for electrically connecting the driving transistor 150 to the display element 130 is formed in the leveling film 220 at this stage (FIG. 15A). After that, the second interlayer film 218 is further etched in this opening, by which the source electrode 216 is exposed from the leveling film 220 (FIG. 15B).

4-2. Formation of Dam

Next, the connection pad 224 is formed so as to cover the opening formed in the leveling film 220 and the second interlayer film 218, and the supplementary capacitor electrode 172 is formed so as to cover a part of the upper surface of the leveling film 220. These items may also be prepared by applying a CVD method or a sputtering method. At this time, the protecting conductive film 124 for protecting the wiring 122 may also be formed at the terminal 112.

Next, the third interlayer film 174 covering the supplementary capacitor electrode 172 and a part of the connection pad 224 is formed (FIG. 15B). In addition, the pixel electrode 132 is prepared so as to overlap the supplementary capacitor electrode 172, and the second connection wiring 228 is formed so as to overlap a part of the leveling film 220 and the first connection wiring 138 (FIG. 16A). These films and wirings may also be prepared by applying a CVD method or a sputtering method. Since the pixel electrode 132 and the second connection wiring 228 can be prepared at the same time, these items may have the same structure and exist in the same layer. Formation of the pixel electrode 132 results in the supplementary capacitor 170 (see FIG. 3).

Furthermore, the partition wall 222 and the second layers 250b of the dams 250 are formed so as to cover the edge portion of the pixel electrode 132 and overlap the first layers 250a of the dams 250, respectively (FIG. 16A). Similar to the first layers 250a, these items are also formed by applying a photosensitive resin over almost the entire surface of the substrate 102, exposing the photosensitive resin through a photomask, and conducting development with an etchant. At this time, the opening 229 is also prepared simultaneously. Simultaneous formation of the partition wall 222 and the second layers 250b of the dams 250 allows these items to exist in the same layer, have the same composition, and include the same organic compound. Therefore, the dams 250 contain a material included in at least one of the leveling film 220 and the partition wall 222. In addition, the first layers 250a and the second layers 250b may include the same material and have the same composition as the leveling film 220 and the partition wall 222, respectively.

After that, the stoppers 250c are formed. The stoppers 250c are prepared by forming a metal film or a film including an inorganic compound containing silicon over almost the entire surface of the substrate 102 using a CVD method or a sputtering method, followed by processing the film with dry etching. The dams 250 are formed by the processes described above (FIG. 16B).

4-3. Formation of Display Element

Figure 17A:
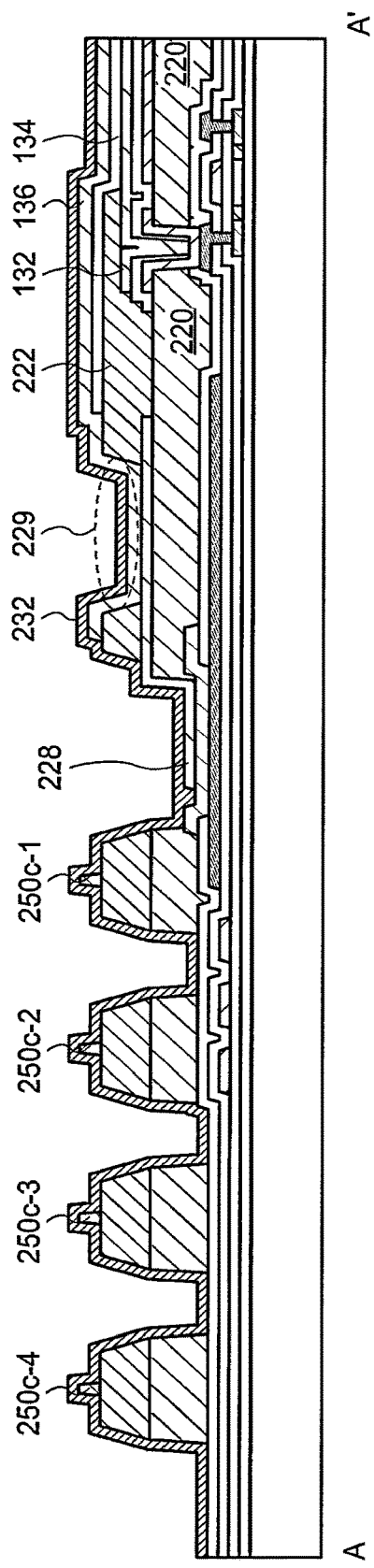
FIG. 17A and FIG. 17B are each a schematic cross-sectional view for explaining a manufacturing method of a display device according to an embodiment of the present invention.

After that, the EL layer 134 is formed so as to cover the partition wall 222 and the pixel electrode 132, and then the counter electrode 136 is formed over the EL layer 134 (FIG. 17A). These items are formed with an evaporation method or a sputtering method in addition to a wet-type film-formation method such as an ink-jet method and a printing method. The counter electrode 136 is formed continuously from the display region to the peripheral region so as to not only cover the EL layer 134 but also to be connected to the second connection wiring 228 at the opening 229. With the processes described above, the display element 130 is fabricated.

4-4. Formation of Passivation Film

First, the first inorganic film 232 is formed over almost the entire surface of the substrate 102 by utilizing a CVD method or a sputtering method. With this process, not only the display element 130 but also the dams 250 are covered by the first inorganic film 232 (FIG. 17A).

Figure 17B:
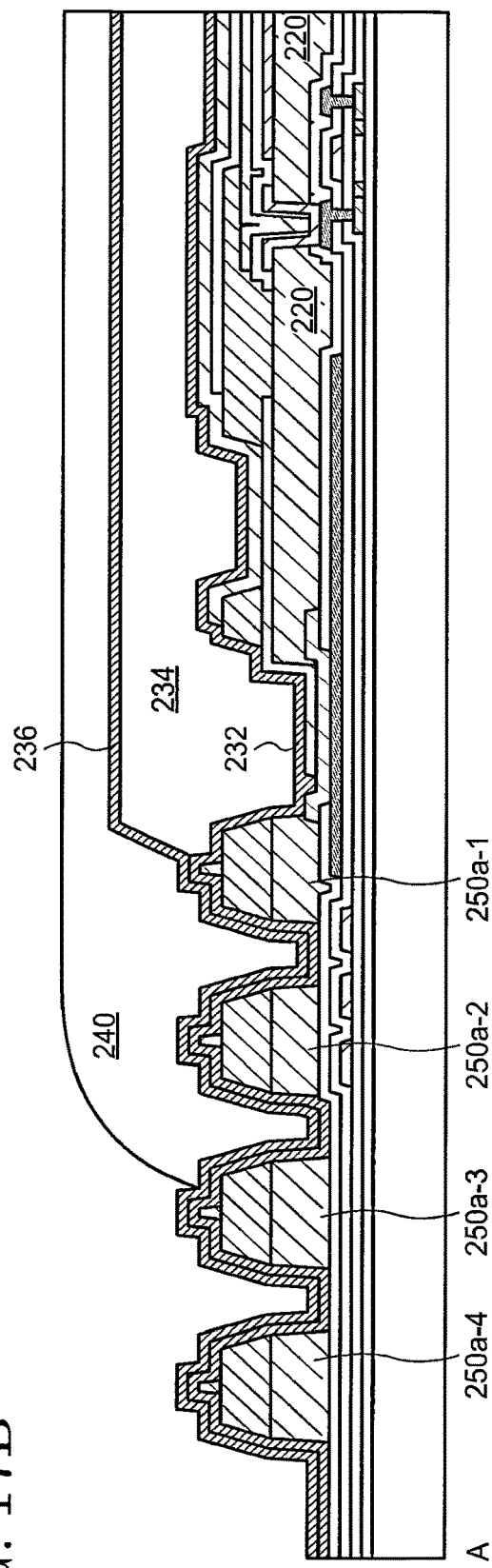

After that, the organic film 234 is formed (FIG. 17B). The organic film 234 is formed by discharging or applying the raw-material liquid providing the organic film 234 over the display region 106 with an ink-jet method or printing method, followed by removing a solvent included in the raw-material liquid and/or allowing a precursor to be reacted. If necessary, heating or photoirradiation may be conducted. When the raw-material liquid is discharged or applied, the spread of the raw-material liquid overflowing from the display region 106 is regulated by the dam effect (see FIG. 9A to FIG. 9C) of the dams 250 (e.g., the first dam 250-1 and the second dam 250-2) having the stoppers 250c. As a result, the position and the shape of the organic film 234 are precisely controlled. In the example shown here, the organic film 234 is disposed so as to overlap a part of the first dam 250-1 but not to overlap the second dam 250-2. However, the organic film 234 may be disposed so as to overlap a part of or the whole of the second dam 250-2.

After that, the second inorganic film 236 is formed over the organic film 234 and the first inorganic film 232 by utilizing a CVD method or a sputtering method (FIG. 17B). Since the second inorganic film 236 is also formed over almost the entire surface of the substrate 102, the second inorganic film 236 overlaps the first dam 250-1 to the fourth dam 250-4 and is in contact with the second inorganic film 236 over the third dam 250-3 and the fourth dam 250-4. With this structure, the organic film 234 is sealed with the first inorganic film 232 and the second inorganic film 236.

4-5. Formation of Resin Film

Next, the resin film 240 is formed (FIG. 17B). Similar to the organic film 234, the resin film 240 may also be formed by utilizing an ink-jet method or a printing method. When the raw-material liquid is discharged or applied, the spreading region of the raw-material liquid overflowing from the display region 106 is regulated by the dam effect (see FIG. 9A to FIG. 9C) of the dams 250 (e.g., the third dam 250-3 and the fourth dam 250-4) having the stoppers 250c. As a result, the position and the shape of the resin film 240 are precisely controlled. In the example shown here, the resin film 240 is disposed so as not to overlap the fourth dam 250-4 but to overlap a part of the third dam 250-3. However, the resin film 240 may be formed so as to overlap a part of or the whole of the fourth dam 250-4.

After that, the first inorganic film 232 and the second inorganic film 236 are subjected to dry-etching processing using the resin film 240 as a mask to partly remove the first inorganic film 232 and the second inorganic film 236 (FIG. 6). At this time, not only are a part of the third dam 250-3 and the fourth dam 250-4 exposed, but also the first inorganic film 232 and the second inorganic film 236 formed over the terminal 112 are removed (see FIG. 13). With this process, the wiring 122 or the protecting conductive film 1224 having conductivity is exposed, which enables the electrical connection with the connector 116. With the processes described above, the display device 100 is manufactured.

As described above, implementation of the manufacturing method according to the present embodiment enables production of a display device with the precisely controlled positions and shapes of the passivation film 230 and the resin film 240. Hence, a display device with high reliability can be produced by the manufacturing method according to the present embodiment.

Second Embodiment

In the present embodiment, a display device 330 according to an embodiment of the present invention and a manufacturing method thereof are described. An explanation of the structures the same as or similar to those of the First Embodiment may be omitted.

1. Outline Structure

Figure 18:
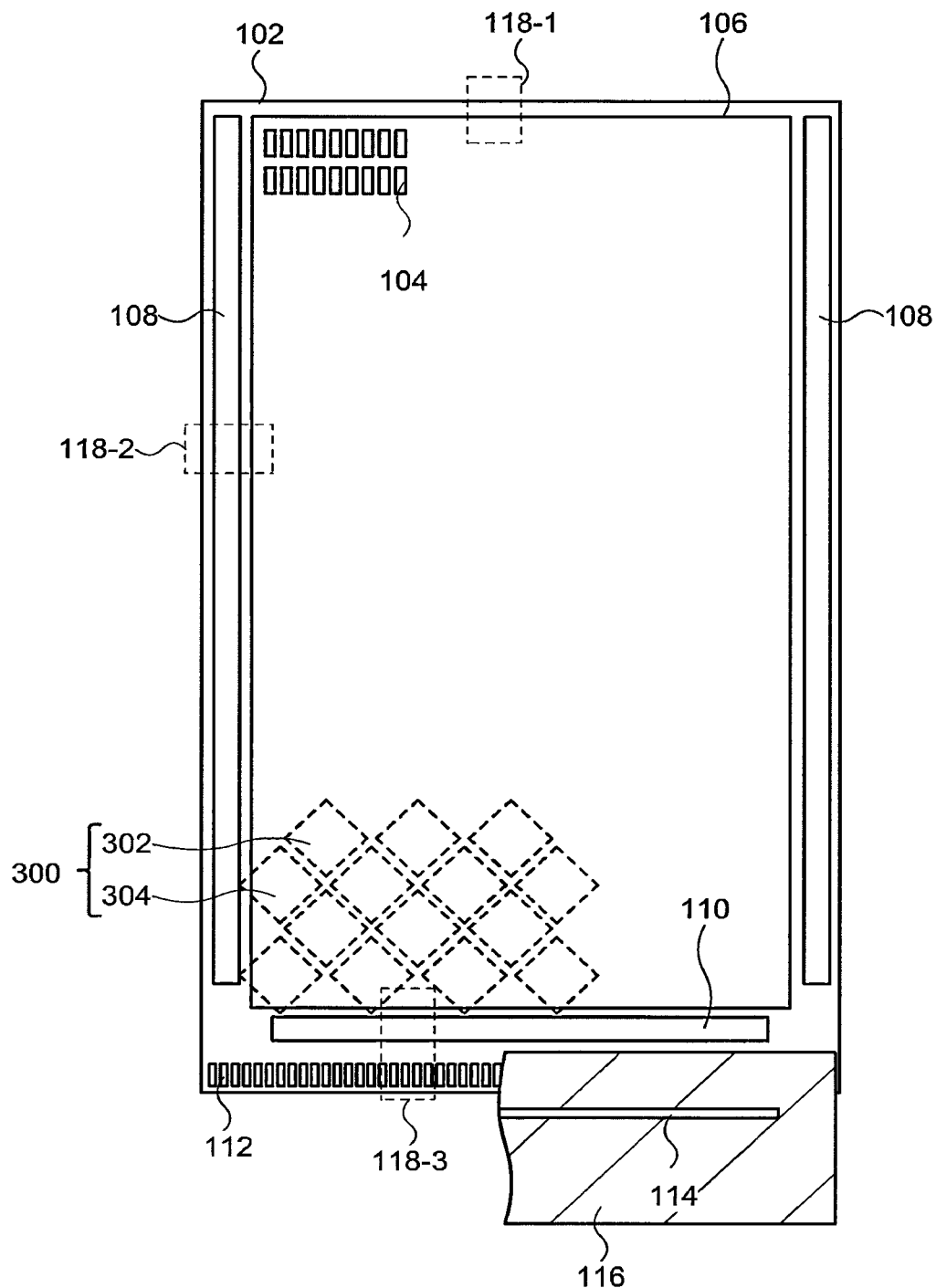
FIG. 18 is a schematic top view of a display device according to an embodiment of the present invention.

A difference of the display device 330 from the display device 100 according to the First Embodiment is that a touch sensor 300 is disposed over the display region 106 so as to overlap the display element 130 in the former device. Specifically, a plurality of first touch electrodes 302 arranged in a stripe form in a column direction and a plurality of second touch electrodes 304 arranged in a stripe form in a line direction and intersecting the first touch electrodes 302 are arranged over the display region 106 as shown in FIG. 18. One of the first touch electrodes 302 and the second touch electrodes 304 is called a transmitting electrode (Tx), while the other is called a receiving electrode (Rx). The first touch electrodes 302 and the second touch electrodes 304 each have a plurality of regions (diamond electrodes) having a substantially rectangular shape. In the first touch electrode 302 or the second touch electrode 304, the adjacent diamond electrodes are electrically connected with a bridge electrode (described below). The first touch electrode 302 and the second touch electrode 304 are spaced away and electrically independent from each other through an insulating film (capacitor insulating film 306) which is not illustrated in FIG. 18, and a capacitance is formed therebetween. When a finger of a person or the like touches the display region 106 through the first touch electrodes 302 and the second touch electrodes 304 (hereinafter, this operation is called a touch), the capacitance varies. The position of the touch can be determined by reading this variation. Thus, a so-called projective electrostatic capacitive-type touch sensor is formed by the first touch electrodes 302 and the second touch electrodes 304.

Each diamond electrode may include a conductive oxide transmitting visible light, such as ITO and IZO, or may be a metal film with a mesh form. In the latter case, the diamond electrode is preferably configured so that an opening portion of the mesh overlaps the pixels 104.

2. Cross-Sectional Structure

Figure 19:
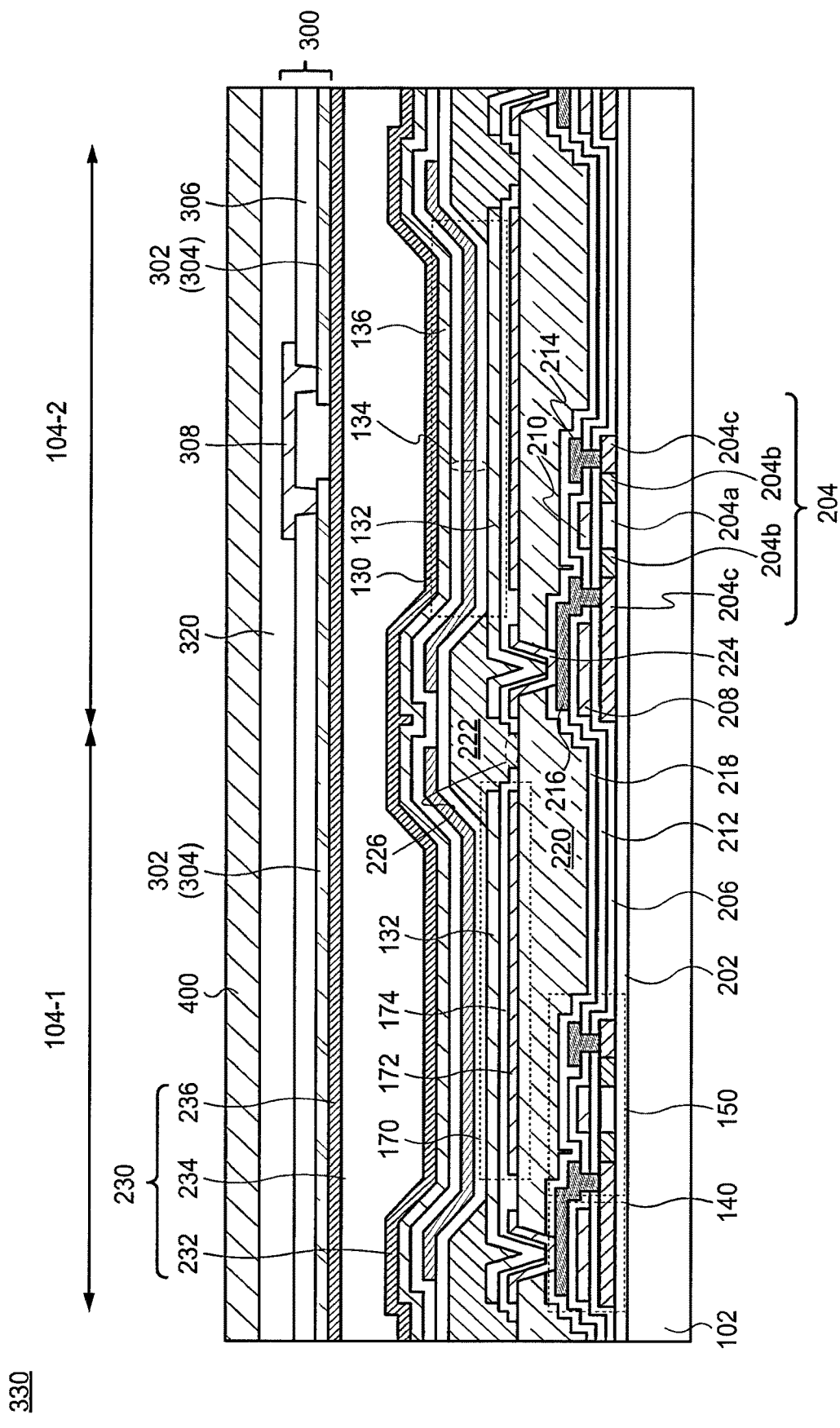
FIG. 19 is a schematic cross-sectional view of a display device according to an embodiment of the present invention.

A schematic cross-sectional view of two adjacent pixels 104 is shown in FIG. 19. FIG. 19 corresponds to FIG. 3. The touch sensor 300 is disposed over the passivation film 230. Specifically, the first touch electrode 302 and the second touch electrode 304 are arranged over the second insulating film 236 through an insulating film which is not illustrated. The capacitor insulating film 306 is formed over the first touch electrode 302 and the second touch electrode 304, and the bridge electrodes 308 are formed so as to overlap an opening formed in the capacitor insulating film 306. The adjacent diamond electrodes are electrically connected with the bridge electrodes 308. The first touch electrode 302, the second touch electrode 304, and the capacitor insulating film 306 provide a fundamental structure of the touch sensor 300. Although not illustrated, the second touch electrode 304 may be formed over the first touch electrode 302 with the capacitor insulating film 306 sandwiched therebetween. In this case, the first touch electrode 302 and the second touch electrode 304 exist in different layers from each other.

A protection insulating film 320 is formed over the touch sensor 300, over which a polarizing plate 400 may be arranged directly or through an insulating film which is not illustrated. Although not illustrated, a protection insulating film and a counter substrate may be further arranged over the polarizing plate 400.

3. Peripheral Region

3-1. Structure

Figure 20:
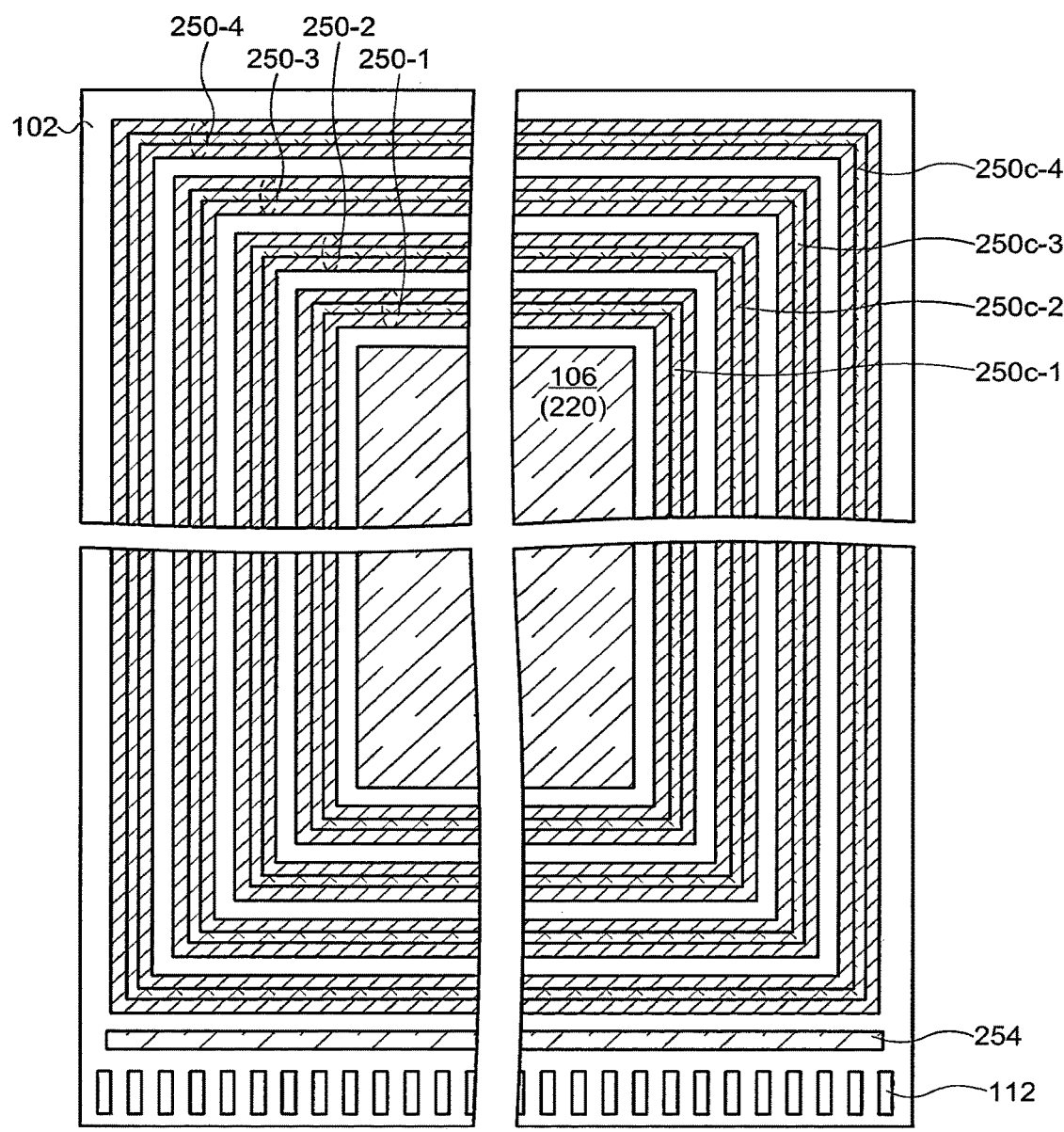
FIG. 20 is a schematic top view of a display device according to an embodiment of the present invention.

FIG. 20 shows a schematic top view of the structures of four corners of the display device 330. In this figure, the components such as the display elements 130, the passivation film 230, the touch sensor 300, and the polarizing plate 400 are omitted. Similar to the display device 100, the display device 330 also has at least one dam 250 having the stopper 250c so as to surround the display region 106. The display device 330 further has a supplemental dam 254 between the dams 250 and the terminals 112. The supplemental dam 254 according to the present embodiment is selectively formed in the region between the display region 106 and the terminals 112. However, the supplemental dam 254 may be formed so as to surround the display region 106 and the dams 250.

3-2. Upper Peripheral Region

Figure 21:
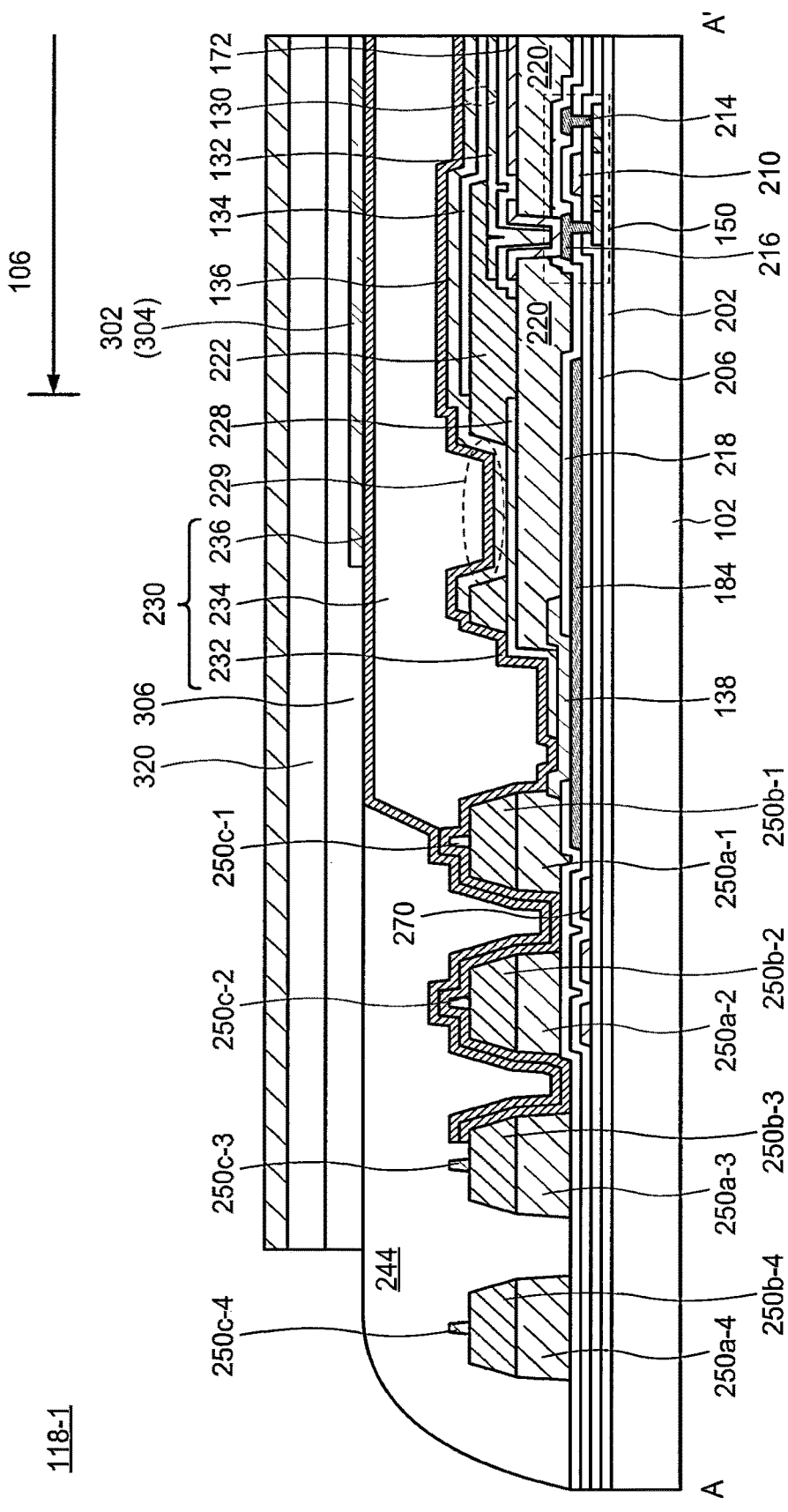
FIG. 21 is a schematic cross-sectional view of a display device according to an embodiment of the present invention.

A schematic cross-sectional view of the region 118-1 (see FIG. 18) is shown in FIG. 21. FIG. 21 corresponds to FIG. 6. As demonstrated in FIG. 21, the display device 330 has a buffer insulating film (also called embedding-insulating film) 244. The buffer insulating film 244 covers the dams 250 as well as the first inorganic film 232 and the second inorganic film 236 covering the dams 250. With this structure, the stoppers 250c are embedded in the buffer insulating film 244, and the buffer insulating film 244 absorbs the depressions and projections caused by the dams 250 and provides a flat upper surface and a gently inclined surface. However, the first inorganic film 232 and the second inorganic film 236 are located and confined in the region overlapping the buffer insulating film 244.

The buffer insulating film 244 is disposed so as not to overlap the pixels 104 over the display region 106. Thus, the second inorganic film 236 is exposed from the buffer insulating film 244 in the display region 106. The buffer insulating film 244 is preferably prepared so that the upper surface matches the upper surface of the second inorganic film 236 exposed from the buffer insulating film 244. That is, it is preferred to form the buffer insulating film 244 so that a large step is not formed between the upper surface of the buffer insulating film 244 and the upper surface of the second inorganic film 236 exposed from the buffer insulating film 244. The buffer insulating film 244 may include an epoxy resin, an acrylic resin, a polycarbonate resin, a polyimide resin, a polyolefin resin or the like and may be prepared by applying an ink-jet method, a printing method or the like.

In the example shown in FIG. 21, the buffer insulating film 244 extends to the edge portion of the substrate 102, and an edge portion thereof matches the edge portion of the substrate 102. However, the buffer insulating film 244 may be configured so that a part of the substrate 102, a part of the undercoat 202, a part of the gate insulating film 206, a part of the first interlayer film 212, or a part of the second interlayer film 218 is exposed from the buffer insulating film 244.

3-3. Peripheral Region of Lateral Side

Figure 22:
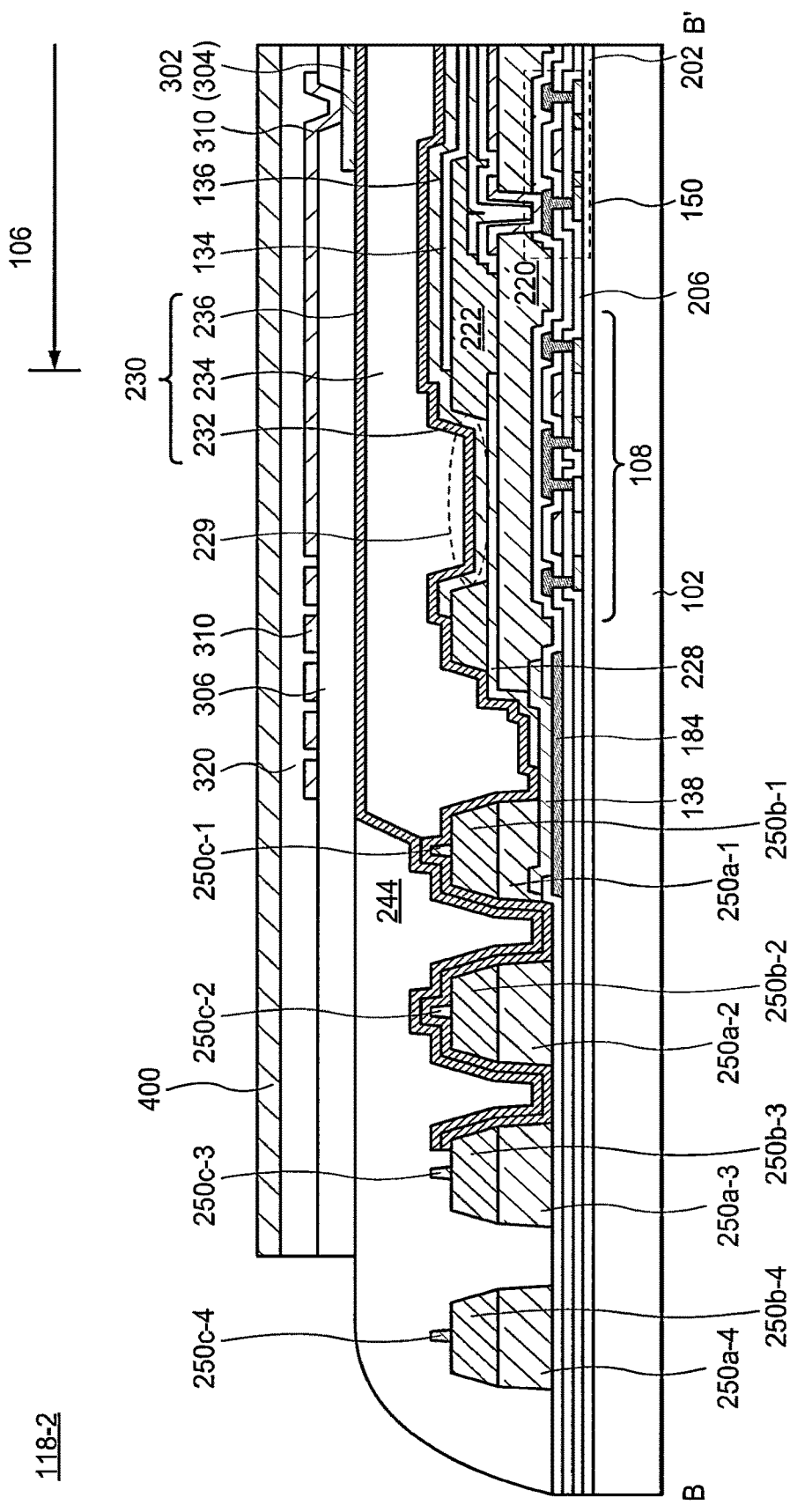
FIG. 22 is a schematic cross-sectional view of a display device according to an embodiment of the present invention.

A schematic cross-sectional view of the region 118-2 (see FIG. 18) including a part of the lateral side of the display device 330 is shown in FIG. 22. FIG. 22 corresponds to FIG. 11. Hereinafter, an explanation of the structures the same as or similar to those of the region 118-1 may be omitted.

Similar to the region 118-1, the dams 250 and the buffer insulating film 244 covering the first inorganic film 232 and the second inorganic film 236 which cover the dams 250 are disposed in the peripheral region as shown in FIG. 22. A lead wiring 310 is connected to the first touch electrode 302 or the second touch electrode 304. The lead wiring 310 extends to the peripheral region and further extends to the terminal 112.

3-4. Lower Peripheral Region

Figure 23:
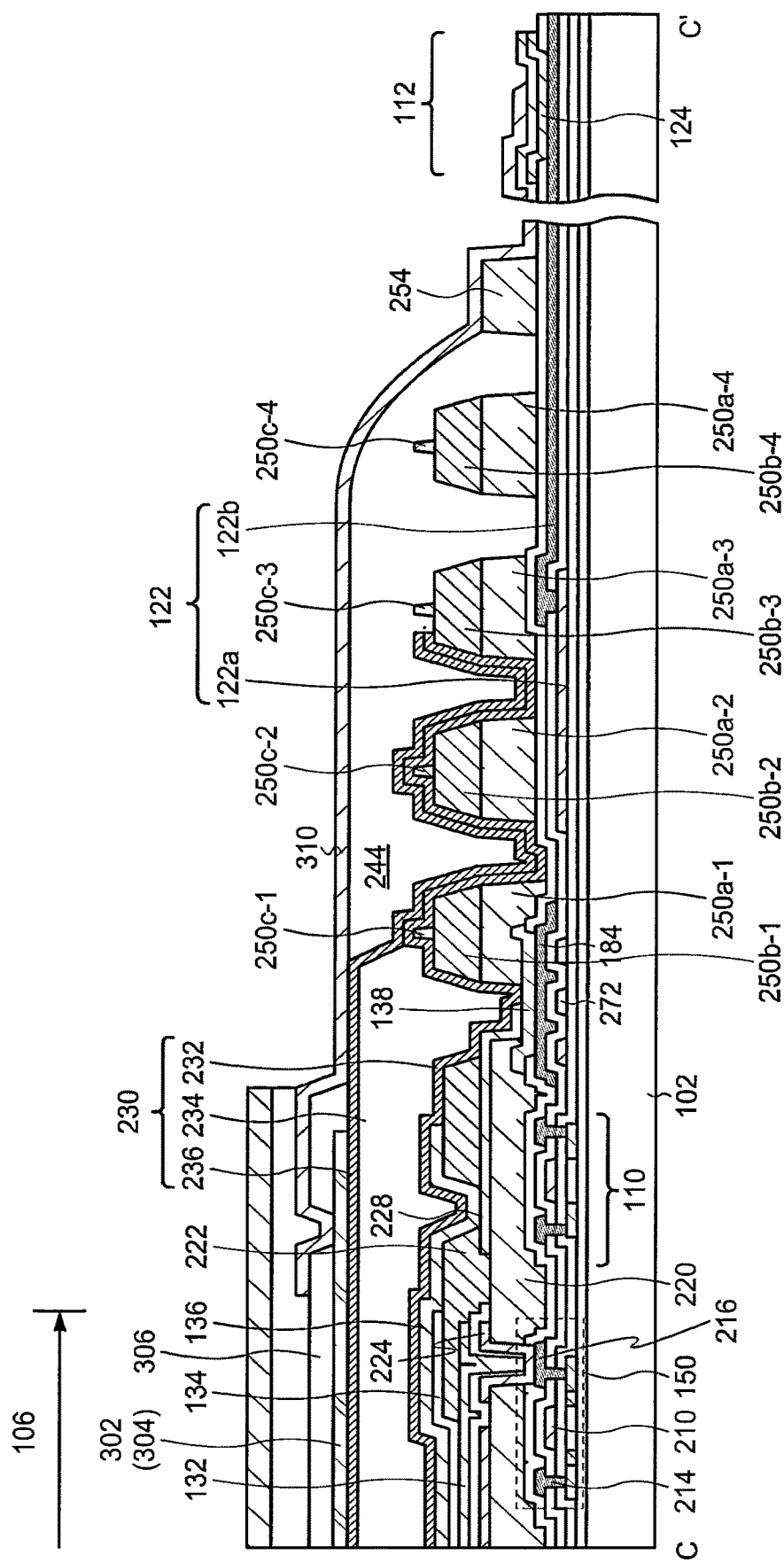
FIG. 23 is a schematic cross-sectional view of a display device according to an embodiment of the present invention.

A schematic cross-sectional view of the region 118-3 (see FIG. 18) located on the side of the terminals 112 of the display region 106 is shown in FIG. 23. FIG. 23 corresponds to FIG. 13. In the following explanation, an explanation of the structures the same as or similar to those of the region 118-1 or 118-2 may also be omitted.

As described above, the supplementary dam 254 is formed between the edge portion of the substrate 102 and the dams 250 in the region 118-3. The supplementary dam 254 is arranged so that the dams 250 are sandwiched by the leveling film 220 and the supplementary dam 254. The supplementary dam 254 includes the material included in at least one of the leveling film 220 and the partition wall 222. As described below, the supplementary dam 254 may be simultaneously formed with the leveling film 220 or the partition wall 222. In the former case, the supplementary dam 254 includes an organic compound included in the leveling film 220 and the first layers 250a and may have the same composition as these items. In the latter case, the supplementary dam 254 includes an organic compound included in the partition wall 222 and may have the same composition as this item.

As illustrated in FIG. 23, the supplementary dam 254 may be configured to have a height smaller than the dams 250. In addition, the supplementary dam 254 does not always need to have the stopper 250c. However, although not illustrated, the supplementary dam 254 may have the two-layer structure similar to the dams 250. In this case, the supplementary dam 254 may have the same structure and the same height as the bases of the dams 250.

Similar to the regions 118-1 and 118-2, the buffer insulating film 244 is disposed in the peripheral region so as to cover the dams 250 as well as the first inorganic film 232 and the second inorganic film 236 covering the dams 250. As shown in FIG. 23, the buffer insulating film 244 is in contact with at least one of a side surface and a ridge between the side surface and a top surface, and the top surface of the supplementary dam 254. The buffer insulating film 244 may overlap a part of the supplementary dam 254. The lead wiring 310 connected to the first touch electrode 302 or the second touch electrode 304 extends from the touch sensor 300 on the second inorganic film 236 and the buffer insulating film 244. The lead wiring 310 may be in contact with the second inorganic film 236 and the buffer insulating film 244. The lead wiring 310 is electrically connected to the terminal 112 by which signals for detecting a touch can be supplied to the first touch electrode 302 and the second touch electrode 304 from an external circuit which is not illustrated.

As described above, the stoppers 250c may be formed so as to include a 0-valent metal. Thus, when the stopper 250c makes contact with the lead wiring 310, the adjacent lead wirings 310 are electrically connected by the stopper 250c, which inhibits the signals for detecting a touch to be independently supplied to the first touch electrode 302 and the second touch electrode 304. However, the buffer insulating film 244 is disposed so as to overlap the dams 250, and the stoppers 250c are covered by the buffer insulating film 244. Therefore, the stoppers 250c are insulated from the lead wiring 310, which prevents a short circuit between the stoppers 250c and the lead wiring 310. In addition, the buffer insulating film 244 absorbs depressions and projections caused by the dams 250 to provide a flat top surface and a gently steeped top surface. Since the lead wiring 310 is formed along these top surfaces, disconnection of the lead wiring 310 can be avoided.

Similar to the display device 100, the organic film 234 may be formed with an ink-jet method or a printing method in the display device 330, and the spread of the raw-material liquid can be controlled with the dams (e.g., the first dam 250-1 and the second dam 250-2). Thus, it is possible to selectively form the organic film 234 within the first dam 250-1 or the second dam 250-2. Accordingly, the organic film 234 can be sealed with the first inorganic film 232 and the second inorganic film 236, and the passivation film 230 including these films can be arranged to adequately cover the display region 106. Hence, the display device 330 exhibits high reliability.

Similarly, the buffer insulating film 244 can also be formed with an ink-jet method or a printing method, and the spread of the raw-material liquid can be controlled with the supplementary dam 254. Hence, the buffer insulating film 244 can be selectively formed within the supplementary dam 254, and the stoppers 250c can be covered with the buffer insulating film 244. As a result, it is possible to effectively prevent disconnection of the lead wiring 310 and conduction between the stoppers 250c and the lead wiring 310.

4. Manufacturing Method

A manufacturing method of the display device 330 is explained using FIG. 24A to FIG. 27B. These figures correspond to FIG. 23.

Figure 24A:
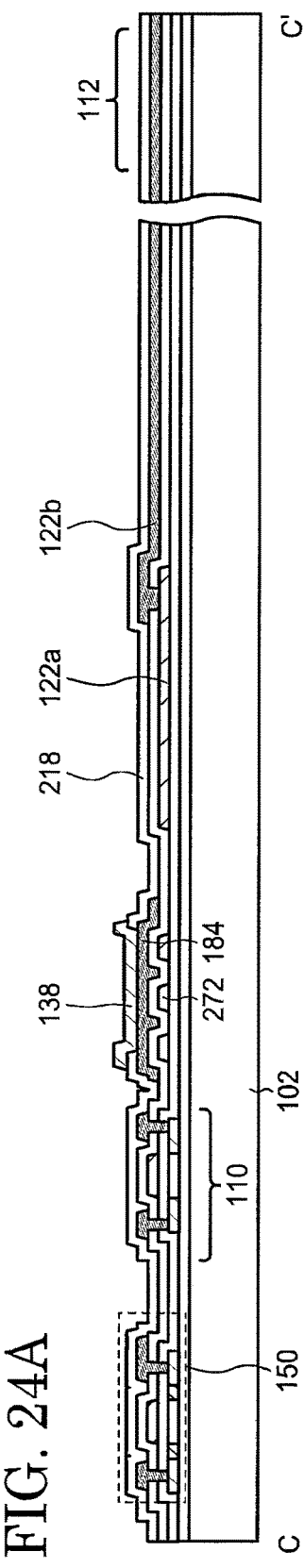
FIG. 24A to FIG. 24C are each a schematic cross-sectional view for explaining a manufacturing method of a display device according to an embodiment of the present invention.

A structure is shown in FIG. 24A in which the driving transistor 150, the wiring 272, the wiring 122, the signal-line driver circuit 110, the second interlayer film 218, and the first connection wiring 138 have been formed. Since this structure can be prepared by the known method or the method described in the First Embodiment, its explanation is omitted.

4-1. Formation of Leveling Film, First Layer, and Supplemental Dam

Figure 24B:
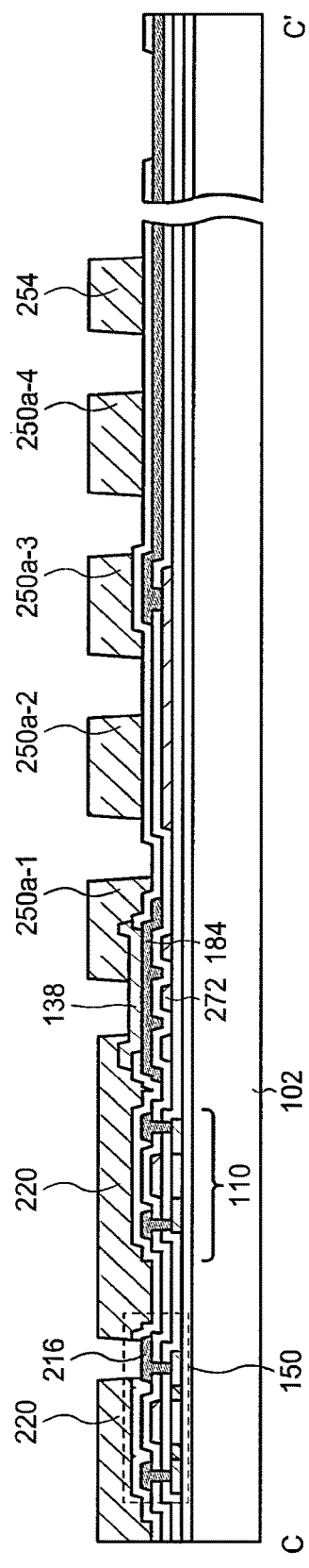
Figure 24C:
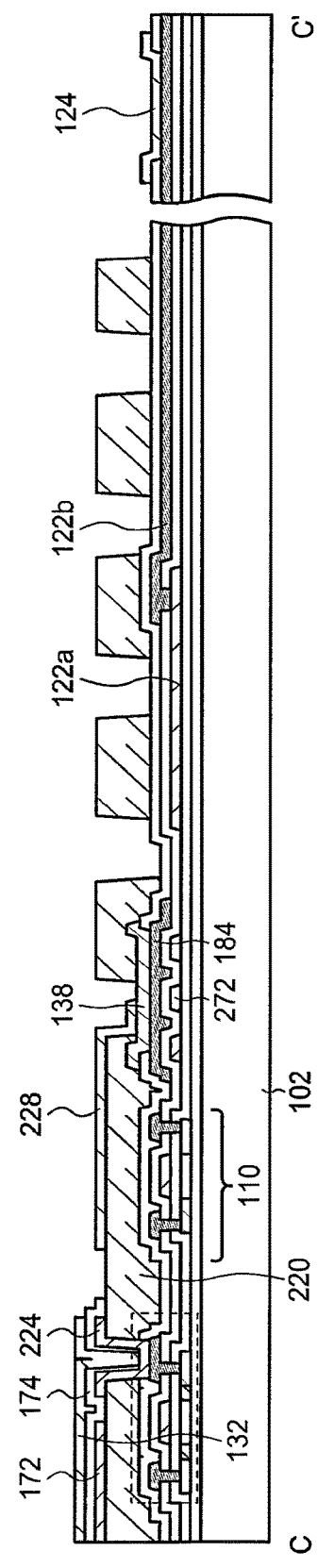

The leveling film 220, the first layers 250a of the dams 250, and the supplementary dam 254 are simultaneously formed over the second interlayer film 218. Next, as described in the First Embodiment, the second interlayer film 218 is subjected to etching so that the source electrode 216 is exposed from the leveling film 220 in the opening for electrically connecting the driving transistor 150 to the display element 130 and the second interlayer film 218 is removed in the region in which the terminal 112 is to be formed (FIG. 24B). Next, the supplementary capacitor electrode 172, the third interlayer film 174, the pixel electrode 132, and the second connection wiring 228 are formed (FIG. 24C). These electrodes and films may be each formed by applying the same method as that described in the First Embodiment. Although not illustrated, it is not necessary to form the supplementary dam 254 when the leveling film 220 and the first layers 250a are formed if the supplementary dam 254 is simultaneously formed with the partition wall 222.

After that, the partition wall 222 and the second layers 250b of the dams 250 are formed so as to cover the edge portion of the pixel electrode 132 and the first layers 250a of the dams 250, and then the opening 229 is formed (FIG. 25A). In the case where the supplementary dam 254 is not formed during the formation of the leveling film 220 and the first layers 250a, the supplementary dam 254 is formed at the time when the partition wall 222 is formed. After that, the stoppers 250c are formed by applying the same method as that of the First Embodiment (FIG. 25B).

4-2. Formation of Display Element and Passivation Film

After that, the EL layer 134 is formed so as to cover the partition wall 222 and the pixel electrode 132, and then the counter electrode 136 is formed over the EL layer 134. Furthermore, the first inorganic film 232 is formed over the counter electrode 136. The first inorganic film 232 is also formed over the terminal 112 (FIG. 25B).

After that, the organic film 234 is formed, and then the second inorganic film 236 is formed so as to cover the organic film 234. The second inorganic film 236 is also formed over the terminal 112 (FIG. 26A). The passivation film 230 is formed with this process. The EL layer 134, the counter electrode 136, and the passivation film 230 may be formed with the same method as that of the First Embodiment. The spreading region of the raw-material liquid providing the organic film 234 is defined by the dam 250 (e.g., the first dam 250-1 or the second dam 250-2) having the stopper 250c, which enables precise control of the position and the shape of the organic film 234. In the example shown here, the organic film 234 is formed so as not to overlap the second dam 250-2 but to overlap a part of the first dam 250. However, the organic film 234 may be disposed so as to overlap a part of or the whole of the second dam 250-2.

Next, a resist mask 242 overlapping the display region 106, the organic film 234, and a part of the dams 250 is formed (FIG. 26B). Specifically, a film of a photosensitive resin is formed by discharging or applying a solution or a suspension of the photosensitive resin over the display region 106 and the peripheral region with an ink-jet method or a printing method so as to cover the organic film 234 and then evaporatively removing the solvent. After that, light exposure through a photomask and development are carried out to form the resist mask 242. At this time, the spreading region of the solution or suspension of the photosensitive resin is defined by the dam 250 (e.g., the third dam 250-3 or the fourth dam 250-4) having the stopper 250c, by which the position and the shape of the resist mask 242 can be precisely controlled. In the example shown here, the resist mask 242 is formed so as to overlap the first dam 250-1, the second dam 250-2, and a part of the third dam 250-3. However, the resist mask 242 may be prepared so as to overlap a part of or the whole of the fourth dam 250-4.

After that, dry-etching processing is performed on the first inorganic film 232 and the second inorganic film 236 using the resist mask 242 as a mask to partly remove the first inorganic film 232 and the second inorganic film 236 (FIG. 27). At this time, the first inorganic film 232 and the second inorganic film 236 formed over the terminal 112 are also removed. With this process, the wiring 122 or the protecting conductive film 124 is exposed, enabling electrical connection with the connector 116. After that, the resist mask 242 is removed with ashing or the like.

After that, the buffer insulating film 244 is formed (FIG. 27B). The buffer insulating film 244 is formed by discharging or applying the raw-material liquid providing the buffer insulating film 244 over the peripheral region with an ink-jet method or a printing method and then evaporatively removing the solvent included in the raw-material liquid. If necessary, heating or light irradiation may be conducted. The spreading region of the raw-material liquid is limited by the supplementary dam 254, by which the position and the shape of the buffer insulating film 244 can be precisely controlled. The formation of the supplementary dam 254 prevents the buffer insulating film 244 from being formed between the supplementary dam 254 and the terminal 112. When the substrate 102 is bent between the supplementary dam 254 and the terminal 112, it is possible to arrange the terminal 112 and the connector 116 connected thereto so as to overlap the substrate 102. With this arrangement, the display device 330 can be accommodated in a small-size housing, which allows production of an electronic device with high designability. At this time, if the buffer insulating film 244 is located in the bent region, it is difficult to bend the display device 330 and a crack may be caused in the buffer insulating film 244, which leads to a reduction of reliability. However, the formation of the supplementary dam 254 enables precise control of the position and the shape of the buffer insulating film 244, by which the factors in decreasing reliability can be excluded.

Third Embodiment

Figure 28:
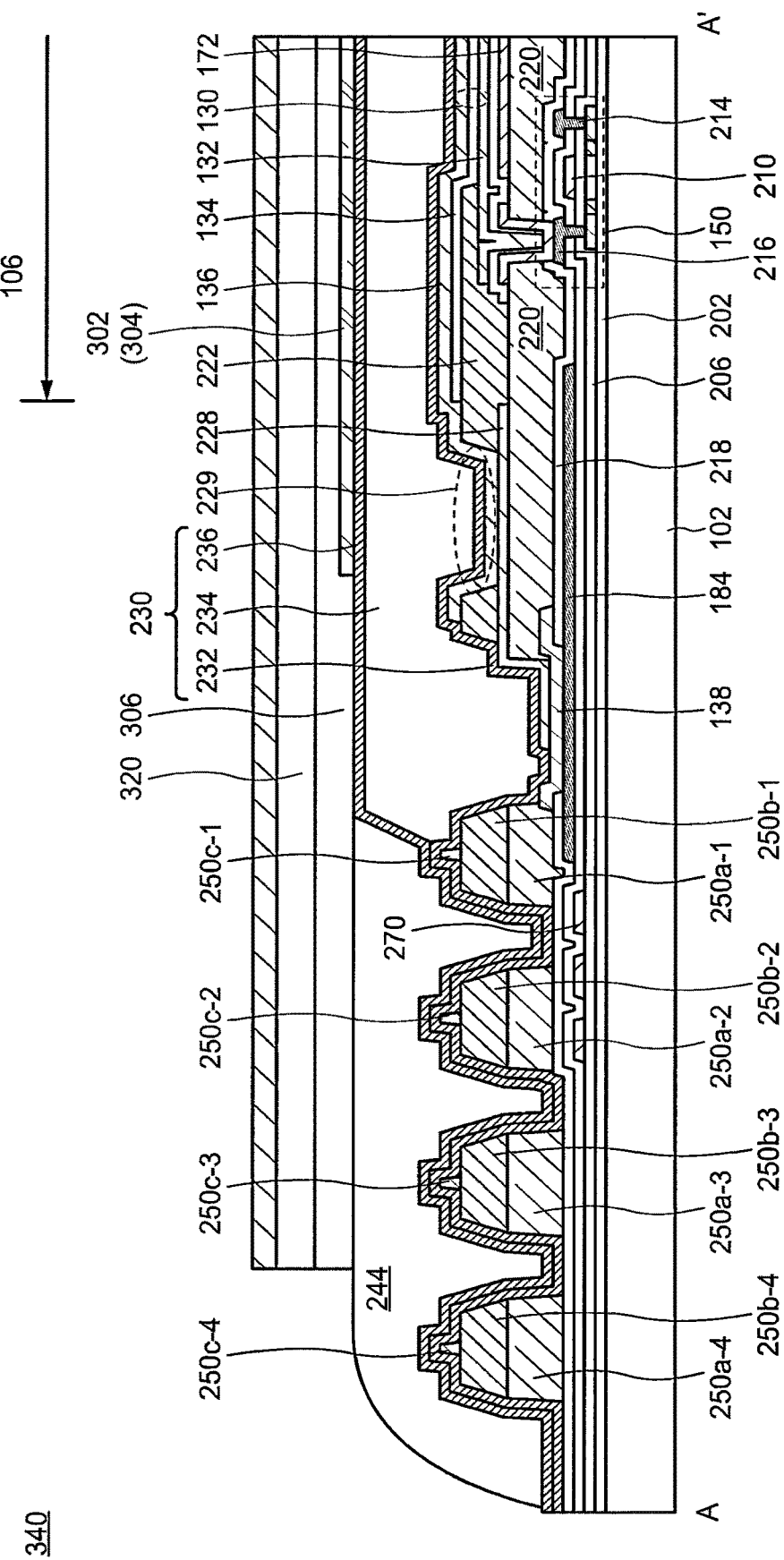
FIG. 28 is a schematic cross-sectional view of a display device according to an embodiment of the present invention.
Figure 29:
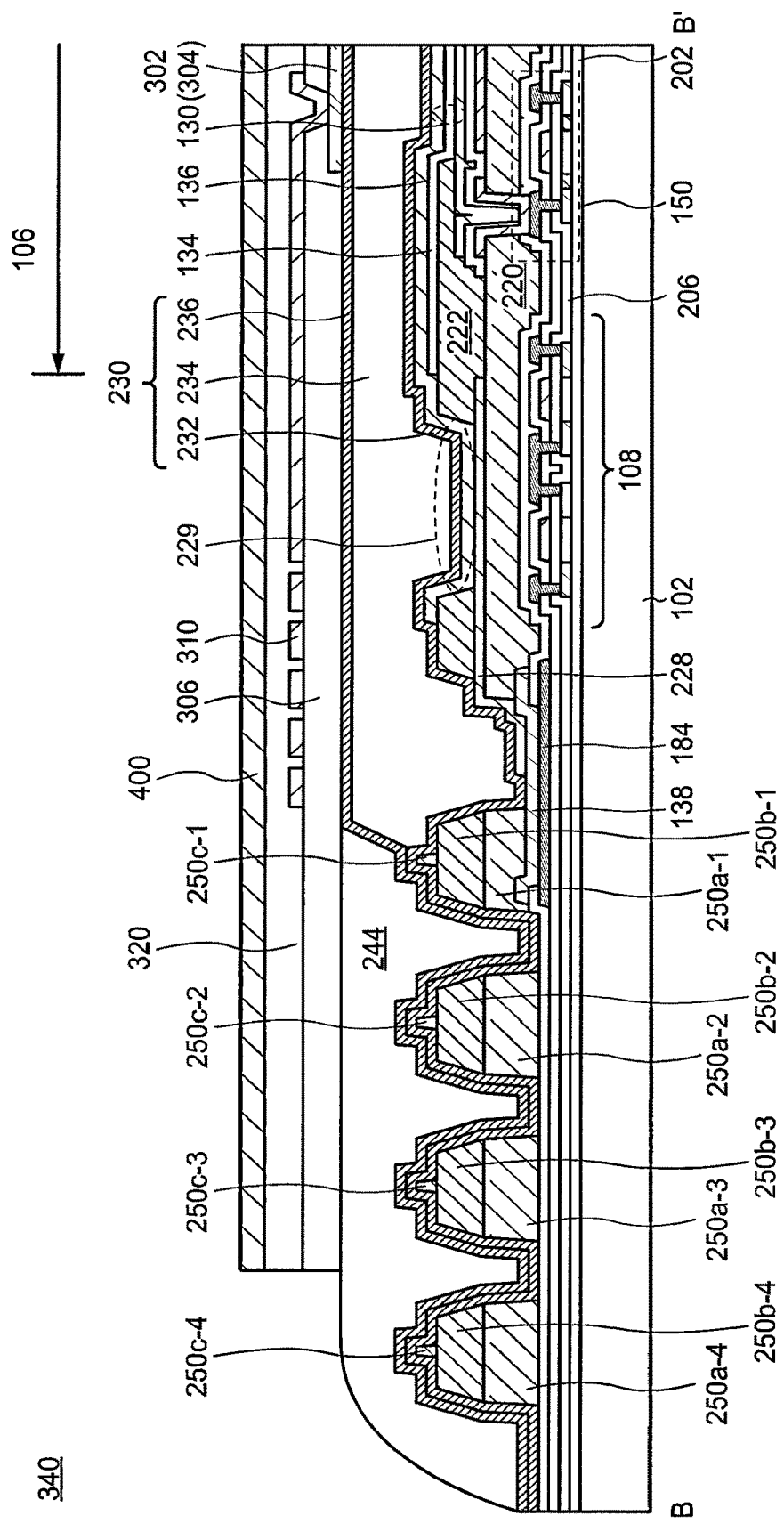
FIG. 29 is a schematic cross-sectional view of a display device according to an embodiment of the present invention.
Figure 30:
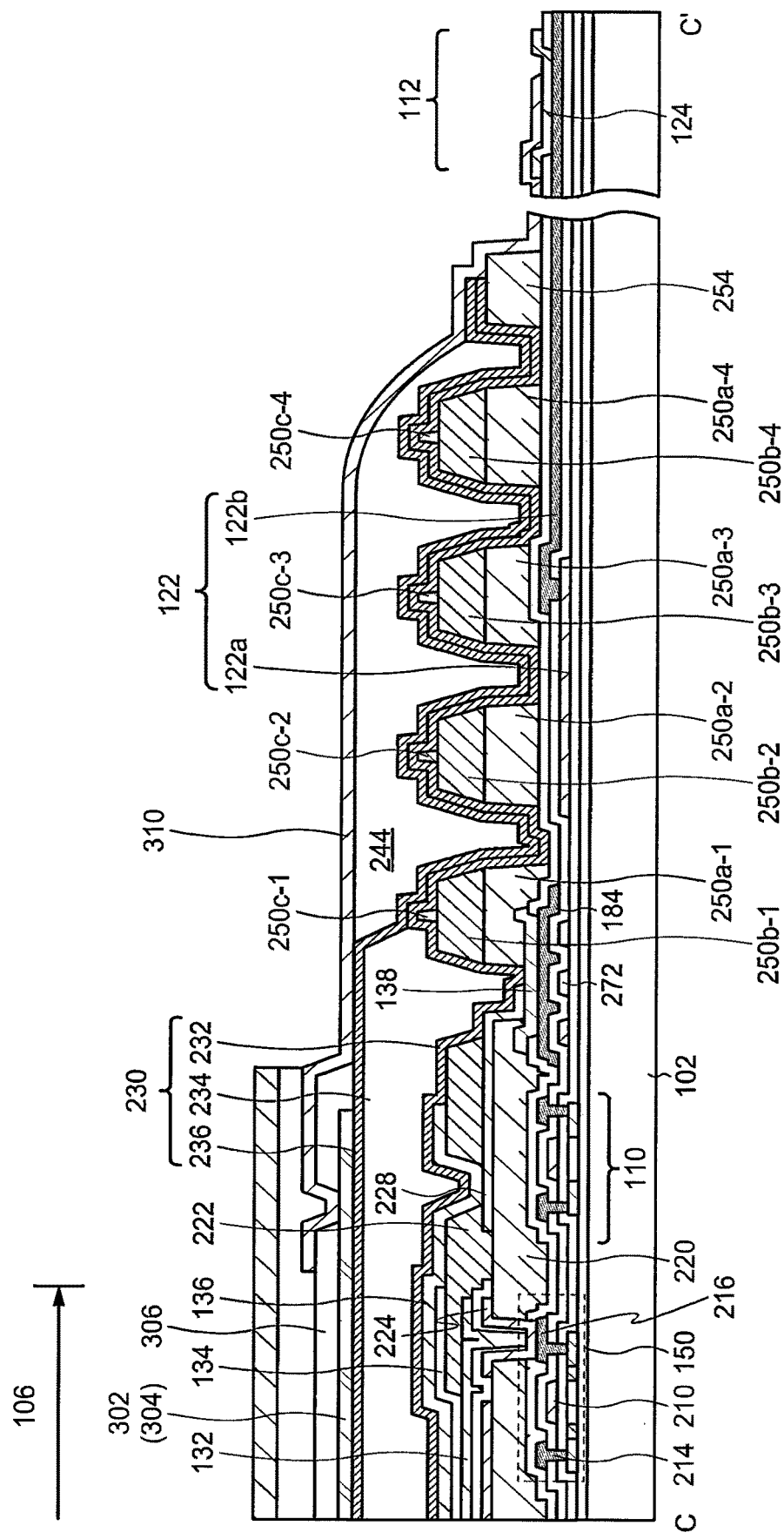
FIG. 30 is a schematic cross-sectional view of a display device according to an embodiment of the present invention.
Figure 32:
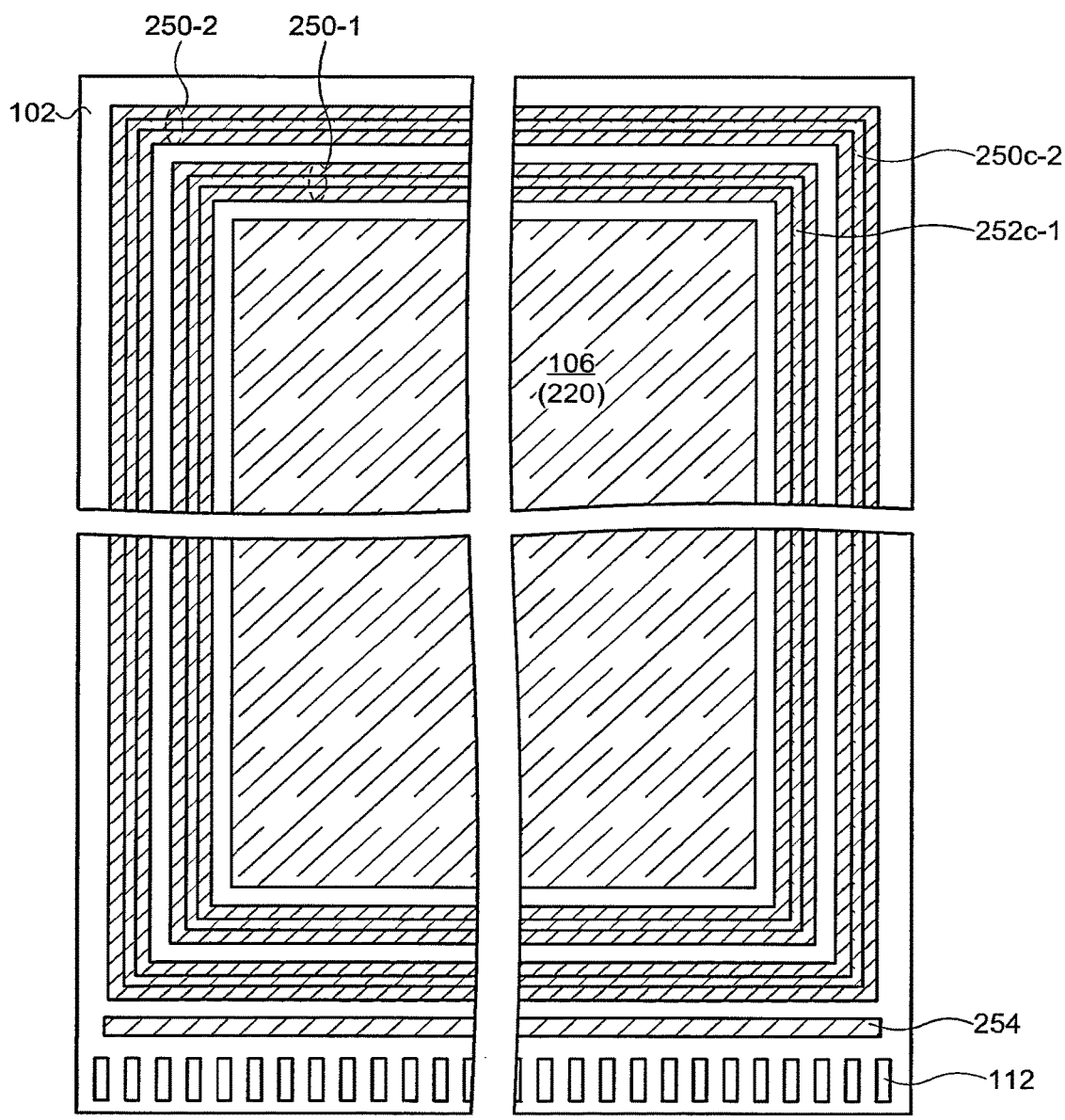
FIG. 32 is a schematic top view of a display device according to an embodiment of the present invention.
Figure 33:
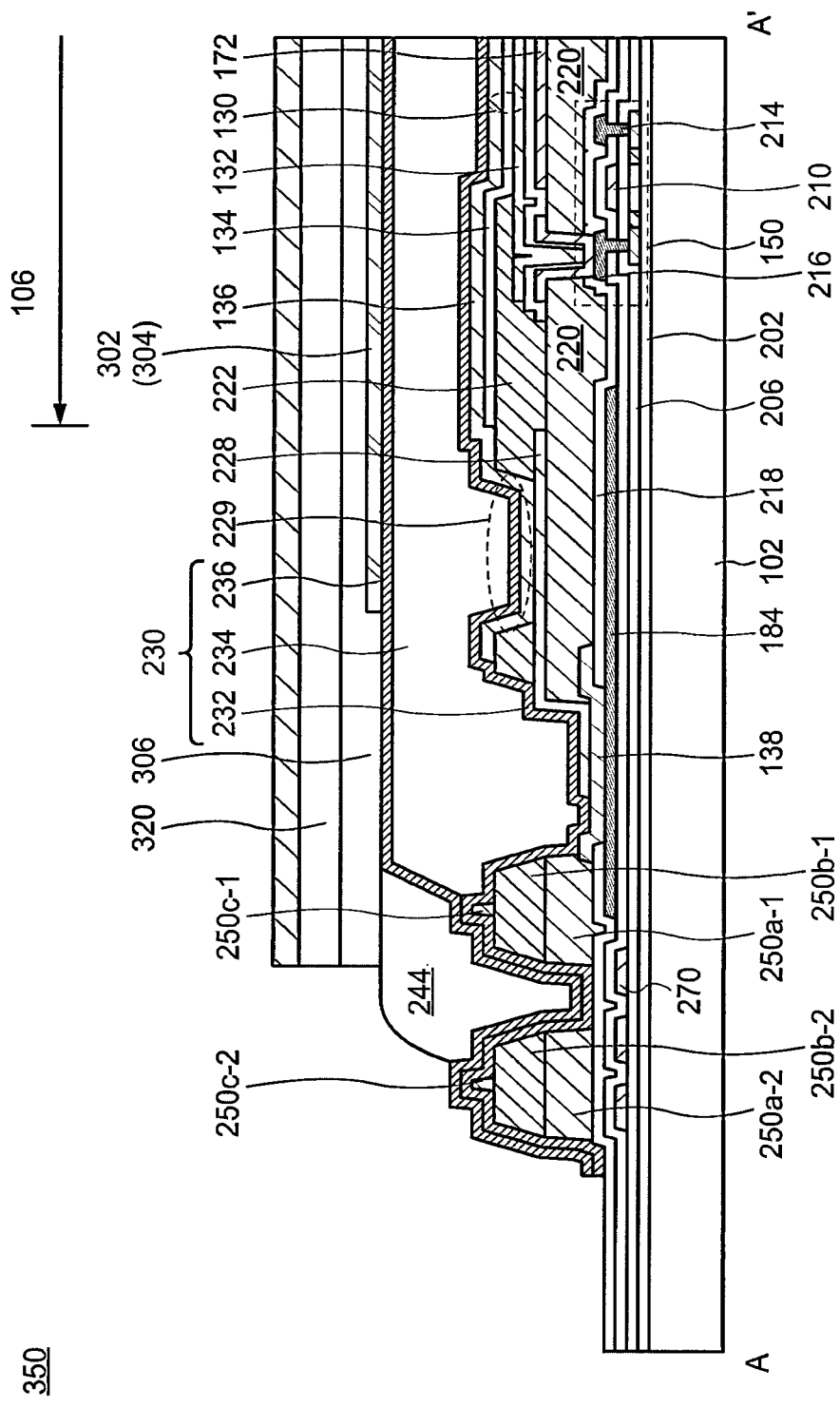
FIG. 33 is a schematic cross-sectional view of a display device according to an embodiment of the present invention.
Figure 34:
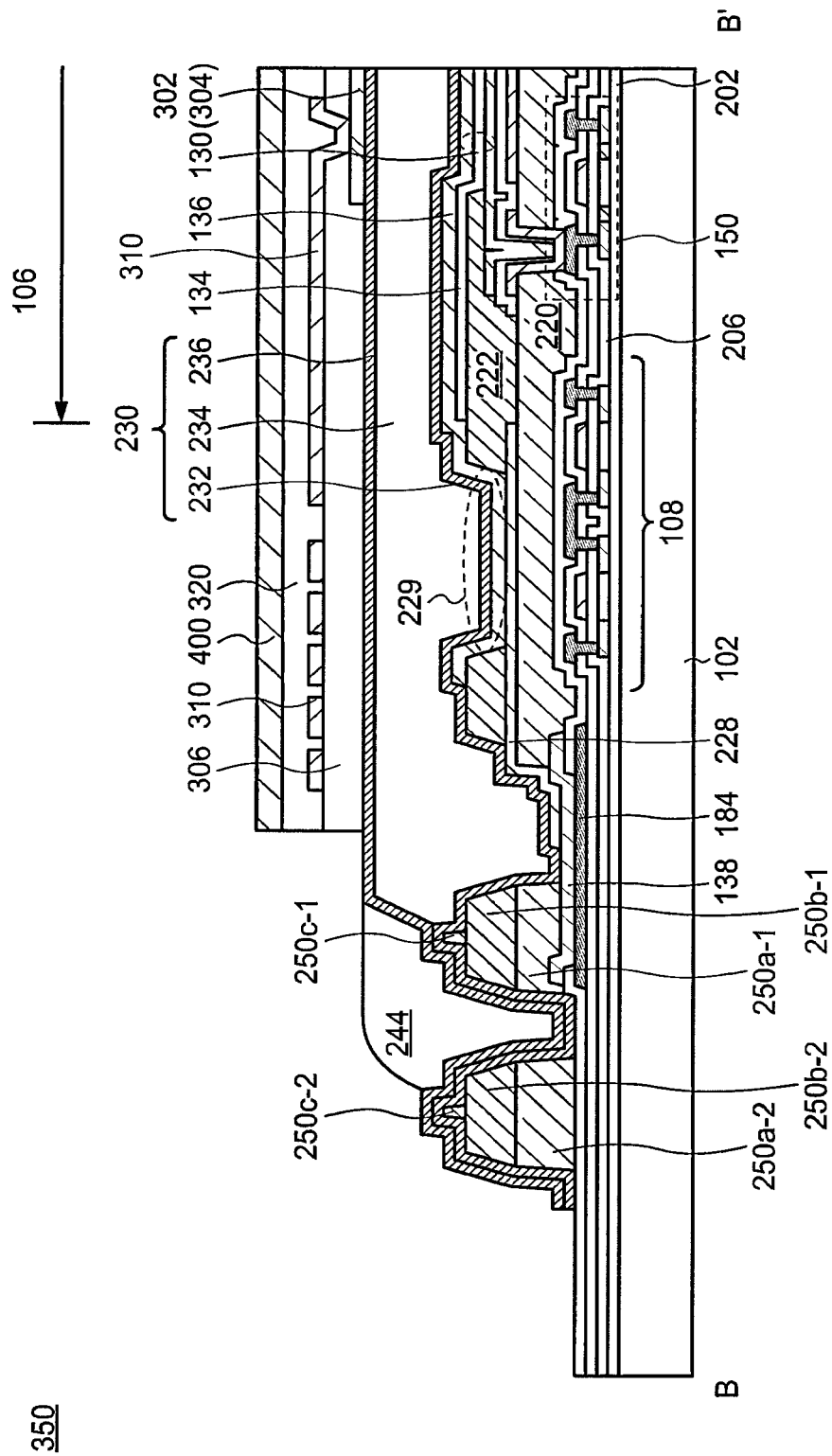
FIG. 34 is a schematic cross-sectional view of a display device according to an embodiment of the present invention.
Figure 35:
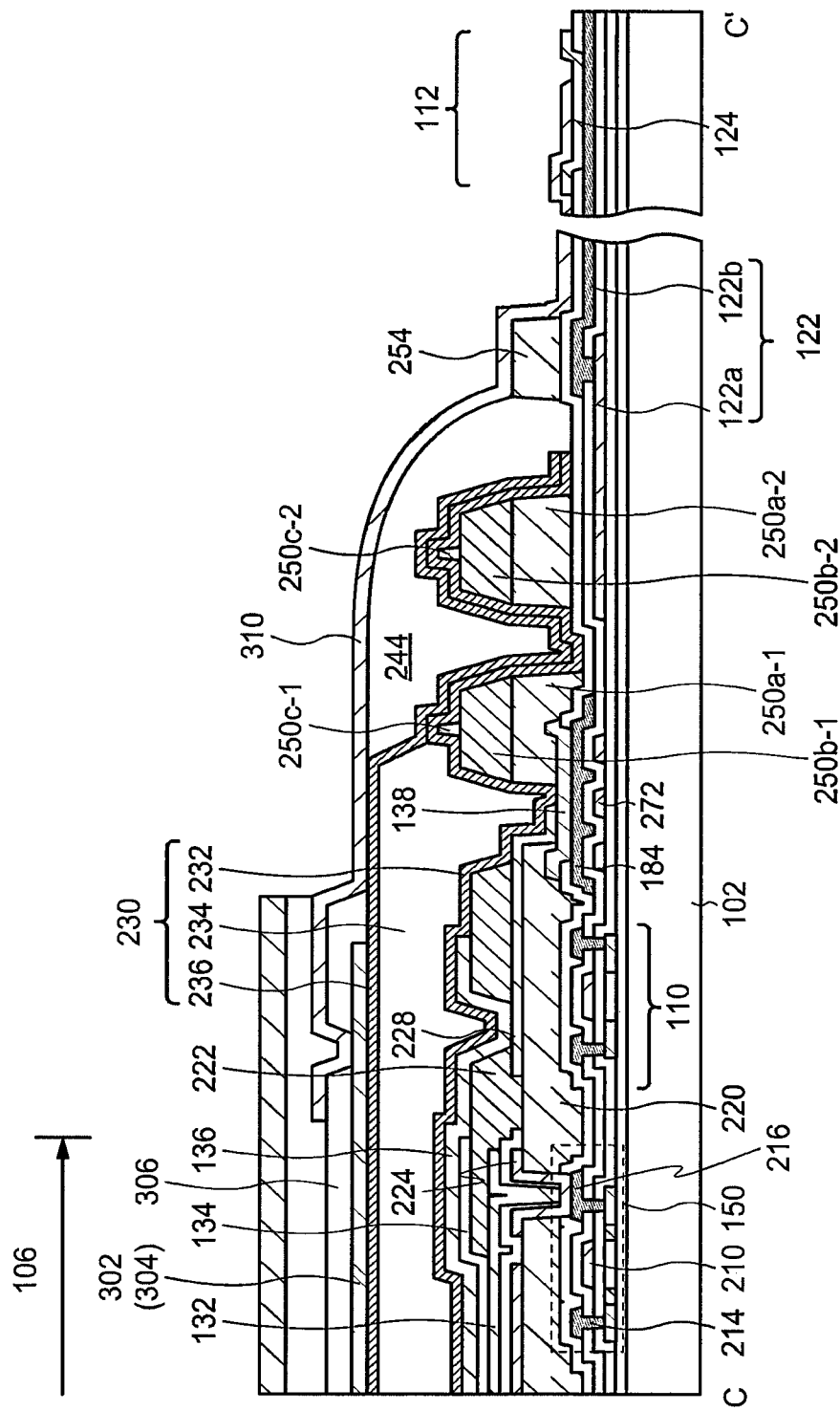
FIG. 35 is a schematic cross-sectional view of a display device according to an embodiment of the present invention.

In the present embodiment, a structure of a display device 340 according to an embodiment of the present invention and a manufacturing method thereof are described. An explanation of the structures the same as or similar to those of the First and Second Embodiments may be omitted.
1. Structure of Peripheral Region Schematic cross-sectional views of the upper peripheral region, the peripheral region of the lateral side, and the lower peripheral region of the display device 340 are respectively shown in FIG. 28, FIG. 29, and FIG. 30. These regions respectively correspond to the regions 118-1, 118-2, and 118-3 (see FIG. 1 and FIG. 18), and FIG. 28 to FIG. 30 respectively correspond to the schematic cross-sectional views (FIG. 21, FIG. 22, and FIG. 23) of the display device 330. As demonstrated in these figures, a difference of the display device 340 from the display device 330 is that the first inorganic film 232 and the second inorganic film 236 cover all of the plurality of dams 250. The first inorganic film 232 and the second inorganic film 236 may cover a part of the supplementary dam 254 (FIG. 30). It is possible to more adequately insulate the lead wiring 310 from the stoppers 250c by employing this structure.
2. Manufacturing Method A manufacturing method of the display device 340 is explained using FIG. 31A and FIG. 31B. These figures correspond to FIG. 30. Similar to the manufacture of the display device 330, the first inorganic film 232, the organic film 234, and the second inorganic film 236 of the passivation film 230 are formed over almost the entire surface of the substrate 102 so as to cover the dams 250 and the supplementary dam 254 (FIG. 31A). Up to this stage, the position and the shape of the organic film 234 is controlled with the dams 250 having the stoppers 250c.

After that, the resist mask 242 is formed. As shown in FIG. 31A, the resist mask 242 is formed so as to cover all of the dams 250 and a part of the supplementary dam 254. However, the resist mask 242 may be formed so as to cover the whole of the supplementary dam 254. The resist mask 242 may be prepared by forming a photosensitive resin over almost the entire surface of the substrate 102 so as to cover the display region 106, the dams 250 and the supplementary dam 254, followed by light exposure through a photomask and development. The light exposure is carried out so that the photosensitive resin is left over the display region 106, the dams 250, and a part of the supplementary dam 254 after development.

After that, the first inorganic film 232 and the second inorganic film 236 are dry-etched using the resist mask 242 as an etching mask. With this process, the first inorganic 232 and the second inorganic film, which are exposed from the resist mask 242, are removed. At the same time, the wiring 122 or the protecting conductive film 124 is exposed at the terminal 112 (FIG. 31B). After that, the resist mask 242 is removed with ashing or the like, and the buffer insulating film 244 is formed as described in the Second Embodiment (FIG. 31B). The buffer insulating film 244 is formed with an ink-jet method, a printing method or the like, and the position and shape thereof can be controlled with the supplementary dam 254. Since the following processes are the same as those of the Second Embodiment, an explanation is omitted.

Fourth Embodiment

In the present embodiment, a structure of a display device 350 according to an embodiment of the present invention and a manufacturing method thereof are described. An explanation of the structures the same as or similar to those of the First to Third Embodiments may be omitted.
1. Structure of Peripheral Region A difference of the display device 350 from the display device 330 is that the dam for controlling the position and shape of the resist mask 242 (e.g., the third dam 250-3 and the fourth dam 250-4 of the display device 330) is not disposed. A specific explanation is provided using FIG. 32 to FIG. 35. These figures are respectively a schematic top view of the four corners, and the schematic cross-sectional views of the upper peripheral region, the peripheral region of the lateral side, and the lower peripheral region of the display device 350 and respectively correspond to the schematic views of the top surface and cross-sections of the display device 330 (FIG. 20 to FIG. 23).

As demonstrated in these figures, the display device 350 has two dams (first dam 250-1 and second dam 250-2), and no dam 250 having the stopper 250c is formed between the second dam 250-2 and the edge portion of the substrate 102. The supplementary dam 254 is disposed in the lower peripheral region. The first inorganic film 232 and the second inorganic film 236 of the passivation film 230 may be arranged so as to overlap all of the dams 250 having the stoppers 250c or may be arranged so as to cover the whole of one of the dams (first dam 250-1) and cover a part of the other dam (second dam 250-2 in this case). Although not illustrated, the first inorganic film 232 and the second inorganic film 236 may be provided so as to cover the supplementary dam 254. The buffer insulating film 244 covers the dams 250, by which the lead wiring 310 formed thereover is insulated from the stoppers 250c. The position and shape of the buffer insulating film 244 are controlled with the supplementary dam 254.

In the display device 350 having such a configuration, the number of dams 250 can be reduced. Thus, a display device having a peripheral region with a reduced area can be provided, which contributes to improvement in designability of a display device.

2. Manufacturing Method

A manufacturing method of the display device 350 is explained using FIG. 36A to FIG. 38. These figures correspond to FIG. 35.

Figure 36A:
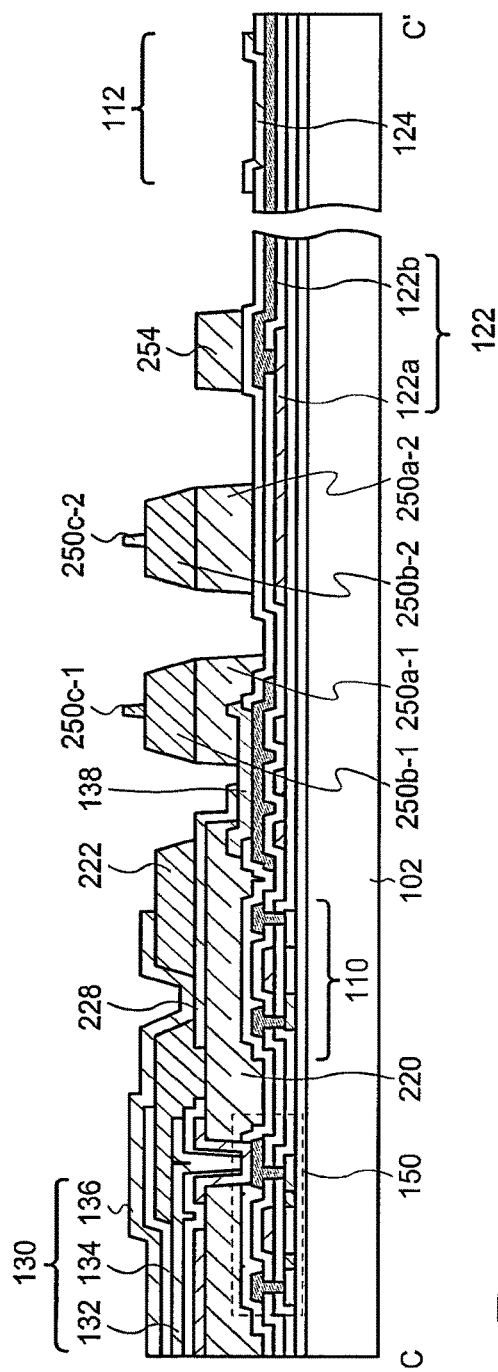
FIG. 36A and FIG. 36B are each a schematic cross-sectional view for explaining a manufacturing method of a display device according to an embodiment of the present invention.

The structures up to the display element 130 are fabricated similar to the display device 330 of the Second Embodiment. FIG. 36A is a schematic cross-sectional view demonstrating a state where the structures up to the display element 130 have been formed. Here, two dams 250 surrounding the display region 106 are formed, and the supplementary dam 254 is formed between the dams 250 and the terminal 112 in the lower peripheral region.

Figure 36B:
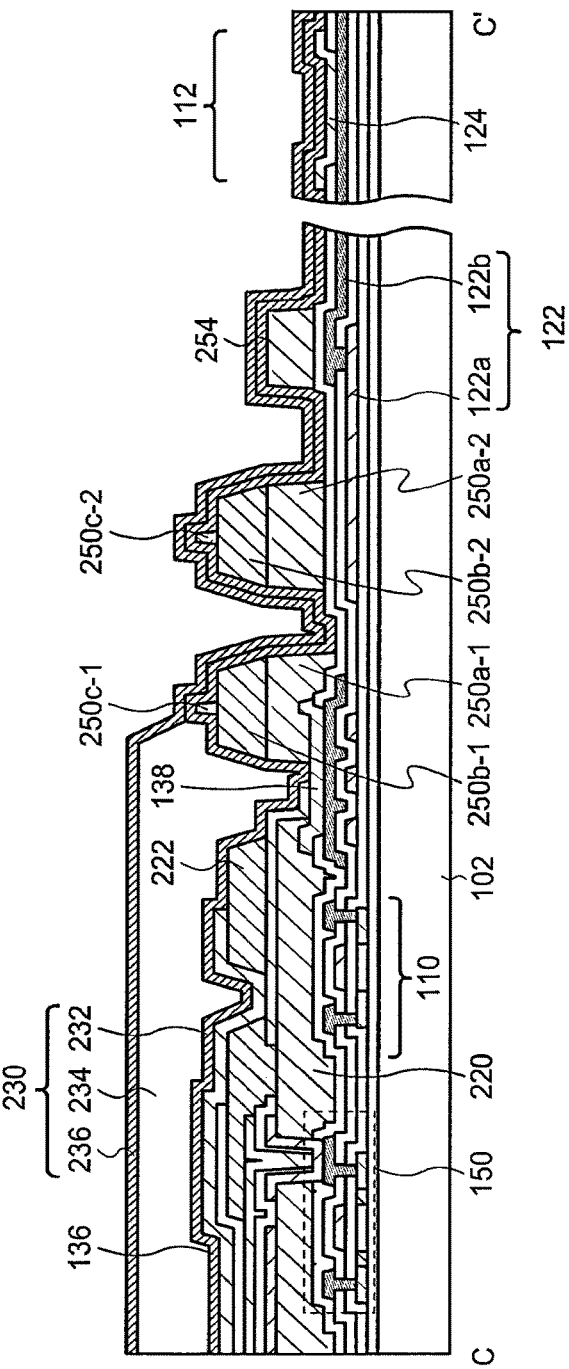

Next, the passivation film 230 is formed (FIG. 36B). The passivation film 230 may be formed by applying the same method as that described in the Second Embodiment. The position and shape of the organic film 234 are controlled with two dams 250 disposed in the peripheral region.

After that, the resist mask 242 is prepared. In the example shown here, the resist mask 242 is prepared so as to cover the dams 250 but not to cover the supplementary dam 254 (FIG. 37A). Although not illustrated, the resist mask 242 may be formed so as to cover a part of or the whole of the supplementary dam 254. As described in the Second Embodiment, the resist mask 242 may be formed by discharge or application of a photosensitive resin, light exposure through a photomask, and development. Since the position and shape of the resist mask 242 are controlled with the photomask, it is not necessary to additionally provide the dam 250 for controlling the resist mask 242 in the display device 350.

Figure 38:
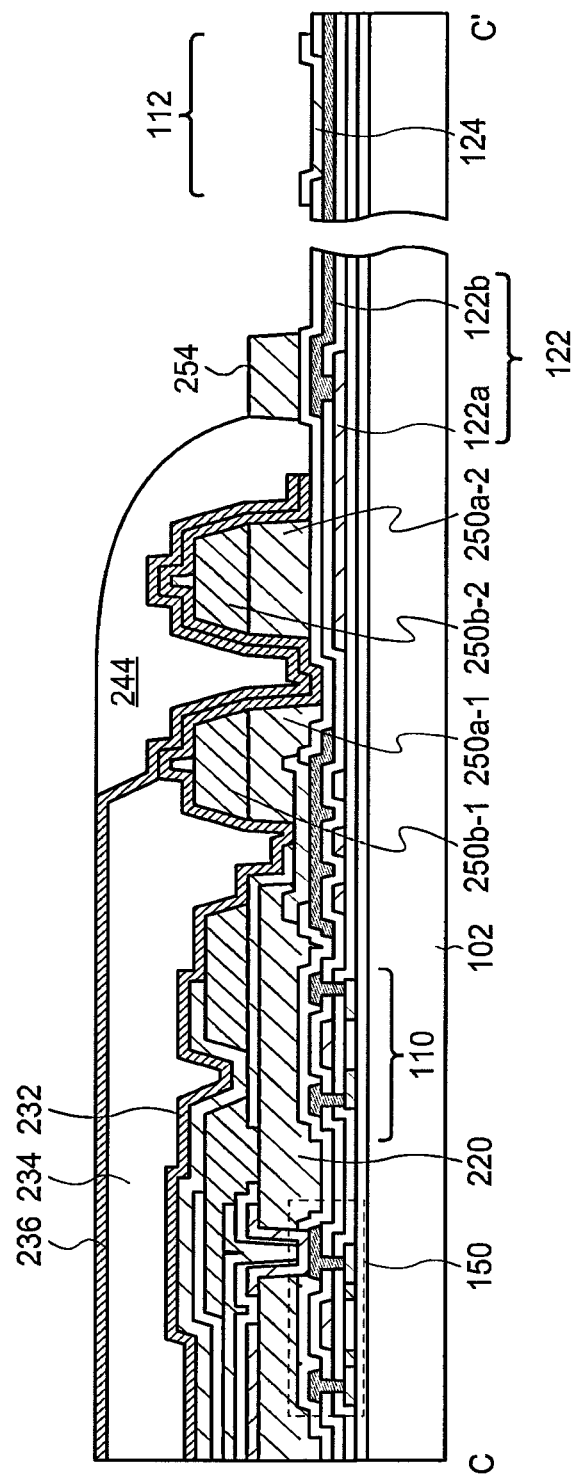
FIG. 38 is a schematic cross-sectional view for explaining a manufacturing method of a display device according to an embodiment of the present invention.

Next, the first inorganic film 232 and the second inorganic film 236 exposed from the resist mask 242 are removed. At the same time, the wiring 122 or the protecting conductive film 124 is exposed at the terminal 122 (FIG. 37B). After that, the resist mask 242 is removed with ashing or the like, and then the buffer insulating film 244 is formed as described in the Second Embodiment (FIG. 38). The buffer insulating film 244 is formed with an ink-jet method, a printing method or the like, and the position and shape thereof can be controlled with the supplementary dam 254 or the second dam 250-2. Since the following processes are the same as those of the Second Embodiment, their explanation is omitted.

As described above, the positions and shapes of the passivation film 230, the resin film 240, the resist mask 242, and the buffer insulating film 244 can be precisely controlled by providing at least one dam 250 having the stopper 250c so as to surround the display region 106, which enables production of a highly reliable display device in high reproducibility.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display devices having electrophoretic elements and the like. In addition, it is apparent that the size of the display device is not limited, and the embodiment can be applied to display devices having any size from medium to large.

It is understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
    a substrate including a display region and a peripheral region surrounding the display region;
    a transistor in the display region;
    a leveling film covering the transistor in the display region;
    a pixel electrode arranged on the leveling film and electrically connected to the transistor;
    a partition wall covering an edge portion of the pixel electrode;
    a counter electrode covering the pixel electrode and the partition wall;
    an EL layer arranged between the pixel electrode and the counter electrode; and
    at least one dam arranged in the peripheral region, wherein
    the dam surrounds the display region and is spaced away from the leveling film,
    the dam comprises a first layer in a same layer as the leveling film, a second layer in a same layer as the partition wall, and a stopper on and in contact with the second layer,
    the stopper contains an inorganic material, and
    a part of an upper surface of the second layer is exposed from the stopper.

2. The display device according to claim 1, wherein the inorganic material is selected from: a silicon-containing inorganic compound; or a 0-valent metal.

3. The display device according to claim 1, wherein an angle between a side surface of the stopper and an upper surface of the substrate is larger than an angle between a side surface of the second layer and the upper surface of the substrate.

4. The display device according to claim 1, further comprising:
    a passivation film above the counter electrode, wherein the passivation film comprises:
        a first inorganic film;
        an organic film above the first inorganic film; and
        a second inorganic film above the organic film; and
    the first inorganic film is in direct contact with the second inorganic film above the dam.

5. The display device according to claim 4, wherein
    the at least one dam includes a plurality of dams, and
    the first inorganic film and the second inorganic film overlap the plurality of dams.

* * * * *